United States Patent
Banerjee et al.

(10) Patent No.: US 11,292,962 B2
(45) Date of Patent: Apr. 5, 2022

(54) DOPED NANOPARTICLES AND METHODS OF MAKING AND USING SAME

(71) Applicant: The Research Foundation for The State University of New York, Amherst, NY (US)

(72) Inventors: Sarbajit Banerjee, Amherst, NY (US); Luisa Whittaker-Brooks, Lawrenceville, NJ (US); Christopher J. Patridge, Cheverly, MD (US); Peter Marley, Buffalo, NY (US)

(73) Assignee: The Research Foundation for The State University of New York, Amherst, NY (US)

( * ) Notice: Subject to any disclaimer, the term of this patent is extended or adjusted under 35 U.S.C. 154(b) by 335 days.

(21) Appl. No.: 13/632,674

(22) Filed: Oct. 1, 2012

(65) Prior Publication Data
US 2013/0101848 A1 Apr. 25, 2013

Related U.S. Application Data

(60) Provisional application No. 61/540,686, filed on Sep. 29, 2011.

(51) Int. Cl.
*C09K 9/00* (2006.01)
*C30B 25/00* (2006.01)
(Continued)

(52) U.S. Cl.
CPC .............. *C09K 9/00* (2013.01); *B82Y 30/00* (2013.01); *C01G 31/02* (2013.01); *C09K 11/691* (2013.01); *C30B 7/00* (2013.01); *C30B 25/00* (2013.01); *C30B 29/16* (2013.01); *C30B 29/60* (2013.01); *B82Y 40/00* (2013.01); *C01P 2002/54* (2013.01); *C01P 2002/72* (2013.01);
(Continued)

(58) Field of Classification Search
CPC .............. Y10S 977/773; Y10S 977/811; Y10S 977/896
See application file for complete search history.

(56) References Cited

U.S. PATENT DOCUMENTS 6,322,928 B1 11/2001 Thackeray et al.
8,076,662 B2 12/2011 Ramanathan et al.
(Continued)

FOREIGN PATENT DOCUMENTS

CN 1522964 A 8/2004
CN 1693211 A 11/2005
(Continued)

OTHER PUBLICATIONS

Bakhteeva et al., Gas-Sensing Properties of Nanostructured $M_xV_2O_5$(M=Na, K, Rb, Cs) Oxides, Inorganic Materials, vol. 46, No. 10, pp. 1112-1114 (Oct. 2010).
(Continued)

*Primary Examiner* — Ronak C Patel
(74) *Attorney, Agent, or Firm* — Hodgson Russ LLP

(57) ABSTRACT

Doped nanoparticles, methods of making such nanoparticles, and uses of such nanoparticles. The nanoparticles exhibit a metal-insulator phase transition at a temperature of −200° C. to 350° C. The nanoparticles have a broad range of sizes and various morphologies. The nanoparticles can be used in coatings and in device structures.

19 Claims, 29 Drawing Sheets

(51) Int. Cl.

| | | |
|---|---|---|
| *C09K 11/69* | (2006.01) | |
| *C30B 29/16* | (2006.01) | |
| *C30B 7/00* | (2006.01) | |
| *C30B 29/60* | (2006.01) | |
| *B82Y 30/00* | (2011.01) | |
| *C01G 31/02* | (2006.01) | |
| *B82Y 40/00* | (2011.01) | |

(52) U.S. Cl.
CPC ...... *C01P 2002/76* (2013.01); *C01P 2002/77* (2013.01); *C01P 2002/82* (2013.01); *C01P 2002/88* (2013.01); *C01P 2004/03* (2013.01); *C01P 2004/04* (2013.01); *C01P 2004/16* (2013.01); *C01P 2004/30* (2013.01); *C01P 2004/84* (2013.01); *C01P 2006/32* (2013.01); *C01P 2006/40* (2013.01); *Y10S 977/773* (2013.01); *Y10S 977/811* (2013.01); *Y10S 977/896* (2013.01); *Y10T 428/2982* (2015.01)

(56) References Cited

U.S. PATENT DOCUMENTS

| | | | | |
|---|---|---|---|---|
| 2005/0227864 | A1* | 10/2005 | Sutorik | B01J 21/04 502/304 |
| 2006/0131574 | A1* | 6/2006 | Yu et al. | 257/48 |
| 2007/0259182 | A1* | 11/2007 | Bujard et al. | 428/405 |
| 2007/0273951 | A1* | 11/2007 | Ribi | B42D 15/022 359/237 |
| 2009/0321660 | A1* | 12/2009 | Samuel et al. | 250/459.1 |
| 2010/0309539 | A1 | 12/2010 | Kaye et al. | |
| 2010/0314617 | A1 | 12/2010 | Ito | |
| 2011/0085964 | A1* | 4/2011 | Lukehart et al. | 423/594.17 |
| 2011/0146785 | A1* | 6/2011 | Buller et al. | 136/256 |
| 2011/0281176 | A1* | 11/2011 | Seymour | 429/321 |
| 2012/0040192 | A1 | 2/2012 | Lipson et al. | |
| 2012/0107549 | A1 | 5/2012 | Wang et al. | |
| 2013/0168228 | A1* | 7/2013 | Ozin et al. | 204/157.9 |

FOREIGN PATENT DOCUMENTS

| | | |
|---|---|---|
| CN | 102241482 A | 11/2011 |
| CN | 102249552 A | 11/2011 |
| DE | 102008040930 A | 2/2010 |
| GB | 2114965 A | 9/1983 |
| WO | 2011045223 A1 | 4/2011 |

OTHER PUBLICATIONS

Gan et al., Optical and Electrical Properties of Sputtered Vanadium Oxide Films, J. Vac. Sci. Technol. A, vol. 22, No. 3, pp. 879-882 (May/Jun. 2004).

Whittaker et al., Distinctive finite size effects on the phase diagram and metal-insulator transitions of tungsten-doped vanadium(IV) oxide, J. Mater. Chem., 2011, 21, 5580-5592.

Patridge et al., Colossal above-room-temperature metal-insulator switching of a Wadsley-type tunnel bronze, Chem. Commun., 2011,47, 4484-4486.

Patridge et al., Synthesis, spectroscopic characterization, and observation of massive metal-insulator transitions in nanowires of a nonstoichiometric vanadium oxide bronze, Nano Lett.;10(7):2448-53.

Whittaker et al., Microscopic and Nanoscale Perspective of the Metal-Insulator Phase Transitions of VO2: Some New Twists to an Old Tale, J. Phys. Chem. Lett. 2011, vol. 2, 745-758.

Whittaker et al., A VO-seeded approach for the growth of star-shaped VO2 and V2O5 Nanocrystals: Facile Synthesis, Structural Characterization, and Elucidation of Electronic Structure, CrystEngComm, 2011, vol. 13, pp. 5328-5336.

Wu et al., Temperature and voltage driven tunable metal-insulator transition in individual $W_xV_{1-x}O_2$ nanowires, Phys. Rev. B 83, 073101 (2011).

* cited by examiner

DOPED NANOPARTICLES AND METHODS OF MAKING AND USING SAME

CROSS-REFERENCE TO RELATED APPLICATIONS

This application claims priority to U.S. provisional patent application No. 61/540,686, filed Sep. 29, 2011, the disclosure of which is incorporated herein by reference.

STATEMENT REGARDING FEDERALLY SPONSORED RESEARCH

This invention was made with government support under contract no. DMR 0847169 awarded by the National Science Foundation. The government has certain rights in the invention.

FIELD OF THE INVENTION

The present invention generally relates to doped nanoparticles. In particular, the invention relates to doped nanoparticles having a desirable metal-insulator phase transition temperature.

BACKGROUND OF THE INVENTION

Few parallels exist in all of solid-state chemistry and condensed matter physics for solid-solid phase transitions that are comparable in magnitude and importance to the metal→insulator transition in $VO_2$. Almost half a century after the discovery of thermally induced discontinuous alterations of the electrical resistivity, optical transmittance, specific heat capacity, and magnetic susceptibility of $VO_2$ that can impressively range up to several orders of magnitude, this system continues to hold many surprises, such as recently discovered by the application of novel ultrafast spectroscopy and imaging tools and the preparation of high-quality thin film and nanowire samples. As with most materials exhibiting strong electron-electron correlations, the lattice, orbital, and electronic degrees of freedom in $VO_2$ are closely linked and the corresponding energetic barriers are sufficiently similar to render this system extremely sensitive to external stimuli.

The abrupt, discontinuous metal-insulator transition of the binary vanadium oxide $VO_2$ occurs at ~67° C. in the bulk and remains of enduring interest in solid-state chemistry even though comprehensive mechanistic elucidation remains vexingly elusive. The electronic structure of $VO_2$ is coupled to the lattice degrees of freedom, and thus this material can be used as a model system to glean information about solid-solid phase transformations in general, such as those that underlie unusual transport and spin phenomena manifested in compositionally more complex strongly correlated electronic materials. The ongoing debate regarding the merits of models that invoke electron correlations and phonon-driven mechanisms or suggest a concerted mixture of both (considering alternatively the insulating phase either as a charge-ordered Mott insulator or as a Mott-assisted Peierls-distorted phase) has proceeded in parallel with successful explorations of tuning the critical phase transition temperature and hysteresis through doping, finite size, and inhomogeneous strain. Perhaps the most compelling argument for tuning the phase transition temperature arises from purely practical considerations. Use of $VO_2$ in thermochromic coatings such as required for putative "smart windows" and advanced solar panels that switch between being infrared transmitting and infrared reflective as a function of the external temperature requires the critical temperature to be considerably decreased from the bulk 67° C. value to slightly above ambient temperatures. Several other proposed applications of $VO_2$ including in advanced bolometric devices, in temperature-sensitive elements, as modulators and polarizers for submillimeter-wavelength radiation, and the Mott field-effect transistor are predicated on establishing precise control over the threshold voltage or temperature for metal-insulator switching.

BRIEF SUMMARY OF THE INVENTION

The present invention provides vanadium oxide (e.g., $VO_2$ and $V_2O_5$) nanoparticles doped with metal cations. The present invention also provides methods of making and uses of such nanoparticles.

In an aspect, the present invention provides a plurality of vanadium oxide nanoparticles doped (i.e., substitutionally doped or intercalatively doped) with a plurality of metal cations and, optionally, heteroatom anions. The nanoparticles have crystalline structure. The nanoparticles can have a single domain or multiple electronic domains. The nanoparticles can be single crystalline nanoparticles. In an embodiment, the vanadium oxide nanoparticles are $VO_2$ nanoparticles. In another embodiment, the vanadium oxide nanoparticles are $V_2O_5$ nanoparticles. The nanoparticles of the present invention can be present in a variety of polymorphs. The nanoparticles can be present in a variety of structures. The nanoparticles exhibit a metal-insulator transition at a temperature of −200° C. to 350° C.

In aspect, the invention provides a method for making the doped vanadium oxide nanoparticles. The methods are based on hydrothermal reactions of a vanadium oxide precursor, a dopant source, a reducing agent, and, optionally, a structure-directing agent (e.g., a surfactant).

In an aspect, the invention provides a composition comprising the doped vanadium oxide nanoparticles. The composition can be present in a variety of forms. For example, the nanoparticles can be present as discrete nanoparticles or a bulk material (e.g., pellets).

In an aspect, the invention provides a coating comprising the doped vanadium oxide nanoparticles. The coating can be formed from only nanoparticles or a composition comprising nanoparticles. The coating can be a continuous film comprising the nanoparticles. The coating exhibits thermochromic behavior, electrochromic behavior, or mechanochromic behavior based on the metal-insulator transition of the nanoparticles. The coating can be used in a variety of applications (e.g., in window applications). For example, the coating can be disposed on the inner surface of the outer pane of a dual pane window.

In an aspect, the present invention provides devices comprising the doped vanadium oxide nanoparticles. Examples of such devices include field-effect transistors, thermoresponsive and photoresponsive switching components, infrared waveguides, infrared modulators, bolometers, and components for electromagnetic cloaking.

BRIEF DESCRIPTION OF THE FIGURES

FIG. 22 shows the morphologies of $W_xV_{1-x}O_2$ nanostructures prepared by the hydrothermal reduction of $V_2O_5$ using methanol, oxalic acid, citric acid, and ascorbic acid for 72 hours. The first three yield monodisperse well-defined 1D nanostructures, whereas reduction with ascorbic acid yields poorly structured nanoparticulates.

FIG. 23 shows the influence of the reaction temperature on the morphologies of the nanostructure for the oxalic acid reduction of $V_2O_5$ for 72 hours. It is clearly evident that the products formed after reaction at 180° C. and 210° C. are polydisperse nanoparticulates and short nanobelts, consistent with the predominance of the metastable $VO_2(B)$ phase under these conditions.

FIG. 24 shows the influence of the reaction time for the oxalic acid reduction of $V_2O_5$ in the presence of 20 mg of $H_2WO_4$. Again, consistent with the XRD patterns in other figures, well-defined 1D nanostructures are observed only after 48 hours of reaction as the structures recrystallize into the rutile/monoclinic polymorphs, whereas remnant metastable $VO_2(B)$ synthesized at lower temperatures adopts morphologies with relatively poorly defined geometries.

DETAILED DESCRIPTION OF THE INVENTION

Figure 1:
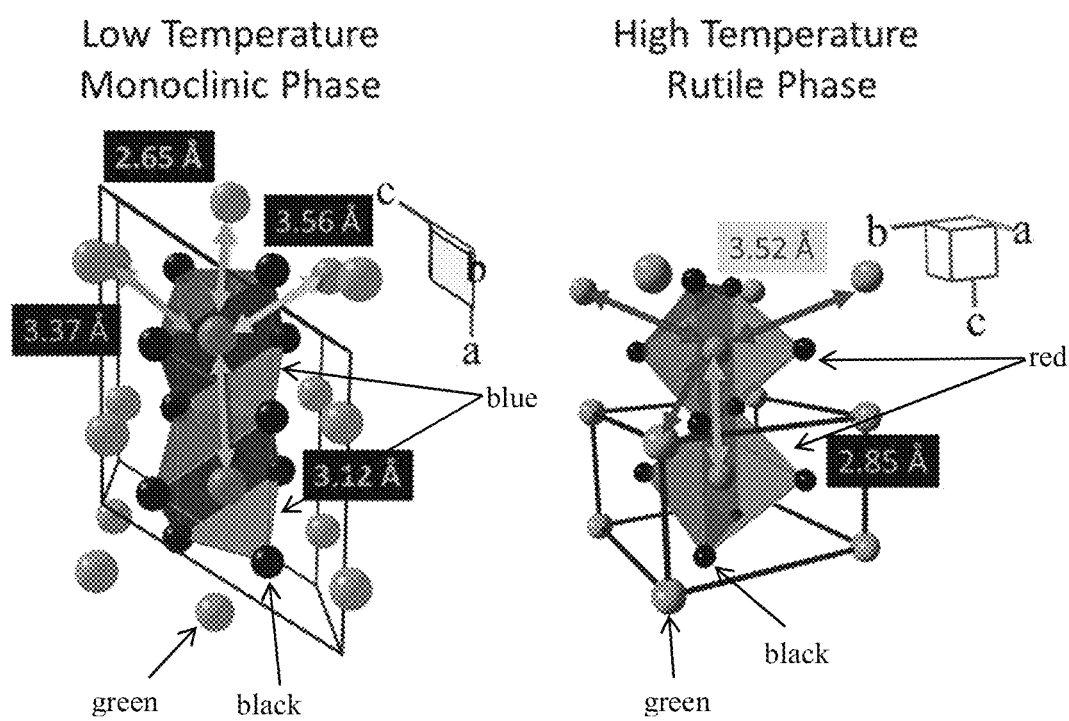
FIG. 1. Crystal structures of the low-temperature monoclinic M1 (polyhedra in blue) and the high-temperature rutile (polyhedra in red) polymorphs of $VO_2$. Vanadium and oxygen atomic positions are depicted in green (1) and black (no number), respectively. Several vanadium bond distances are displayed for both structures, exemplifying the reduced symmetry of the low-temperature phase in comparison to the rutile structure. The canting and pairing of adjacent cations along the crystallographic c axis of the monoclinic phase leads to the differing vanadium bond distances in the unit cell. The substitutional doping of $VO_2$ with Mo, W, or other dopant species can create local defect sites of the higher symmetry rutile phase in an otherwise monoclinic crystalline lattice.

The present invention provides vanadium oxide nanoparticles (e.g., $VO_2$ and $V_2O_5$) doped with metal cations and, optionally, heteroatom anions. The present invention also provides methods of making and uses of such nanoparticles.

The nanoparticles having a dopant maintain the fundamental crystal structure of the undoped oxide. For example, in the case of $VO_2$ doped nanoparticles, the nanoparticles have a crystal structure corresponding to undoped $VO_2$ nanoparticles. The doped $VO_2$ nanoparticles can exhibit lower or higher metal→insulator or insulator→metal phase transition temperature relative to the undoped vanadium oxide nanoparticles or relative to bulk or thin film forms of the vanadium oxide. The doped $V_2O_5$ nanoparticles can adopt crystal structures such as the α, β, β', δ phases that are different from that of $V_2O_5$. The doped $V_2O_5$ nanoparticles can exhibit metal→insulator or insulator→metal phase transition temperature exceeding the magnitude of that observed in bulk doped $V_2O_5$ materials or phase transitions that are not observed in bulk doped $V_2O_5$ materials.

As used herein, "regularly distributed" means the nanoparticles have a doping profile (the spatial arrangement of the dopant ions in the nanoparticle) characterized by failure of the dopants to segregate into distinct phases (e.g., collect at the surface of the nanoparticle) and the dopants are substitutionally incorporated within a $VO_2$ structure such that they replace vanadium atoms or oxygen atoms in the $VO_2$ structure or, in the case of $V_2O_5$, the nanoparticles have a doping profile characterized by intercalative incorporation of the dopants in a $V_2O_5$ structure (e.g., the dopants are situated between $V_2O_5$ layers or in interstices surrounded by a $V_2O_5$ framework).

In an embodiment, the doped $VO_2$ nanoparticles do not have dopant in a distinct or segregated phase. In an embodiment, the doped $VO_2$ nanoparticles do not have dopant in non-structural positions in the $VO_2$ structure. In an embodiment, the doped $V_2O_5$ nanoparticles do not have dopant atoms in a distinct or segregated phase. In an embodiment, the doped $VO_2$ nanoparticles do not have dopant atoms in concentrations greater than 1 atm. % in non-interstitial positions in the $V_2O_5$.

In an aspect, the present invention provides a vanadium oxide nanoparticle (or a plurality of vanadium oxide nanoparticles) doped with a plurality of metal cations and, optionally, heteroatom anions. The description of the nanoparticles herein is also applicable to a plurality of nanoparticles. The nanoparticle has crystalline structure. The nanoparticle can have a single domain or multiple electronic domains. The nanoparticle can be a single crystalline nanoparticle. In an embodiment, the vanadium oxide nanoparticle is a $VO_2$ nanoparticle. In another embodiment, the vanadium oxide nanoparticles is a $V_2O_5$ nanoparticle. In an embodiment, the vanadium oxide nanoparticles comprise vanadium oxide and plurality of metal cations. In another embodiment, the vanadium oxide nanoparticles consist essentially of vanadium oxide and plurality of metal cations. In yet another embodiment, the vanadium oxide nanoparticles consist of vanadium oxide and plurality of metal cations.

The nanoparticle is doped (i.e., substitutionally doped or intercalatively doped) with metal cations selected from the group consisting of K cations, Na cations, Cs cations, Sr cations, Ba cations, Ca cations, W cations, Mo cations, Ag cations, Pb cations Nb cations, Cr cations, Al cations, Fe cations, Ti cations, Zr cations, Ta cations, Sc cations, Ga cations, Cu cations, Co cations, Ni cations, and rare-earth element cations (e.g., lanthanides, such as lanthanum, cerium, europium, gadolinium, ytterbium, scandium and yttrium). Combinations of cation dopants can be used. The cations can be any known oxidation state of the metal. For example, the cation can be $W^{6+}$, $Mo^{5+}$, $Nb^{5+}$, $Cr^{3+}$ or $Ti^{3+}$. The dopant cations are present in the nanoparticle as substitutional dopants at 0.01% to 10% by weight, including all values to the 0.01% by weight and ranges therebetween. The dopant cations are present in the nanoparticle as intercalative dopants at 0.01% to 67% by weight, including all values to the 0.01% by weight and ranges therebetween. The dopant cations are regularly distributed in the nanoparticle.

Optionally, the nanoparticle is anion doped. The anions are heteroatom anions. For example, the nanoparticle is doped with hydride ($H^-$), halides (e.g., $F^-$, $Cl^-$, $Br^-$, and $I^-$), and sulfide ($S^{2-}$). Combinations of anion dopants can be used. The anion dopants can be present in the nanoparticle at 0.001% to 5% by weight, including all values to the 0.001% by weight and ranges therebetween. In an embodiment, anion dopants are present at 0.01% to 1% by weight. The dopant anions are regularly distributed in the nanoparticle.

The dopant can be present in the nanoparticle as a substitutional dopant. In this case, the dopant replaces a vanadium atom and/or oxygen atom in the nanoparticle structure. In an embodiment, the dopants (e.g., cation dopants or anion dopants) are substitutional dopants in $VO_2$ nanoparticles.

The dopant can also be present as an intercalated dopant. In this case, the dopant is present in the interstitial space in the nanoparticle structure. In an embodiment, the dopants (e.g., cation dopants or anion dopants) are intercalated dopants in $V_2O_5$ nanoparticles. In an embodiment, the structure of nanoparticle is tunnels or layers of $V_2O_5$ with intercalated metal cation dopant.

Without intending to be bound by any particular theory, it is considered that the doped vanadium oxide nanoparticles exhibit a lower metal→insulator phase transition temperature relative to undoped vanadium oxide nanoparticles. For example, W-doping within nanowires induces a 80° C./atom % W depression in the metal→insulator phase transition temperature within a linear regime ranging up to 0.90 atom % doping; a shallower slope is observed for W incorporation beyond 0.90 atom %. In the case of Mo doping, an unprecedented depression in the insulator→metal and metal→insulator transition temperatures of ~20° C./atom % Mo and 29° C./atom % Mo, respectively, in $V_{1-x}Mo_xO_2$ nanowires was observed.

In an embodiment, the nanoparticle is a $VO_2$ nanoparticle substitutionally doped with K cations, Na cations, Cs cations, Sr cations, Ba cations, Ca cations, W cations, Mo cations, Ag cations, Pb cations Nb cations, Cr cations, Al cations, Fe cations, Ti cations, Zr cations, Ta cations, Sc cations, Ga cations, Cu cations, Co cations, Ni cations, and rare-earth element cations (e.g., lanthanides, such as lanthanum, cerium, europium, gadolinium, ytterbium, scandium and yttrium), or a combination thereof. The dopant is present in the nanoparticle at 0.01% to 10% by weight, including all values to 0.01% and ranges therebetween. The nanoparticle has a doping profile characterized by failure of the dopants to segregate into distinct phases and the dopants are substitutionally incorporated within a $VO_2$ structure such that they replace vanadium atoms or oxygen atoms in the $VO_2$ structure.

In an embodiment, the nanoparticle is a $V_2O_5$ nanoparticle intercalatively doped with K cations, Cu cations, Pb cations, Ag cations, Cu cations, Pb cations, or a combination thereof.

The nanoparticle can be present in a variety of polymorphs. For example, the nanoparticle morphology can be described as nanowires, nanostars, nanosheets, nanobelts, nanotetrapods, nanorods, nanospheres, nanoobelisks nanodendrites, and aligned nanowire arrays. In an embodiment, the $VO_2$ or $V_2O_5$ nanoparticles exhibit a morphology selected from nanowires, nanostars, nanosheets, nanobelts, nanotetrapods, nanorods, nanospheres, nanoobelisks nanodendrites, and aligned nanowire arrays and a combination thereof. In an embodiment, the $VO_2$ or $V_2O_5$ nanoparticles exhibit a star-shaped morphology having from 3 to 10 arms.

The nanoparticle can be present in a variety of structures. For example, the structure of a nanoparticles is tunnels or layers of $V_2O_5$ with intercalated metal cations. In an embodiment, the $M_xV_2O_5$ phase is $\delta$, $\beta$, $\beta'$, or $\alpha$ phase. The nanoparticle can have a variety of symmetries. For example, for $VO_2$ nanoparticles, a nanoparticle has monoclinic (e.g., M1, M2, or M3), triclinic, or rutile symmetry. In an embodiment, the $VO_2$ nanoparticle has M1 symmetry. In an embodiment, a Mo-doped, W-doped, Ti-doped, or Nb-doped $VO_2$ nanoparticle has M1 symmetry.

The nanoparticle can have various sizes. For example, a nanoparticle has a size of 1 nanometer to 1 micron, including all integer nanometer values and ranges therebetween. Size is the longest dimension of the nanoparticle (e.g., the diameter of a spherical nanoparticle). The size of the nanoparticles can be measured by, for example, scanning electron microscopy, dynamic light scattering, or transmission electron microscopy. The size distribution of a population of nanoparticles (e.g., a plurality of nanoparticles) can fall within a specific size range. In an embodiment, greater than 95% of the nanoparticles in a population of nanoparticles have a size within 25% of the average nanoparticle size of the nanoparticle population. In various embodiments, greater than 95% of the nanoparticles in a population of nanoparticles have a size within 20% of the average size, 15% of the average size, 10% of the average size, or 5% of the average nanoparticle size of the nanoparticle population.

The nanoparticles can be present in a variety of physical forms. For example, the nanoparticles can be present as a free-standing powder or as a bulk material comprising the nanoparticles. For example, the nanoparticles can be present as a dispersion of nanowires embedded within a polymeric matrix, a dispersion of nanowires within a solution, a sintered compact, a spray-coated thin film, a spin-coated or dip-coated thin film, or an aligned array assembled through standard Langmuir-Blodgett techniques.

The metal→insulator transition in $VO_2$ is accompanied by the structural transformation of the crystalline lattice from a high-symmetry tetragonal rutile phase with uniform V—V bond distances of 2.85 Å to a lower symmetry monoclinic phase with dimerized "molecular" $[VO_6]$-$[VO_6]$ pairs exhibiting alternating V—V bond lengths of 2.65 and 3.12 Å. Without intending to be bound by any particular theory, the origin of the pronounced metal→insulator phase transition has been attributed variously to a Peierls instability driven by strong electron-phonon coupling as well as to Coulombic repulsion and electron localization due to strong electron-electron correlations that are described by a Mott-Hubbard picture.

The nanoparticles exhibit a metal-insulator transition at a temperature of from −200° C. to 350° C., including all integer ° C. values and ranges therebetween. In an embodiment, the nanoparticles exhibit a metal-insulator transition at a temperature of −50° C. to 150° C. In another embodiment, the nanoparticles exhibit a metal-insulator transition at a temperature of −25° C. to 75° C. In an embodiment, the nanoparticles are W-doped $VO_2$ nanoparticles (the W dopant present at 0.1% to 1.25% by weight) and exhibit a metal-insulator transition at a temperature of −20° C. to 70° C. In an embodiment, the nanoparticles are Mo-doped $VO_2$ nanoparticles (the Mo dopant present at 0.1% to 2.5% by weight) and exhibit a metal-insulator transition at a temperature of −10° C. to 70° C. In an embodiment, the nanoparticles are cation doped $VO_2$ nanoparticles that are F-doped (the F dopant present at 0.1% to 4% by weight) and exhibit a metal-insulator transition at a temperature of −5° C. to 70° C.

In another embodiment, the invention provides a plurality of $M_xV_2O_5$ nanoparticles doped with a plurality of metal cations. The metal cations are selected from the group consisting of Ag cations, Pb cations, Cu cations, Na cations, Cs cations, K cations, Sr cations, Ba cations, Ca cations, Ti cations, and combinations thereof. The value of x is 0.001 to 2.0, including all values to 0.001 and ranges therebetween. The dopant is present in the nanoparticles at 0.01% to 67% by weight, including all values to 0.01% by weight and ranges therebetween, and is regularly distributed in the nanoparticle.

In an embodiment, the nanoparticles are $\beta'$-$Cu_xV_2O_5$ with x=0.60 to 0.66 and exhibit a metal-insulator transition at a temperature from −75° C. to 200° C. In another embodiment, the nanoparticles are $\beta$-$Pb_xV_2O_5$ with x=0.28 to 0.33 and exhibit a metal-insulator transition upon application of a voltage.

The $VO_2$ nanoparticles exhibit a low number of defects (e.g., vanadium defects and/or oxygen defects). In an embodiment, the metal (vanadium/oxygen) stoichiometry deviates 5% or less from theoretical stoichiometry. In various embodiments, the metal (vanadium/oxygen) stoichiometry deviates 4%, 3%, 2%, or 1% or less from theoretical stoichiometry. For $V_2O_5$ with intercalated metal ions occupying interstitial sites, the vanadium:metal ratio is within 5% of the maximum occupancy of the metal cations in the specific structure to observe the phase transition. For instance, for $\beta$-$Cu_xV_2O_5$, x has to be within 5% of 0.67; for $\delta$-$K_xV_2O_5$, K has to be within 5% of 0.50.

The nanoparticles can be core-shell nanoparticles. The core is a nanoparticle as described herein. The shell comprises a metal oxide. In an embodiment, the nanoparticles are at least partially coated by a shell comprising a metal oxide such $TiO_2$, ZnO, $CeO_2$, $HfO_2$, $ZrO_2$, $Fe_2O_3$, $Fe_3O_4$, or a combination thereof. In another embodiment, the shell completely coats the nanoparticles. The thickness of the shell can be 0.5 nanometer to 250 nanometers, including all values to 0.5 nanometers and ranges therebetween. The metal oxide can be sol-gel materials. The metal oxides can be deposited using methods known in the art (e.g., sol-gel methods).

In aspect, the invention provides a method for making doped vanadium oxide nanoparticles. The methods are based on hydrothermal reactions of vanadium oxide precursors, a dopant source, a reducing agent, and, optionally, a structure-directing agent (e.g., a surfactant). One or more of each of the reactants can be used. In an embodiment, the method comprises the hydrothermal reaction of a reaction mixture comprising a vanadium oxide precursor, a dopant source, a reducing agent, optionally, a structure-directing agent (e.g., a surfactant), and a solvent.

In an embodiment, the method for making the doped $VO_2$ nanoparticles or doped $V_2O_5$ nanoparticles comprises the steps of: a) contacting a vanadium oxide source, a dopant source (cation dopant source and/or anion dopant source), a reducing agent, optionally, a structure-directing agent, in a solvent to form a reaction mixture; b) heating the reaction mixture to a temperature of 25° C. to 300° C. under autogeneous pressure, for 0.5 hours to 336 hours; c) allowing the reaction mixture to cool to ambient temperature; and d) isolating the doped $VO_2$ or $V_2O_5$ nanoparticles.

The vanadium oxide source reacts to form the doped vanadium oxide nanoparticles. Examples of suitable vanadium oxide sources include $V_2O_5$, $V_2O_4$, $CuV_2O_6$, $NaVO_3$, vanadium foil, VO, and $V_2O_3$. The vanadium oxide source can be a combination of vanadium oxide sources. Suitable vanadium oxide sources are commercially available and can be produced using known methods.

The dopant source reacts to form the doped vanadium oxide nanoparticles. The cation dopant source comprises a metal. The cation dopant source can be, for example, a nitrate salt of the metal, acetate salt of the metal, oxalate salt of the metal, oxide of metals, or combinations thereof. Examples of suitable cation dopant sources include tungstic acid, chromic acid, molybdic acid, lead acetate, tungsten oxide, molybdenum oxide, niobium oxide, chromium oxide, aluminum oxide, iron oxide, titanium oxide, zirconium oxide, tantalum oxide, scandium oxide, and gallium oxide. The dopant source can be a combination of dopant sources (e.g., a combination of cation dopant sources and anion dopant sources, a combination of cation dopant sources, and a combination of anion sources. Suitable dopant sources are commercially available and can be produced using known methods.

The reducing agent can be any compound that can reduce the vanadium oxide source. Examples of suitable reducing agents include organic compounds such as, for example, oxalic acid, citric acid, ascorbic acid, methanol, ethanol, butanediol, acetone, 2-propanol, sodium borohydride, and hydrazine. The reducing agent can be a combination of reducing agents. Suitable reducing agents are commercially available and can be produced using known methods.

The reaction mixture can comprise a structure-directing agent. Without intending to be bound by any particular theory, it is considered that the structure-directing agent influences the final morphology of the product through formation of micelles or preferential adsorption onto specific crystallographic facets. The structure-directing agent can be present in the reaction mixture at concentrations ranging from 0.01-30% by weight, including all values to 0.01% and ranges therebetween. Examples of suitable structure-directing agents include surfactants such as sodium dodecyl sulfate, cetyltrimethylammonium bromide, non-ionic surfactants (e.g., ethylene oxide and propylene oxide block copolymer surfactants such as Pluronic® surfactants (e.g., Pluronic F127) and polyethyleneoxide surfactants such as Triton™ surfactants (e.g., Triton X-100). Certain compounds can be both a reducing agent and a structure-directing agent. For example, oxalic acid, citric acid, ascorbic acid, methanol, ethanol, butanediol, acetone, 2-propanol, sodium borohydride, and hydrazine are reducing agents than can also act as structure-directing agents. A seed compound can also be used as a structure directing agent. For example, a vanadium oxide compound having VO stoichiometry and octahedral symmetry can be added to the reaction mixture to provide nanoparticles having star-shaped morphology. Suitable structure-directing agents are commercially available and can be produced using known methods.

The methods are conducted in a solvent. The reactants (the vanadium oxide source, dopant source, a reducing agent, and, optionally, structure-directing agent) are combined (in any order) in a solvent to form a reaction mixture. The solvent can be an organic solvent, an aqueous medium, or a mixture thereof. The organic solvent can be a mixture of organic solvents. The organic solvent is, for example, toluene, anisole, ethylene glycol, or a combination thereof. The aqueous medium is, for example, water or an alcohol (methanol)/water solution.

The method can be carried out under a variety of conditions (e.g., times, temperatures, and reactant concentrations). Without intending to be bound by any particular theory, it is considered that by selecting a reaction time, reaction temperature, and dopant (e.g., dopant composition and/or concentration) a desired nanoparticle phase, nanoparticle stoichiometry (e.g., ratio of metal (vanadium/dopant metal) to oxygen, or ratio of metal to oxygen to dopant), or nanoparticle size (or size distribution) can be formed. In an embodiment, the method is carried out such that $V_6O_{13}$ or other substoichiometric oxides are not detectible in the isolated nanoparticle product at a level greater than 5% by weight. In various embodiments, the method is carried out such that $V_6O_{13}$ or other substoichiometric oxides are not detectible in the isolated nanoparticle product at a level greater than 4%, 3%, 2%, or 1% by weight. In an embodiment, oxalic acid concentrations from 0.14 mol/L to 0.56 mol/L and reaction times exceeding 16 hours are desirable for obtaining phase-pure $VO_2$ products with well-defined morphologies.

The reaction can be carried out, for example, for 0.5 hour to 336 hours, including all values to the 0.1 hour and ranges therebetween. The reaction can be carried out, for example, at a temperature of 25° C. to 300° C., including all integer ° C. values and ranges therebetween. The reaction is carried out under autogeneous pressure. The autogeneous pressure can be achieved by heating the reaction mixture in a sealed vessel. The pressure developed within the vessel can be controlled by selecting one or more of the temperature, the fill ratio or the volume of solvent within the container, and the boiling point of the solvent. The reaction can be carried out under an ambient atmosphere. The reaction can also be carried out in an inert atmosphere (e.g., a nitrogen or argon atmosphere). The precursors can be mixed by stirring in solution or ball-milling prior to the hydrothermal reaction.

The reaction mixture can be cooled to ambient temperature (e.g., room temperature) in a variety of manners. Room temperature can be, for example, 18° C. to 25° C. The reaction mixture can be allowed to cool to ambient temperature without active cooling. The reaction mixture can also be subjected to controlled cooling or quenched.

The steps of the method described in the various embodiments and examples disclosed herein are sufficient to produce doped vanadium nanoparticles of the present invention. Thus, in an embodiment, the method consists essentially of a combination of the steps of the methods disclosed herein. In another embodiment, the method consists of such steps.

In an aspect, the invention provides a composition comprising the doped vanadium oxide nanoparticles. In an embodiment, the composition can further comprise a solvent and/or a polymer as described herein. The composition can be present in a variety of forms. For example, the composition can comprise discrete nanoparticles or a bulk material (e.g., pellets comprising nanoparticles). The bulk material can be formed from a plurality of nanoparticles sintered to form a bulk material (e.g., a nanostructured ceramic material). The nanoparticles can be present at 1% to 100% by weight, including all integer % by weight values and ranges therebetween. The nanoparticle loading within matrices (polymer, ceramic) can vary from 0.1% to 99% by weight, including all values to 0.1% by weight and ranges therebetween.

The composition can comprise a polymer. The nanoparticles are disposed in a polymer. In an embodiment, the nanoparticles are dispersed in a polymer. Examples of suitable polymers include polymethylmethacrylate, polyetherimide, polyethylenimine, polystyrene, polyethyleneoxide, polypyrrole, polyaniline, and polycarbonate. Suitable polymers are commercially available or can be produced using known methods.

In an aspect, the invention provides a coating comprising the doped vanadium oxide nanoparticles. The coating can be formed from only nanoparticles or a composition comprising nanoparticles. The coating can be a continuous film comprising the nanoparticles. The nanoparticles can be present at 0.1 to 100% by weight, including all values to 0.1% by weight and ranges therebetween. In an embodiment, the coating is formed from nanoparticles having nanowire morphology.

The coating can have a wide range of thickness (e.g., a monolayer or nanoparticles, such a nanowire nanoparticles, to thick films having a thickness of 10 millimeters or greater). In an embodiment, the coating can be from 1 nm to 100 µm, including all integer nanometer values and ranges therebetween. The coating can be present on at least a portion or on an entire substrate such as, for example, a glass substrate (e.g., a window) or metal substrate (e.g., a metal roof).

The coating of the present invention exhibits thermochromic behavior, electrochromic behavior, or mechnochromic behavior based on the metal-insulator transition of the nanoparticles. The metal-insulator transition can be induced by heating the coating, application of voltage to the coating, flowing a current through the film, or by imposition of strain on the coating.

The coating can be used in a variety of applications (e.g., in window applications, metal roof applications such as corrugated metal building, and automotive applications). For example, the coating can be disposed on the inner surface of the outer pane of a dual pane window. In an embodiment, the present invention provides a window having at least one pane at least partially coated with nanoparticles of the present invention. In another embodiment, the window is a dual pane window having the inside surface of the outer pane at least partially coated with the nanoparticles. In the case of dual pane windows, the space between the two panes can be filled with an inert gas, such as argon or helium. In an embodiment, the inside surface of the outside pane is electrically connected to a voltage source, such as a household power supply or external power supply. The power supply provides electricity to enable electric switching of window properties by inducing a metal-insulator phase transition. In another example, the coating can be disposed on a metal roof. In an embodiment, the present invention provides a metal portion of a roof having at least partially coated with nanoparticles of the present invention. In an embodiment, the metal is electrically connected to a voltage source, such as a household power supply or external power supply. The power supply provides electricity to enable electric switching of window properties by inducing a metal-insulator phase transition. In another embodiment, the doped $VO_2$ or $M_xV_2O_5$ nanostructures can be components of a logic or memory device that is switched at a speed greater than 1 transition/minute.

The coating can be formed using a variety of methods. For example, the coating can be formed by spray-coating or wire-bar coating a dispersion of the nanoparticles in $H_2O$, N-methylpyrrolidone, 2-propanol, ethanol, 2-propanol, methyl ethyl ketone, acetone, or a combination thereof.

In an aspect, the present invention provides devices comprising the nanoparticles. In an embodiment, the device comprises single nanowire nanoparticles. Examples of devices include field-effect transistors, thermoresponsive and photoresponsive switching components, infrared waveguides, infrared modulators, and components for electromagnetic cloaking.

In an aspect, the present invention provides undoped $VO_2$ or $V_2O_5$ nanoparticles exhibiting a star-shaped morphology. The undoped nanoparticles are as described herein, with the exception that the nanoparticles do not having a dopant. In an embodiment, the $VO_2$ or $V_2O_5$ nanoparticles exhibit a star-shaped morphology having from 3 to 10 arms.

The following examples are presented to illustrate the present invention. They are not intended to limiting in any manner.

Example 1

This example provides local structure perturbations on the metal-insulator transitions of $V_{1-x}Mo_xO_2$ nanowires and provides mechanistic insights from an X-ray absorption spectroscopy study.

The substitutional doping of Mo within $VO_2$ substantially alters the electronic and structural phase diagrams of the host lattice, most notably by bringing the technologically relevant metal-insulator phase transition temperature in closer proximity to room temperature. In this example, X-ray absorption fine structure (XAFS) spectroscopy at V and Mo K-edges was used to examine the local electronic and geometric structure of both the dopant atoms and the host lattice. A nominal Mo oxidation state of +5 was determined, which implies electron doping of the $VO_2$ band structure. In addition, XAFS studies suggest that doping with Mo creates locally symmetric domains that are more akin to the high-temperature rutile phase of $VO_2$, thereby lowering activation energy barriers for structural transformation to the metallic phase. Substantial rectification of octahedral canting is also observed upon Mo doping, which has the effect of decreasing V 3d-O 2p hybridization and likely assists in closing the characteristic band gap of the low-temperature monoclinic phase. A correlated set of cationic interactions is seen to emerge with increasing Mo doping, which can be ascribed to local dimerization along the rutile c axis as has been proposed to be a characteristic structural feature of a correlated metallic phase with intermediate mass.

Structural aspects of the phase transition. From a structural perspective, the metal-insulator transition in undoped $VO_2$ occurs concomitantly with a symmetry-reducing crystalline phase transformation from a tetragonal rutile phase (space group $P4_2/mnm$), characterized by a single V—V distance of 2.85 Å and linear chains of edge-shared Jahn-Teller-distorted $VO_6$ octahedra, to a less symmetric monoclinic (M1) phase (space group $P2_1/c$) wherein dimerization of adjacent edge-shared $VO_6$ octahedra accompanied by tilting gives rise to a zigzag chain with alternating V—V distances of 2.65 and 3.12 Å. The local coordination environments and bond distances for vanadium atoms are depicted in FIG. 1. Homopolar bond formation in the insulating phase gives rise to localized Heitler-London states with electrons from both participating vanadium atoms of the dimer occupying a correlated and localized singlet state rather than being delocalized over the entire uncorrelated set of bonding molecular orbitals. The role of tungsten in depressing the metal-insulator transition temperature has been disparately attributed to the electronic effects of additional carrier density being injected within the band structure of $VO_2$ (facilitating the system reaching a threshold carrier density wherein bound states can no longer be stabilized), the differences in solution energies for dopant incorporation within the monoclinic and rutile phases altering the overall thermodynamics of the system, and establishment of an inhomogeneous strain gradient along the [110] and [−110] directions, which breaks the homopolar V—V bonds in the dimer (likely disrupting the Heitler-London states). Assessing the validity of such arguments has not been possible thus far for Mo doping given the limited local structure information available for this system.

Synthesis of Mo-Doped $VO_2·V_{1-x}Mo_xO_2$ (x=0.39, 0.43, 0.65, 0.85, 1.15, 1.45, 2.03, 2.50 atom %) nanowires were prepared by the hydrothermal oxalic acid reduction of $V_2O_5$ in the presence of molybdic acid within a Teflon-lined autoclave vessel. The reaction mixture was heated at 250° C. for 3 days and then cooled to room temperature. The reaction time primarily affects the dimensions of the nanostructures, whereas the precursor concentration determines the dopant concentration. The solid residue of $V_{1-x}Mo_xO_2$ nanowires was recovered by filtering, washed with copious amounts of water, and dried in air overnight.

Characterization. The elemental compositions of the samples were determined using laser ablation inductively coupled plasma mass spectrometry (LA-ICP-MS). A Hitachi SU-70 scanning electron microscope (any mention of commercial products is for information only and does not imply recommendation or endorsement from NIST) operating at an accelerating voltage of 20 kV was used to acquire SEM images. A JEOL 2010 instrument operated at 200 kV was used to acquire transmission electron microscopy (TEM) images and selected area electron diffraction (SAED) patterns. To prepare the samples for HRTEM/SAED analysis, the nanostructures were dispersed in 2-propanol and then deposited onto 300 mesh carbon-coated Cu grids. Since the metal-insulator transition of $VO_2$ is a first-order phase transition with associated latent heat, differential scanning calorimetry was performed using a Q200 TA Instrument between the temperature range of −50 to 150° C.

X-ray Absorption Measurements. Mo K-edge spectra were measured in fluorescence and transmission modes using two parallel plate ionization chambers arranged parallel and perpendicular to the beam direction at NIST beamline X23A2 of the National Synchrotron Light Source of Brookhaven National Laboratory for powder samples of the nanowires diluted within a BN matrix. V K-edge data were acquired in transmission mode on the same beamline for powder samples of nanowires diluted with BN. Data were separately acquired for binary oxide standards of Mo and V. All spectra were calibrated using Mo and V metal foils, which were simultaneously collected during all transmission mode experiments at the K-edge of each respective element. All spectra were collected at a temperature of 25° C. A Si(311) monochromator was used for an overall spectral resolution ($\Delta E/E$) of $2\times10^{-4}$.

XAS Data Analysis. All data were processed using Athena and AUTOBK algorithms. Each sample was calibrated along with pre-edge and postedge normalization using the most intense peak of the first derivative at each elemental foil edge as calibration for each spectrum; spectra for each sample were then aligned to the associated standard spectrum collected simultaneously for the metal foil standards. For EXAFS analysis, E0 was constrained across the set of samples at each edge, and the k-range was set from 2 to 10 $Å^{-1}$ using Hanning windows; theoretical fitting was performed using Artemis in the real space range between 0.9 and 3.0 Å. For the Mo K-edge data, six scattering paths were used for the fitting (four single-scattering, two multiple scattering) with unique Debye-Waller factors for each type of scatterer (V and O), two bond length shift parameters, $\Delta r1$ and $\Delta r2$, for all oxygen and vanadium scatterers, respectively, and energy shift parameter $E_0$; the passive reduction factor $S_0^2$ was restrained to a value close to 0.83. The value of 0.83 was extracted from theoretical fitting of $MoO_2$ and $MoO_3$ standards by constraining the coordination number in these compounds of known crystal structure to remove any correlation between the reduction factor and coordination number and applying chemical transferability. The small differences in local environment for the analyte samples will only minimally impact the passive reduction factor since this value depends primarily on the absorbing atom. EXAFS modeling for V K-edge data considered theoretical structures for rutile and monoclinic phases with the former constituted of two V—O paths (axial and equatorial) and two V—V distances, giving four scattering paths for fitting, whereas the latter was modeled using six distinct V—O bond distances and three V—V bond distances, giving nine scattering paths. Coordination was constrained, and similar fitting parameters were used for bond shifts and Debye-Waller factors with a unique parameter for oxygen and vanadium each, energy grid shift, and passive electron factor as described for the Mo data again giving six parameters for fitting each model. Using bulk monoclinic $VO_2$ vanadium standards of known crystal structure, the passive reduction factor was fitted to a slightly higher value of 0.89, which was constrained for theoretical modeling of the V K edge data. Values of the passive reduction factors used at both the Mo and V K-edges are within the commonly accepted range of 0.75-1.0.

Figure 2:
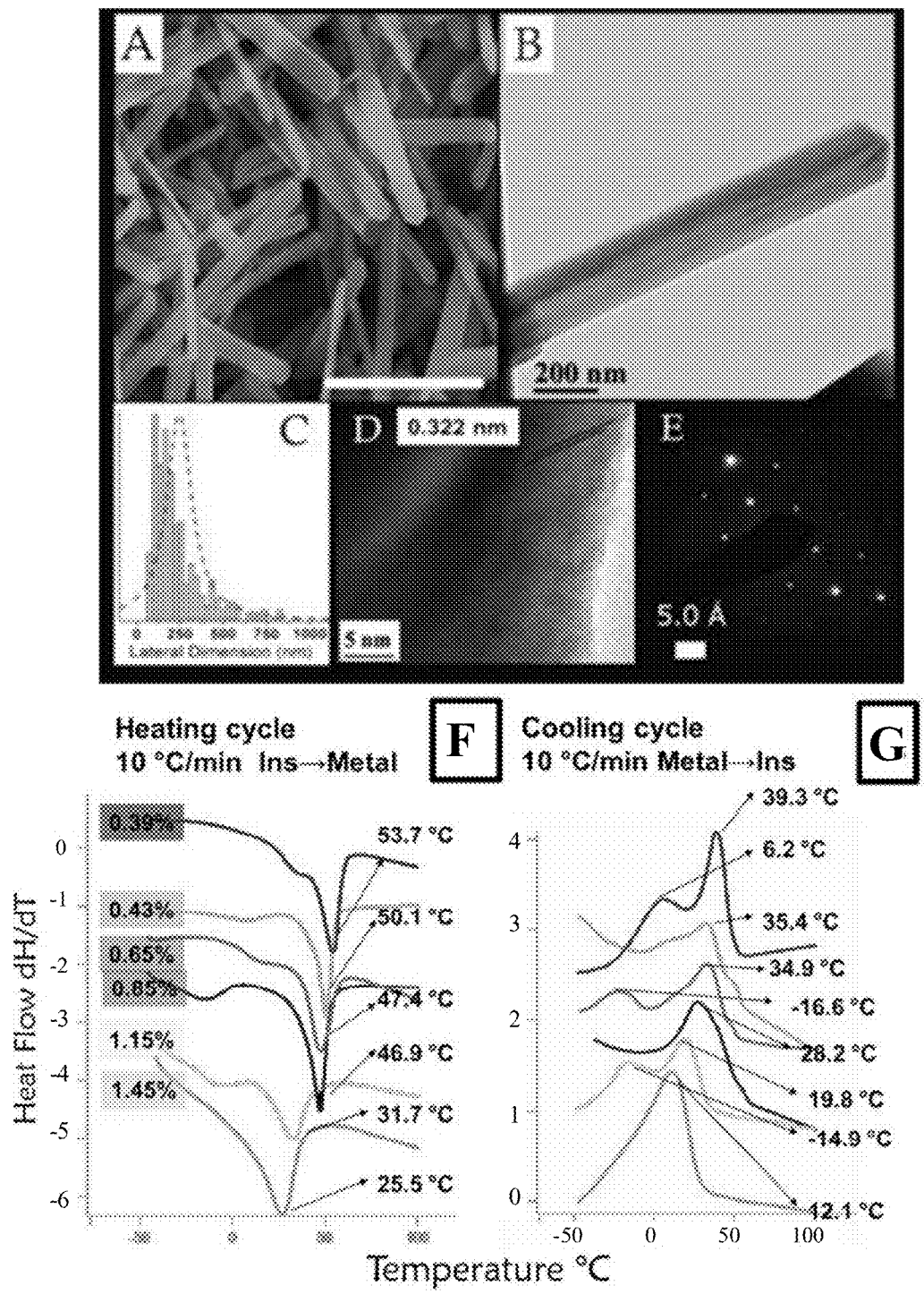
FIG. 2. (A) Scanning electron microscopy (SEM) image of several $V_{1-x}Mo_xO_2$ nanowires indicating the belt morphology and high yields obtained in the hydrothermal process (the scale bar represents 3 μm). (B) TEM image of a single nanowire with lateral dimensions of ~250 nm and a faceted tip geometry common to these materials. (C) Histogram of several hundred wires indicating a mean lateral dimension of ~250 nm. (D) Lattice-resolved HRTEM image acquired near the edge of a single nanowire (x~0.65 atom % Mo), which can be indexed to the separation between the (011) planes of monoclinic M1 $VO_2$. (E) Selected area electron diffraction (SAED) pattern confirms the single-crystalline nature of the nanowires and can be indexed to the monoclinic M1 phase. (F,G) Differential scanning calorimetry traces measured for the $V_{1-x}Mo_xO_2$ nanowires during the heating and cooling cycles. The corresponding atomic concentration of Mo in the nanowires is highlighted alongside the respective heating curve. Note the large hysteresis between the phase transition temperatures in the heating and cooling cycles.

Unlike substrate-adhered $VO_2$ nanobeams grown by vapor transport, solvothermally prepared $VO_2$ nanostructures can serve as model systems for examining finite size effects on the intrinsic phase diagram of the material without obscuration from substrate coupling. FIG. 2 illustrates $V_{1-x}Mo_xO_2$ nanowires prepared by the hydrothermal reduction of $V_2O_5$ in the presence of molybdic acid. The single-crystalline nanowires range in lateral width from 100 to 400 nm with a roughly Gaussian distribution centered at 250 nm as shown in FIG. 2C. The vertical heights tend to be significantly thinner, ranging from 10 to 100 nm, giving the prepared structures a "beltshape" morphology. FIGS. 2A and B demonstrate that several of the nanowires have a tapered pointed morphology at their apexes. The DSC traces for the specific set of nanowires examined here in FIGS. 2F and G, the incorporation of Mo substantially depresses the critical temperatures for both metal→insulator and insulator→metal phase transitions with the former transition being more strongly altered as a result of doping. The observed thermal profiles indicate doping-induced depressions in transition temperatures of approximately 34° C./atom % and 23° C./atom % Mo (calculated using the highest-intensity DSC peak in each instance) for the metal→insulator and insulator→metal transitions, respectively, which far surpass the 12° C./atom %-15° C./atom % Mo observed in the bulk, suggesting that scaling to finite size significantly modifies the phase diagram. The distinctive splitting noted in the DSC traces arises primarily from polydispersity in the size distribution. From Raman spectroscopy analysis, no evidence for a metastable M2 phase at any dopant concentration was found. Variable temperature Raman spectroscopy results also indicate complete transformation of the insulating phase to the metallic phase with the coexistence regime spanning only 1-3° C. Raman bands characteristic of the M1 phase are observed up to 1.15 atom % Mo doping. For samples with 1.45 atom % doping and beyond, the Raman signals disappear, indicating stabilization of the metallic rutile phase.

To uncover mechanistic details of alterations in phase transformation pathways induced by Mo doping, an extensive set of XANES and EXAFS measurements were performed at the Mo and V K-edges. X-ray absorption spectroscopy is a powerful element-specific tool to probe the local atomic structure surrounding elements of interest and can be applied even in the complete absence of crystallinity, which makes it well-suited for examination of the local structure of dopants incorporated at low concentrations as well as for studying nanomaterials with diffraction peaks characterized by Scherrer broadening. The underlying physical process for X-ray absorption spectroscopy involves a monochromatic X-ray beam impinging on the sample and ejecting core shell electrons, leaving behind a core-hole. Subsequently, the extant core-hole is annihilated through a variety of relaxation processes. The decay processes are closely associated with the localized corehole, and consequently the length scale for the entire absorption event is on the order of a nanometer or less, enabling this technique to serve as an excellent probe of local structure.

$MoO_2$ crystallizes in a monoclinic structure (space group $P2_1/c$) that is analogous to the monoclinic M1 phase of $VO_2$ depicted in FIG. 1 with metal-metal distances of 2.50 and 3.10 Å. This structure shows a significantly diminished pre-edge absorption, reflecting increased symmetry around the central metal atom due to reduced hybridization of valence 4d orbitals with Mo 5p and O 2p states. The symmetry around the central atom is of paramount importance for determining the extent to which p-d hybridization can occur (based on group theory considerations), thereby determining the transition probability for the pre-edge feature.

Comparing the data acquired for the $V_{1-x}Mo_xO_2$ samples to the spectra for the binary molybdenum oxide standards, barring the sample with 2.5 atom % Mo doping (which is likely contaminated with a remnant Mo(VI) precursor residue), all the samples exhibit strongly attenuated pre-edge absorption intensities at the Mo K-edge, suggesting an almost perfectly octahedral local coordination environment for the Mo dopant species that is distorted less even than the fairly symmetric rutile $MoO_2$ phase. A highly symmetric local Mo coordination environment is most notably inconsistent with retention of the tilted and dimerized octahedra, characteristic of the $VO_2$ monoclinic (M1) phase, and indeed more closely parallels the high symmetry of the high-temperature rutile phase of $VO_2$ with reduced anisotropy along the c axis. Oxidation of the photoabsorber shifts the absorption edge to higher energies according to Kunzl's law because of the increased binding energies of core electrons, which are subject to less shielding owing to the diminished density of remaining electrons. Notably, the absorption edges for all the studied $V_{1-x}Mo_xO_2$ samples fall between the traces for $MoO_2$ and $MoO_3$, suggesting an oxidation state intermediate between Mo(IV) and Mo(VI). It is worth noting that the peak shifts as a function of oxidation state are less pronounced at the Mo Kedge as compared to that of first row transition metals such as Ti and V since removal of an electron has a relatively diminished impact given the higher number of electrons and greater overall shielding.

Additional corroboration and details of the Mo oxidation state and increased local symmetry are derived by modeling the EXAFS region of the Mo K-edge spectra. The theoretical model used for fitting the experimental data has been formulated by using the rutile structure of $VO_2$ (FIG. 1) and by replacing a vanadium atom with the Mo photoabsorber, analogous to the approach used for modeling W substitutional dopants in $VO_2$. It was attempted to fit primarily the first two shells given the lack of information regarding how the structure relaxes away from the dopant sites. A minimum number of adjustable parameters have been used in the models. Significantly, reasonable fitting of the experimentally observed scattering paths (goodness-of-fit $R_{fit}$ factors are noted in Table 1) for all Mo concentrations is achieved only for the rutile structure of $VO_2$. Indeed, using the structural parameters of the low-temperature monoclinic (M1) phase or for a M2 phase stabilized by inhomogeneous strain and $Cr^{3+}/Al^{3+}$ doping in the model does not yield acceptable correlations to the experimental data. This is a particularly noteworthy finding that is consistent with the increased local symmetry of the Mo coordination environment (as compared to the undistorted host lattice) noted above in the XANES measurements and suggests that the incorporation of Mo is akin to nucleating tetragonal domains in the monoclinic (M1) phase. Best fits to radial distribution functions using exclusively the rutile phase have also been observed for W doping. It is noteworthy that the locally tetragonal high-symmetry structure around the Mo dopant atoms in this case is distinct from the average M1 structure deduced from Raman spectroscopy and powder X-ray diffraction. These findings illustrate the potential of EXAFS analysis to deduce the local geometric structure in the vicinity of dopant atoms, which as illustrated here can be very significantly different from the average crystal structure of the nanowire.

The bond lengths extracted from the fit and listed in Table 1 average 1.95±0.03 Å and 2.03±0.03 Å, respectively. A bond valence parameter calculation performed using these bond lengths suggests a formal Mo oxidation state of +4.99, which is entirely consistent with the XANES arguments noted above, suggesting an oxidation state intermediate between the two binary molybdenum oxide standards. Further consistent with these assignments, the bond lengths are longer than observed for first shell W—O bonds (1.89±0.01 Å and 1.94±0.01 Å) in $W_xV_{1-x}O_2$, which can be rationalized based on lower valence of the dopant atom: $Mo^{5+}$ in comparison to $W^{6+}$. The electronic structure implication of this dopant valence is that Mo donates one electron per dopant species to the $VO_2$ band structure, unlike two electrons ceded per $W^{6+}$ atom. This discrepancy between the two dopants may well be a prominent factor contributing to the less pronounced depression in transition temperature observed for molybdenum in comparison to tungsten doping.

The presence of oxygen vacancies can further influence the intensity of the pre-edge feature. The metal-insulator transition in $VO_2$ is very sensitive to the oxygen stoichiometry, and a substantial concentration of oxygen vacancies would cause a large diminution of the characteristic metal-insulator phase transition, which has not been observed for the different Mo doping concentrations examined here. Nevertheless, an increase in oxygen vacancy concentration as a function of doping may contribute to the decrease in the intensity of the pre-edge feature as a result of the reduced coordination numbers of some vanadium sites. No evidence was found for $V^{5+}$ species detected by Manning et al. in their CVD-grown $V_{1-x}Mo_xO_2$ thin films.

Figure 3:
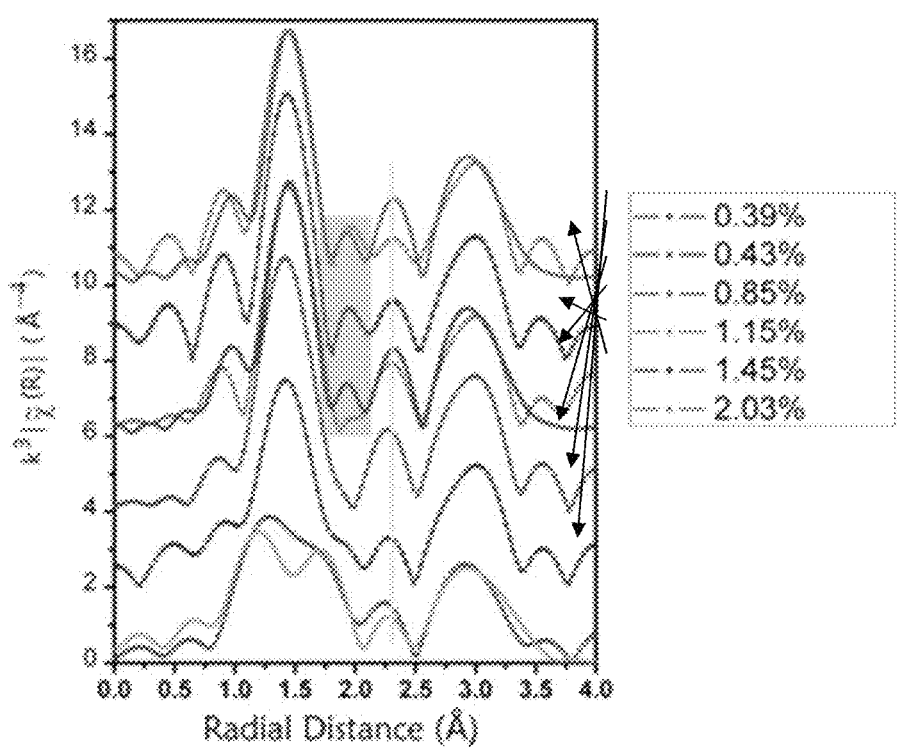
FIG. 3. V K-edge EXAFS spectra acquired for $V_{1-x}Mo_xO_2$ nanowire samples. The fits to the experimental data are modeled using the monoclinic M1 phase for the lowest doping concentration (0.39 atom %) and the rutile phase for all the other samples. The first strong feature, corresponding to nearest neighbor V—O scattering paths, dramatically changes from 0.39 atom % to higher concentrations into a narrow symmetric peak centered at 1.5 Å. The scattering paths near 2.25 Å shift to longer distances as highlighted by the vertical yellow line in the plot; additionally, a distinctive feature arises near 2 Å, as highlighted in the shaded region.

The EXAFS data at the V K-edge acquired at a temperature of 25° C. have also been modeled. FIG. 3 shows Fourier transforms of the k-space data along with the corresponding fitted models for $V_{1-x}Mo_xO_2$ samples with 0.39 atom %, 1.15 atom %, and 2.03 atom % Mo doping. The sample with 0.39 atom % Mo doping is different from the other two spectra. The first peak corresponds to scattering paths arising from V—O interactions that are in the immediate vicinity of the photoabsorber V atom and constitute the first shell. The envelope of paths for this regime is much broader for the 0.39 atom % Mo sample with a peak maximum at ~1.28 Å and a well-differentiated shoulder near 1.8 Å. In contrast, the samples with higher Mo doping exhibit a more symmetric and narrower distribution of scattering paths centered around 1.5 Å. In modeling the V K-edge data, the 0.39 atom % Mo-doped $VO_2$ sample is best fitted using the lower-symmetry monoclinic M1 polymorph depicted in FIG. 1 with V—O bonds ranging from 1.76 to 2.06 Å. Table 2 lists the six fitted V—O bond distances which agree closely with crystallographic distances in the monoclinic low-temperature structure of $VO_2$. With a small increase in Mo concentration (from 0.39 to 0.43 atom %), the monoclinic M1 structure no longer offers adequate correlation with the experimental data, and the first-shell model instead is better fitted using the higher symmetry tetragonal rutile polymorph. Most notably, the relatively small change in Mo doping is manifested as a distinctive change in the spectral profile (requiring entirely different modeling parameters) because of constructive in-phase scattering functions of the highly symmetric rutile structure as compared to the lower symmetry monoclinic M1 structure. The latter polymorph exhibits considerable destructive interference owing to the different bond lengths giving rise to different backscattering phase shifts. This finding illustrates an important point that has not thus far been entirely appreciated in the literature and suggests a need for exercising caution in phase assignments given the concentration-disproportionate higher contributions from rutile domains that might coexist with the monoclinic M1 phase. Phase coexistence of M1 and R phases is indeed possible especially if there is heterogeneity in the extent of doping. In other words, with increasing Mo doping the nanowire samples comprise metallic and insulating domains with relative proportions dependent upon temperature. From the Raman data, only at and above a concentration of 1.45 atom % Mo is there no evidence for the monoclinic phase at room temperature (the sample is entirely in the metallic rutile phase). Owing to the differences in symmetry, when R domains are nucleated within the $VO_2$ samples, they will have a much greater contribution to the EXAFS oscillations even if they are present at relatively low concentrations. The V K-edge data are compelling in suggesting substantial contributions from the higher symmetry rutile structure at room temperature even for Mo doping as low as 0.43 atom %. Table 2 indicates that the equatorial and axial V—O bond lengths extracted for the rutile phases with higher Mo concentrations are ~1.95 and 2.05 Å (error bars noted in Table 2), consistent with Jahn-Teller distorted but otherwise fairly symmetric octahedral local coordination environment around the vanadium atoms.

The set of peaks centered around 2.25 and 3.00 Å is dominated by the scattering paths for V—V interactions. Fittings of the experimental data for additional scatterers beyond the first shell are less sensitive to whether a monoclinic or rutile structure model is invoked. Along with the V K-edge XANES data, this observation further corroborates the rectification of tilting (and thereby increased overlap of d∥ orbitals with increased Mo doping). While not accurately reproduced in the fitted data, the experimental data show a distinct shift to longer scattering paths as well as the appearance of a shoulder for the nearest V—V interactions (scattering paths around 2.25 Å) with increasing Mo concentration. The new scattering feature highlighted in FIG. 3 may arise from the inequivalence of V—V lengths along the tetragonal c axis as dimerization and vanadium-vanadium pairing is restored in the correlated metal phase with increasing Mo incorporation. Indeed, Cava and co-workers have noted that while the pairing between adjacent edge-shared $VO_6$ octahedra is initially weakened upon Mo incorporation the short and long V—V bonding motif is progressively restored upon further substitutional doping. The appearance of distinctive short and long V—V interactions in the metallic phase although without tilting of the edge-shared octahedra suggests a local structure that is substantially different from that observed for $W^{6+}$-doped $VO_2$. In contrast, the scattering paths for the more distant V—V interactions centered around 3.0 Å are increased when the rutile phase becomes preponderant over the monoclinic M1 phase but does not then substantially increase with more extensive Mo doping. This again is distinctive from the observation of inhomogeneous lattice expansion along [110] and [−110] directions found for W-doped $VO_2$. The relatively muted role of Mo in altering the lattice size is accounted for by considering the similar size of the $V^{4+}$ and $Mo^{5+}$ cations and the isostructural nature of $VO_2$ and $MoO_2$, which have lattice parameter unit cell dimensions of 60.1 and 65.2 $Å^3$, respectively.

X-ray absorption spectroscopy at Mo and V atomic absorption edges thus allows examination of the electronic and geometric structure of both the dopant and host lattice with unprecedented detail, providing access to a detailed picture of local perturbations introduced upon doping. Studying the doping-induced insulator→metal transition enables specific states of the phase diagram to be elucidated without obscuration from thermal fluctuations and memory effects characteristic of the temperature-induced phase transition. An analogous structural phase progression for doping-, voltage-, and temperature-induced phase transitions has recently been observed for $W_xV_{1-x}O_2$ nanobelts.

To summarize the role of Mo in depressing the critical temperature and to correlate the findings gathered here about local structure to current understanding of mechanistic aspects of the metal-insulator transition of $VO_2$, it is apparent that incorporation of this substitutional dopant distinctively alters both the electronic and geometric structure of the host lattice. Both XANES and EXAFS data at Mo and V K-edges suggest substantially enhanced local symmetry upon substitutional Mo incorporation for both the dopant Mo species as well as vanadium atoms of the host lattice. In particular, the increased octahedral symmetry evidenced in the immediate vicinity of the dopant atom is suggestive of the nucleation of high-symmetry domains that are more closely related to the high-temperature rutile phase and are thus locally able to reduce activation energy (enthalpic) barriers for transformation to this phase. A percolative mechanism for the metal-insulator phase transition of $VO_2$ involving the initial nucleation and subsequent propagation of metallic domains has been propounded based on near-field infrared scanning optical microscopy observations. The Mo-dopant sites observed here are not metallic domains in the conventional sense but may well serve to nucleate the metallic phase, which can then propagate through adjacent unit cells via cooperative avalanche-type processes. Given the similarities in cation size between the dopant and the host lattice, the effects of doping are muted as compared to the incorporation of $W^{6+}$. Nevertheless, even the vanadium host lattice shows a discernible increase in local symmetry at least for the immediate ligand shell around vanadium upon Mo incorporation. This suggests that one of the consequences of Mo incorporation is to reduce the tilting of the edge-shared $VO_6$ octahedra characteristic of the monoclinic M1 phase depicted in FIG. 1. Restoration of linearity for edge-shared octahedra and increased equivalence of V—O bond lengths is reflected in the electronic structure as more symmetric V—V interactions along the tetragonal c axis. Notably, the tilting and distortions of the $VO_6$ octahedra in the monoclinic M1 phase permit stronger V 3d-O 2p hybridization, particularly facilitating Π-interactions of the metal d orbitals with the ligands and stabilizing the bonding states and pushing the antibonding π* states to higher energies. This geometry allows close interactions between d∥ bands within molecular V—V dimers that can give rise to correlated bonding and antibonding Heitler-London states. The rehybridization induced by structural linearization will thus serve to weaken the localized d∥ interactions, effectively contributing to closing the band gap introduced as a result of the Peierls distorted geometry and electronic correlations within the dimers of the monoclinic M1 phase. While the vanadium atoms in proximity of the Mo dopant continue to remain linearized and symmetric along the tetragonal c axis (as evidenced by the scattering paths observed in the Mo K-edge EXAFS region), the V K-edge EXAFS data indicate that increasing Mo doping intriguingly restores some V—V dimers (likely at some distance from the dopants) even within the metallic region of the phase space, although due to linearization and lattice expansion, full correlation of d∥ interactions within these dimers is likely not recovered. A nominal oxidation state of +5 for Mo, as evidenced by Mo K-edge XANES data and bond valence sum calculations, suggests electron doping of the $VO_2$ band structure, which is further corroborated by the diminished average oxidation state of vanadium sites surmised from V K-edge XANES data. The concerted increase in carrier density and enhancement of local symmetry alters the phase diagram, specifically destabilizing the monoclinic M1 phase and facilitating the insulator-metal transition at a lower critical temperature. The amplified effect of Mo doping observed within nanostructures is likely a manifestation of the specific sites occupied by the dopant species as well as the ease of propagation of a Martensitic-like transformation within a single nanowire across one dimension.

A combination of XANES and EXAFS spectroscopies at Mo and V K-edges provides detailed insight into the local geometric and electronic structure of Mo-doped $VO_2$. A nominal valence of +5 has been deduced for the Mo dopants, which explains the relatively smaller depression of metal-insulator and insulator-metal phase transition temperatures observed for Mo doping as compared to doping with $W^{6+}$. The local symmetry around Mo dopant atoms is more closely related to that of the high temperature metallic rutile phase as compared to the insulating monoclinic phase, indicating a structural contribution to the depression of the critical temperature. In essence, the Mo dopant not only adds electrons to the $VO_2$ band structure but also serves as a seed for nucleation of the high-temperature (and high symmetry) metallic phase. Linearization and decreased canting of $VO_6$ octahedra as a consequence of increasing dopant concentration diminishes electron-electron correlations within dimers of the monoclinic M1 phase, thereby serving to close the band gap and induce a transition to the metallic phase. A correlated set of cationic interactions, thought to be characteristic of a correlated metallic phase of intermediate mass, is seen to emerge with increasing Mo doping and can be attributed to local dimerization along the rutile c axis. Future work will focus on examination of local structure perturbations accompanying temperature- and voltage-induced phase transitions in $VO_2$ nanowires.

TABLE 1

| Mo % | $E_o$ (eV) | $\sigma^2$ (3 × $10^{-3}$ Å) oxygen | $\sigma^2$ (3 × $10^{-3}$ Å) vanadium | Mo—$O_{eq}$ (Å) | Mo—$O_{ax}$ (Å) | Mo—V1 (Å) | Mo—V2 (Å) | Reduced $X^2$ | R-factor |
|---|---|---|---|---|---|---|---|---|---|
| 0.39% | −1.29 (+/−0.95) | 6.0 (+/−3.3) | 4.1 (+/−2.7) | 1.95 (+/−0.02) | 2.03 (+/−0.02) | 2.87 (+/−0.04) | 3.57 (+/−0.04) | 801 | 0.037 |
| 0.43% | −4.5 (+/−1.32) | 4.5 (+/−3.6) | 4.8 (+/−3.4) | 1.94 (+/−0.02) | 2.04 (+/−0.02) | 2.88 (+/−0.04) | 3.54 (+/−0.04) | 699 | 0.058 |
| 0.65% | −3.85 (+/−2.61) | 4.3 (+/−2.3) | 4.6 (+/−3.2) | 1.84 (+/−0.03) | 2.05 (+/−0.03) | 2.87 (+/−0.03) | 3.55 (+/−0.03) | 976 | 0.052 |
| 0.85% | 1.59 (+/−1.14) | 3.2 (+/−3.0) | 4.5 (+/−3.1) | 1.96 (+/−0.02) | 2.04 (+/−0.02) | 2.88 (+/−0.05) | 3.59 (+/−0.05) | 1032 | 0.049 |
| 1.15% | −1.63 (+/−0.87) | 3.6 (+/−2.7) | 4.1 (+/−2.6) | 1.94 (+/−0.02) | 2.03 (+/−0.02) | 2.86 (+/−0.02) | 3.57 (+/−0.02) | 824 | 0.039 |
| 1.15% | −5.66 (+/−2.82) | 4.2 (+/−3.3) | 6.1 (+/−3.4) | 1.95 (+/−0.01) | 2.04 (+/−0.01) | 2.87 (+/−0.02) | 3.57 (+/−0.02) | 1075 | 0.032 |
| 2.03% | −2.67 (+/−1.65) | 4.3 (+/−1.9) | 6.2 (+/−2.8) | 1.97 (+/−0.02) | 2.06 (+/−0.02) | 2.89 (+/−0.02) | 3.56 (+/−0.02) | 704 | 0.041 |

Table 1. EXAFS Fitting Parameters for Models Used to Fit Mo k-Edge Spectra. Using the crystal structure of the rutile phase of $VO_2$ and substituting a vanadium atom with Mo photoabsorbers yields the best fit to the experimental data, as suggested by the $R_{fit}$ values indicated above. The amplitude reduction factor has been restrained to a fitted value of ~0.83 deduced from data for Mo standards. Energy shift accounts for relative mismatch of energy grids between sample and model with all fittings at or below acceptable values (<±6 eV). Bond length changes were modeled using two parameters to account for each type of scatterer, oxygen and vanadium. At low Mo concentrations, the Mo—O thermal parameter indicates relatively high disorder, whereas the Mo—V distances are less disordered. As the dopant concentration increases, the fitted values suggest less disorder for Mo—O distances and increased disorder for Mo—V interactions. The disorder in general is likely derived substantially from the different sites that can be occupied by Mo dopants at various proximities from the surface as well as surface reconstruction effects and possible proximity of Mo dopants that are not accounted for in our simple model.

Notably, the depression in phase transition temperature saturates at a relatively low dopant concentration in the nanobelts, thought to be associated with the specific sites occupied by the tungsten substitutional dopants in these structures. The marked deviations from bulk behavior are rationalized in terms of a percolative model of the phase transition taking into account the nucleation of locally tetragonal domains and enhanced carrier delocalization that accompany $W^{6+}$ doping in the $W_xV_{1-x}O_2$ nanobelts.

Synthesis. Analytical grade $V_2O_5$, $H_2C_2O_4$ (oxalic acid), and $H_2WO_4$ (tungstic acid) were purchased from Sigma Aldrich and used without further purification. Deionized water from a Barnstead International NANOpure Diamond ultrapure water system ($\rho$=18.2 M$\Omega$/cm) was used to prepare all aqueous solutions. In a typical synthesis of $W_xV_{1-x}O_2$ nanobelts, 300 mg of $V_2O_5$ was dispersed in 16 mL of deionized water. Subsequently, 400 mg of $H_2C_2O_4$ and an

TABLE 2

| Mo % | $E_o$ (eV) | $\sigma^2$ (3 × 10−3 Å) | | Mo—$O_{eq}$ (Å) | Mo—$O_{ax}$ (Å) | Reduced $\chi^2$ | R-factor |
| --- | --- | --- | --- | --- | --- | --- | --- |
| | | oxygen | vanadium | | | | |
| 0.39% | −5.22 (+/−1.41) | 7.5 (+/−0.5) | 14 (+/−2.5) | 1.76/1.86/1.87 (+/−0.03) | 2.00/2.04/2.06 (+/−0.03) | 667 | 0.026 |
| 0.43% | 1.34 (+/−0.85) | 8.3 (+/−6.7) | 4.6 (+/−2.9) | 1.93 (+/−0.01) | 2.00 (+/−0.01) | 1243 | 0.028 |
| 0.85% | −2.83 (+/−1.68) | 6.1 (+/−3.8) | 8.2 (+/−5.1) | 1.95 (+/−0.02) | 2.01 (+/−0.02) | 954 | 0.031 |
| 1.15% | 2.71 (+/−1.17) | 5.2 (+/−2.6) | 9.3 (+/−3.5) | 1.93 (+/−0.02) | 1.98 (+/−0.02) | 756 | 0.018 |
| 1.45% | −3.21 (+/−2.19) | 7.2 (+/−3.4) | 3.4 (+/−1.8) | 1.93 (+/−0.03) | 1.97 (+/−0.03) | 917 | 0.024 |
| 2.03% | −2.67 (+/−1.86) | 4.3 (+/−2.0) | 6.2 (+/−2.8) | 1.94 (+/−0.02) | 2.01 (+/−0.02) | 1327 | 0.021 |

Table 2. EXAFS Fitting Parameters and Bond Lengths Deduced From V K-Edge Spectra of $V_{1-x}Mo_xO_2$ Nanowire Samples. As explained in the text, the monoclinic M1 model yields the best fit for the 0.39 atom % Mo-doped sample, whereas the rutile model more accurately captures the experimental oscillations for the higher concentrations. The mismatch of around a few percent is acceptable, although more sophisticated models may yield a more unique fit for the data with higher reduced $\chi^2$ values.

Example 2

This example provides distinctive finite sized effects on the phase diagram and metal-insulator transitions of tungsten-doped vanadium (IV) oxide.

The influence of finite size in altering the phase stabilities of strongly correlated materials gives rise to the interesting prospect of achieving additional tunability of solid-solid phase transitions such as those involved in metal-insulator switching, ferroelectricity, and superconductivity. Some distinctive finite size effects on the relative phase stabilities of insulating (monoclinic) and metallic (tetragonal) phases of solid-solution $W_xV_{1-x}O_2$ were noted. Ensemble differential scanning calorimetry and individual nanobelt electrical transport measurements suggest a pronounced hysteresis between metal→insulator and insulator→metal phase transformations. Both transitions are depressed to lower critical temperatures upon the incorporation of substitutional tungsten dopants but the impact on the former transition seems far more prominent. In general, the depression in the critical temperatures upon tungsten doping far exceeds corresponding values for bulk $W_xV_{1-x}O_2$ of the same composition.

appropriate amount of tungstic acid were slowly added to this dispersion under vigorous stirring. After mixing for 5 min, the resulting mixture was transferred to a 23 mL Teflon cup and then heated in a sealed autoclave using a high-pressure Parr acid digestion bomb. The hydrothermal reaction was performed at 250° C. for times ranging from 12 hours-7 days. A dark blue precipitate was recovered after allowing the autoclave to cool to room temperature. The precipitate was washed with copious amounts of deionized water and acetone and then dried at ambient temperature.

Characterization. X-ray Diffraction: The phase purity of the products was examined by using X-ray diffraction (XRD) on a Rigaku Ultima IV diffractometer with Cu K$\alpha$ radiation ($\lambda$=1.5418 Å). The operating voltage and current were kept at 40 kV and 44 mA, respectively. Electron Microscopy: The dimensions, morphology, and elemental composition of the as-synthesized nanostructures were examined by means of scanning electron microscopy (SEM) and energy-dispersive X-ray (EDX) spectroscopy using a Hitachi SU-70 scanning electron microscope operating at an accelerating voltage of 20 kV. A JEOL 2010 instrument operated at 200 kV was used to acquire high-resolution transmission electron microscopy (HRTEM) images and selected area electron diffraction (SAED) patterns. To prepare the samples for HRTEM/SAED analysis, the nanostructures were dispersed in 2-propanol and then deposited onto 300-mesh carbon-coated Cu grids. Elemental Analysis: The precise stoichiometries of the $W_xV_{1-x}O_2$ nanobelts were determined by inductively coupled plasma mass spectrometry (ICP-MS) analyses. The solid samples were digested using concentrated HF solution before injection into the ICP-MS column. Differential Scanning calorimetry: The phase transitions of the as-prepared nanobelts were studied by differential scanning calorimetry (DSC, Q200 TA instruments) over a temperature range of −50 to 150° C. under repeated heating/cooling cycles. X-ray Absorption Spectroscopy: The electronic structure of the $W_xV_{1-x}O_2$ nanostructures was studied by V K-edge X-ray absorption fine structure (XAFS) spectroscopy measurements. These measurements were acquired in transmission mode on the National Institute of Standards and Technology beamline X23A2 at the National Synchrotron Light Source of Brookhaven National Laboratory. For XAFS measurements, data were collected at the V K-edge and W $L_I$ and $L_{III}$-edges in transmission mode, using a Si (311) channel-cut monochromator. Ionization chambers were used to detect the incident and transmitted flux. To monitor the energy calibration, the XANES spectra of a metallic vanadium foil was recorded simultaneously to the XANES spectra of the samples, using a third ion chamber. Higher-order harmonics were removed with a harmonic rejection mirror. In all measurements the samples were diluted using boron nitride powder. Besides recording the XAFS of the as-prepared nanostructures, XAFS spectra of several high purity vanadium standards were recorded as references. For purposes of comparison between different samples, all EXAFS spectra were normalized and calibrated using the Athena suite of programs.

The W $L_{III}$-edge absorption data was processed using Athena, with background subtraction using the AUTOBK algorithm. Each sample was aligned using a reference standard. The edge energy was chosen past the strong white line absorption and constrained across all samples. The normalized absorption data was Fourier transformed using a k-space range of 2-10 Å$^{-1}$ with a hanning window and dk of 1 Å$^{-1}$. The resultant pseudo-radial distribution function was theoretically modelled using ARTEMIS in the R-rage 0.9-3.5 Å using multiple k-weights of 1, 2, and 3. The initial fitting models was created using published data on the rutile $VO_2$ structure using FEFF6. The FEFF input file was altered by placing a tungsten core absorber instead of vanadium. The rutile model included four paths; axial (2) and equatorial (4) V—O paths, V—V1 path, and V—V2 paths corresponding to the three well separated peaks. No significant contribution was observed from multiple scattering paths.

Electrical Transport Measurements: Single-nanobelt electrical transport measurements were performed using a physical property measurement system (PPMS). Prior to the electrical transport measurements, the nanobelts were dispersed in 2-propanol by mild ultrasonication and then deposited onto Si/SiO$_2$ (300 nm) substrates. Gold electrodes were patterned onto individual nanobelts using standard photolithography or electron-beam lithography and metallization techniques with chromium as the adhesion layer. Resistance versus temperature curves were acquired over a temperature range of 200-360 K under repeated heating/cooling cycles.

The high-temperature rutile polymorph of $VO_2$ crystallizes in the $P4_2/mnm$ space group, and is a relatively high-symmetry phase constituted primarily from chains of corner-shared [VO$_6$] octahedra with edge sharing along the crystallographic a direction. The structural transformation accompanying the metal→insulator transition upon cooling the rutile structure interestingly leads to a lowering of symmetry and lattice expansion as dimeric pairs of vanadium atoms are formed with alternating V—V distances of 2.65 and 3.12 Å and canting of the octahedra from the c-axis, yielding a zigzag chain motif of corner-shared [VO$_6$] octahedra for the low-temperature monoclinic M1 phase.

The $VO_2(B)\rightarrow VO_2(R)$ phase transition can be thought of as an order-disorder phase transition. The former phase is able to accommodate a high density of oxygen vacancies through crystallographic shear. However, above a critical threshold, it is energetically more favourable for the structure to collapse to form the rutile phase of $VO_2$.

The first experimental parameter that has been varied in the hydrothermal synthesis of phase-pure W-doped $VO_2$ nanostructures is temperature. FIG. 4A shows the XRD patterns of $W_xV_{1-x}O_2$ nanobelts prepared at 180, 210, and 250° C. for 72 hours using oxalic acid to reduce $V_2O_5$ with 20 mg of tungstic acid as the added dopant. The products obtained at 180° C. can be indexed to the metastable VO$_2$(B) polymorph (Joint Committee on Powder Diffraction Standards (JCPDS) 31-1438), which has attracted recent interest as a cathode material for Li-ion batteries. Moreover, a recent intriguing study by Con et al. has uncovered a five orders of magnitude increase in electrical resistivity for pressed pellets of VO$_2$(B) nanorods at 290 K suggesting the presence of an electronic phase transition that has yet to be observed in the bulk.

In the instant system, upon increasing the temperature of the hydrothermal reaction to 210° C., the isolated products appear to be a mix of the original VO$_2$(B) phase along with a significant proportion of the monoclinic VO$_2$(M1) (JCPDS-43-1051) polymorph. However, only above reaction temperatures of 250° C. are the obtained 1D $W_xV_{1-x}O_2$ nanostructures found to be phase pure and exclusively monoclinic in crystal structure within the detection limits of powder XRD.

From a thermodynamic perspective, the metastable VO$_2$(B) phase is able to accommodate a high density of point defects, especially oxygen vacancies. However, as noted above, beyond a certain disorder threshold, the thermodynamic global minimum, the rutile VO$_2$(R) structure is stabilized at high temperatures, and is transformed to another global minimum, the monoclinic VO$_2$(M1) polymorph upon cooling and undergoing the metal→insulator phase transition. Consequently, by increasing the pressure and temperature and appropriately mapping the multidimensional variable space, it possible to circumvent the formation of the metastable VO$_2$(A) and VO$_2$(B) phases.

FIG. 4B shows the phase dependence of the isolated $W_xV_{1-x}O_2$ nanostructures on the reaction time. The diffraction patterns in this panel illustrate that after shorter reaction times, such as 14 and 27 hours, a residual amount of metastable VO$_2$(B) remains in the isolated products. Upon further increasing the reaction time to greater than 48 hours, the products appear to be exclusively phase-pure monoclinic VO$_2$, suggesting that the metastable VO$_2$(B) phase may perhaps be an intermediate before transformation to the rutile VO$_2$ structure that yields the M1 phase upon cooling.

The parameter space for $V_2O_5$ hydrothermal reduction by oxalic and citric acids were further explored by varying the concentration of the added reducing/structure-directing agents. As depicted in FIG. 6A, the formation of phase-pure VO$_2$(M) is achieved only within a limited concentration window of 0.14-0.28 mol/L oxalic acid, whereas various mixed VO$_x$ phases are observed below and above this optimum range of concentrations. In this context, binary vanadium oxides are known to have an incredibly rich phase diagram because of the diversity of vanadium oxidation states (−1 to +5), local coordination environments (tetrahedral, square pyramidal, octahedral, and trigonal bipyramidal), and their ability to accommodate point defects through crystallographic shear. Consequently, in the reduction of $V_2O_5$, it is imperative to maintain an appropriate concentration of the reducing agent to achieve the correct stoichiometry since the desired rutile and monoclinic phases of $VO_2$ are stable only within a relatively narrow composition window. Indeed, significant deviation from the vanadium to oxygen stoichiometry is also known to have a deleterious impact on the magnitude of the metal→insulator transition of $VO_2$.

The XRD patterns of undoped and W-doped $VO_2$ nanostructures with various extents of W doping are depicted in FIG. 5B. The M1 phase of $VO_2$ cannot be stabilized under hydrothermal conditions in the absence of W doping. Consequently, the undoped sample depicted in FIG. 5B is realized by annealing $VO_2(B)$ nanorods at 450° C. However, phase-pure monoclinic $W_xV_{1-x}O_2$ nanostructures are obtained for W-doping greater than 0.40% without need for an additional annealing step. The reported tungsten doping of the sublattice is based on ICP-MS measurements of acid-digested samples.

With increasing doping, the most prominent reflection, which can be indexed to the (011) plane of M1 $VO_2$, shows a shift towards smaller 2θ. In other words, the interplanar spacing increases with increasing extent of substitutional W incorporation within the monoclinic lattice, which is consistent with the larger atomic radius of the dopant $W^{6+}$ ion. For samples with 0.90 and 1.45 atom % W doping on the vanadium sublattice, a significant splitting of the (013) plane to a (130) and (002), respectively, were noted which are prominent diffraction peaks attributed to the rutile phase of tungsten-doped $VO_2$ thus, suggesting the stabilization of some amount of the rutile phase at room temperature. This is further corroborated by differential scanning calorimetry and electrical transport measurements reported in subsequent sections. The d-spacing for the M1 phase increases from 3.218 Å for undoped $VO_2$ to 3.250 Å for 0.68 atom % W doping on the vanadium sublattice, which corresponds to an approx. 0.99% lattice expansion and indicates the manifestation of significant tensile strain upon doping. Notably, $VO_2$ nanowires prepared by hydrothermal methods also show significant size-dependent lattice expansion even in the absence of doping and consequently are subject to tensile strain with resulting implications for the location of the critical temperature for the metal→insulator phase transition and possible stabilization of an intermediate M2 phase.

Figure 6:
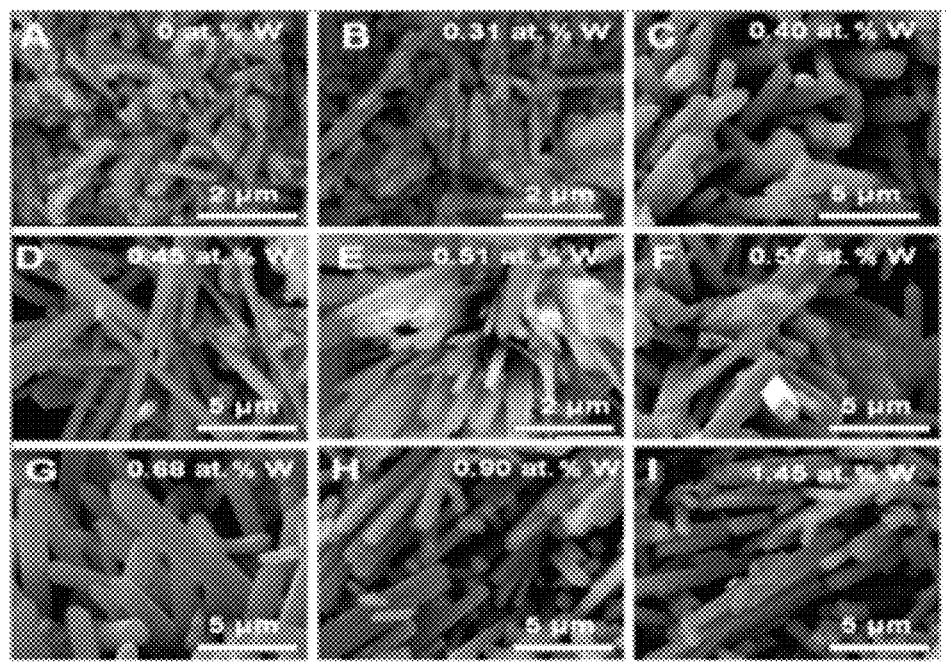
FIG. 6. Scanning electron micrographs of as-prepared W-doped $VO_2$ nanobelts. (A-I) correspond to different extents of W doping. The W dopant concentrations have been determined by ICP-OES measurements in each case and show a monotonic profile with the extent of added dopant precursor.

For the two higher doping concentrations presented here, the Debye-Scherrer broadening of the reflections prevents deconvolution into contributions from (011) reflections of the M1 phase and (110) reflections from the tungsten-doped R phase. Nevertheless, there is a significant shift of this feature to higher d-spacing values from 0.90 to 1.45% W doping, suggestive of increased W incorporation within the monoclinic/rutile lattice. At the relatively low doping concentrations studied here, no segregated $WO_x$ phases have been detected by XRD, suggestive of the formation of homogeneous solid-solutions. The induced strain in the tungsten-doped rutile and M1 lattices is notable since studies of $VO_2$ nanobeams indicate the doping- and strain-induced stabilization of an intermediate M2 phase. The strain evidenced here arises not from substrate effects, but from substitutional doping with a larger cation as well as finite size. Nevertheless, by stabilizing the intermediate M2 phase, strain effects could induce substantial alteration of the phase diagram of the $W_xV_{1-x}O_2$ system from the bulk. FIG. 6 depicts the morphologies of the $W_xV_{1-x}O_2$ nanostructures prepared by the hydrothermal reduction scheme.

In all cases, the formation of highly faceted nanobelt structures with approximately rectangular cross-sections were noted wherein the widths exceed than the thicknesses, as evidenced from cross-sectional high-resolution SEM images. FIG. 6 shows representative SEM images of as-synthesized $VO_2$ nanostructures prepared by the oxalic acid reduction of $V_2O_5$ for 72 hours in the presence of varying amounts of $H_2WO_4$. The nanobelts have smooth faceted sides, characteristic of single-crystalline structures, and are expected to result from the intercalation of reducing agents between the layers of $V_2O_5$, followed by lattice expansion, cleavage, and exfoliation of stacks of $V_2O_5$ sheets. The sheets can further split to yield nanobelts. Since the intercalating molecules also serve to reduce layered $V_2O_5$ to $VO_2(B)$ or tungsten-doped $VO_2(R)$, which are more densely packed crystal structures that are less amenable to intercalation by aliphatic bifunctional molecules, the driving force for further exfoliation and splitting disappears after all the $V_2O_5$ has been reduced. The experiments mapping the parameter space for these experiments suggest that appropriate reducing agent concentration and temperature are essential to induce a sufficient number of oxygen vacancies to stabilize the tungsten-doped rutile instead of the metastable $VO_2(B)$ while still retaining the $VO_2$ stoichiometry and precluding the formation of oxygen-deficient $VO_x$ phases.

Figure 21:
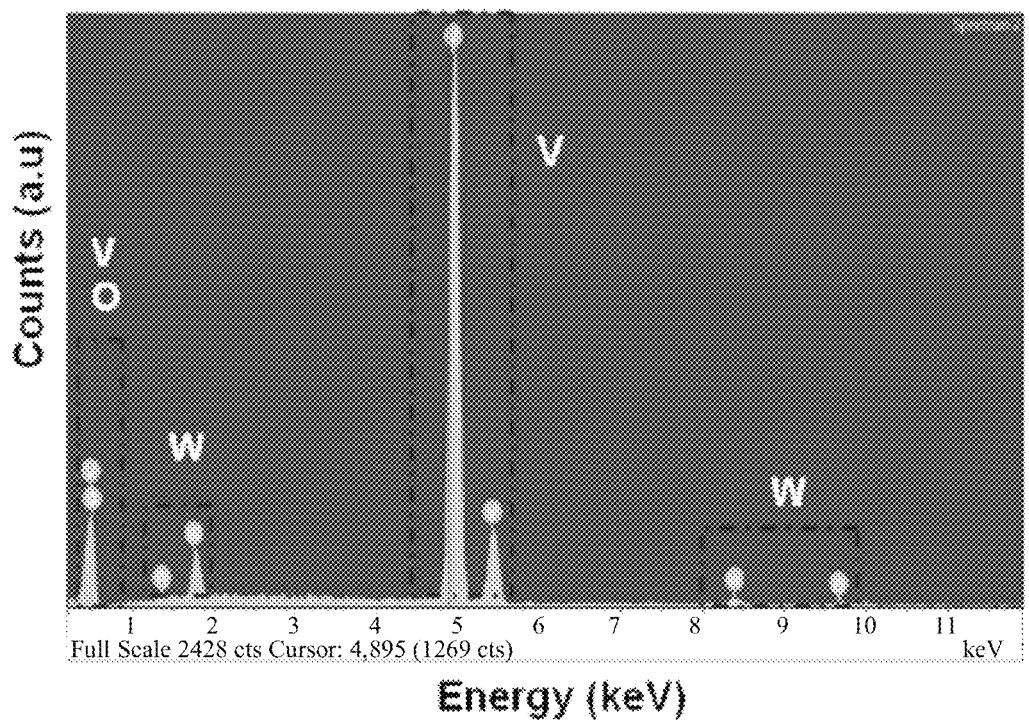
FIG. 21. Energy-dispersive X-ray spectra showing the presence of W, V, and O elements in the as-synthesized W-doped $VO_2$ nanostructures.

The EDX spectrum presented in FIG. 21 corroborates the presence of W, V, and O atoms in the nanobelts. No discernible concentration gradients were observed while mapping the elemental composition along the length of the nanobelts.

Figure 4:
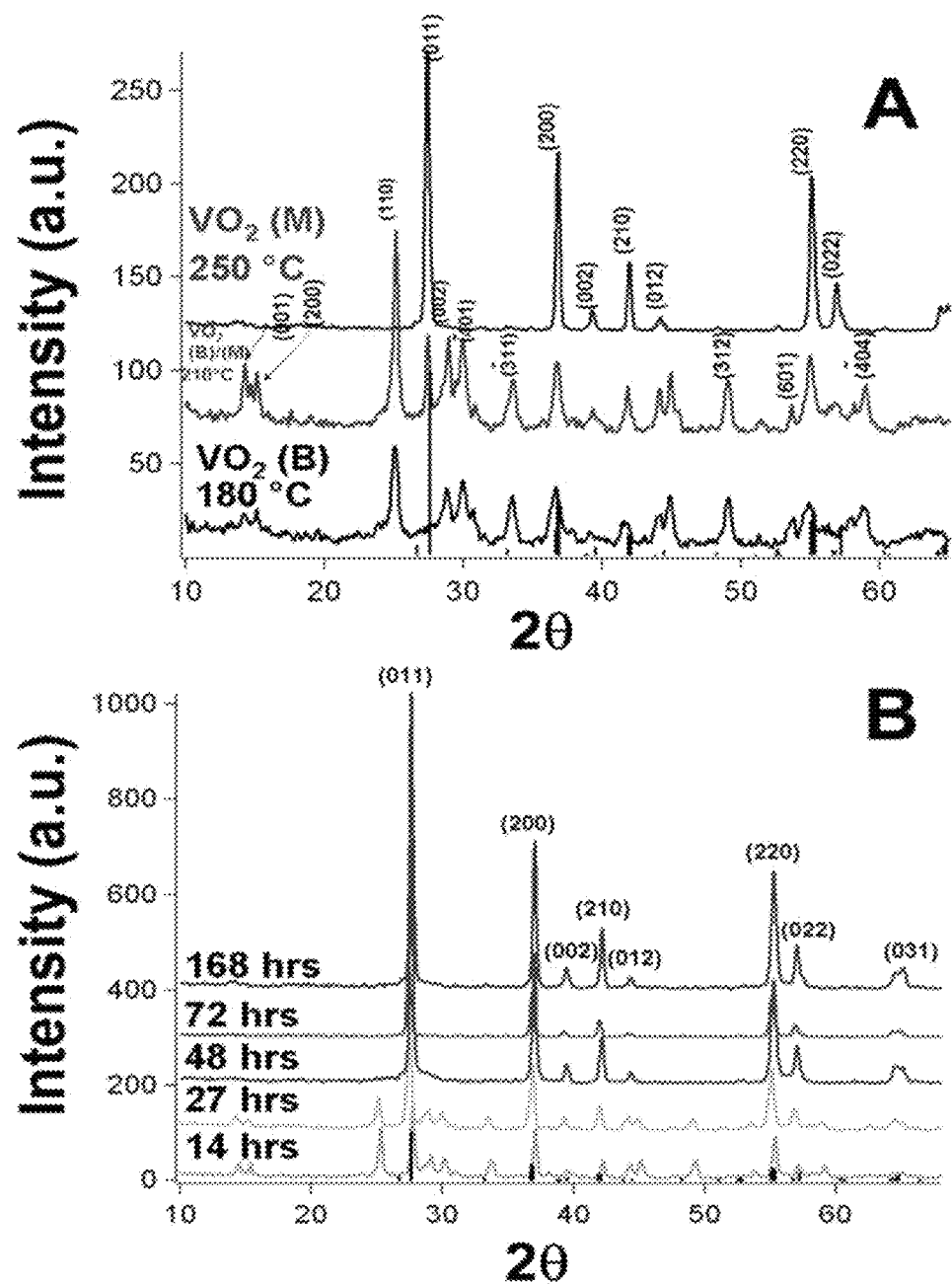
FIG. 4. XRD patterns of $VO_2$ nanostructures prepared by hydrothermal reduction of bulk $V_2O_5$ in the presence of oxalic acid as the reducing mediator and tungstic acid as the dopant. A) XRD patterns obtained at varying reaction temperatures and B) at varying reaction times. The nominal W dopant composition of the samples as determined by ICP-OES is 0.75 atom %. Note that in (A) the presence of the tungsten dopant is essential to stabilize the M1 phase and that in the absence of adequate W-doping, only the $VO_2(B)$ phase is obtained under these conditions and transformed to the M1 phase by annealing at 450° C.
Figure 5:
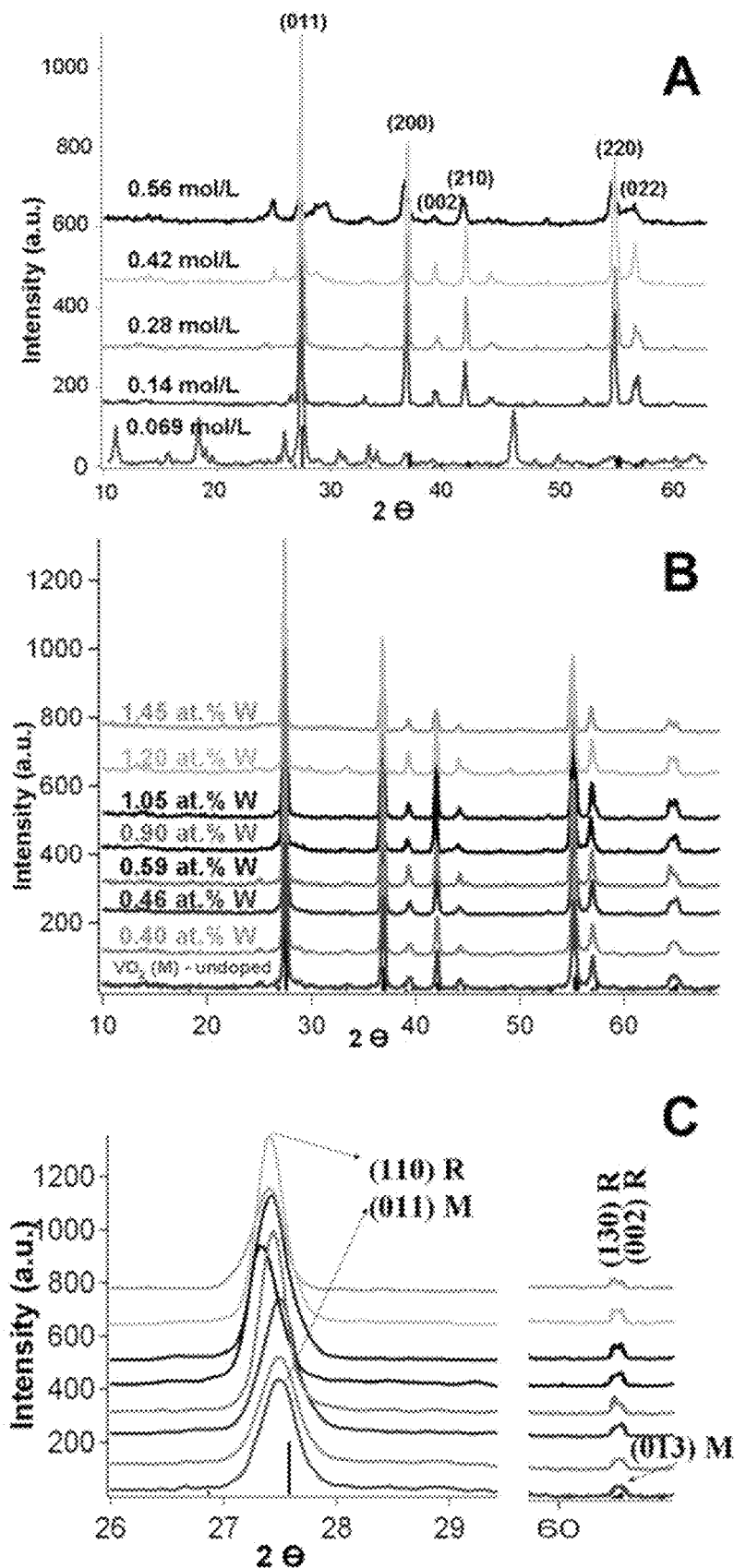
FIG. 5. XRD patterns of $W_xV_{1-x}O_2$ nanostructures upon (A) increasing the concentration of oxalic acid (nominal composition: $W_{0.57}V_{99.43}O_2$) and (B) for different extents of tungsten doping. (C) A magnified version of the XRD data depicted in (B) in the 26°≤2θ≤30° and >60° range. The undoped $VO_2$ (M1) sample depicted in (B) was prepared by annealing $VO_2$ (B) nanorods at 450° C.
Figure 22:
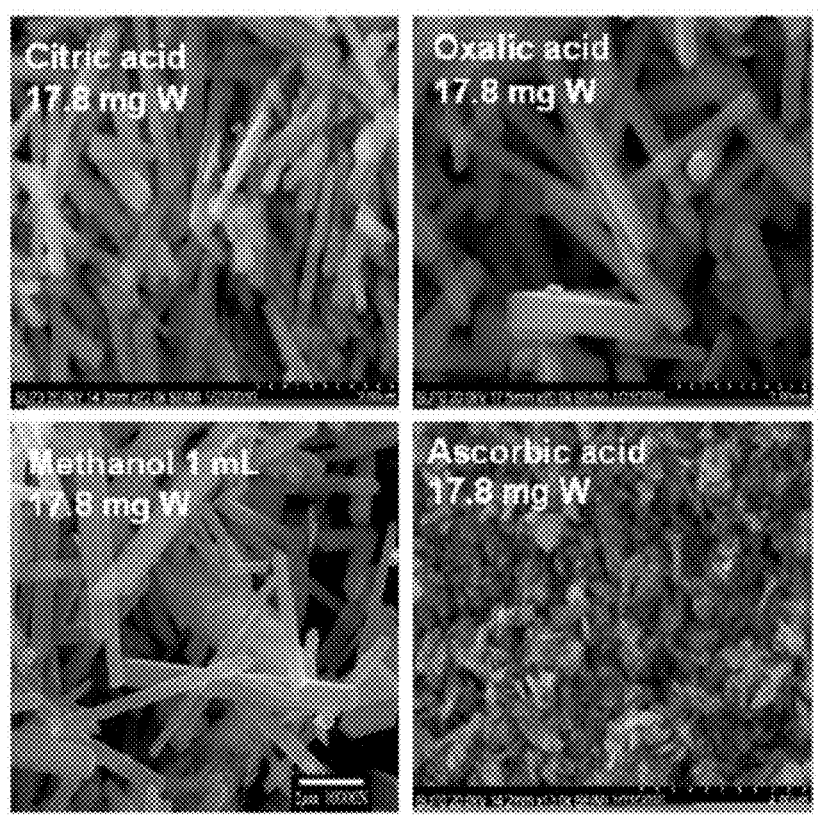
FIG. 22. SEM images for as-prepared $W_xV_{1-x}O_2$ nanostructures under different reducing agents.
Figure 23:
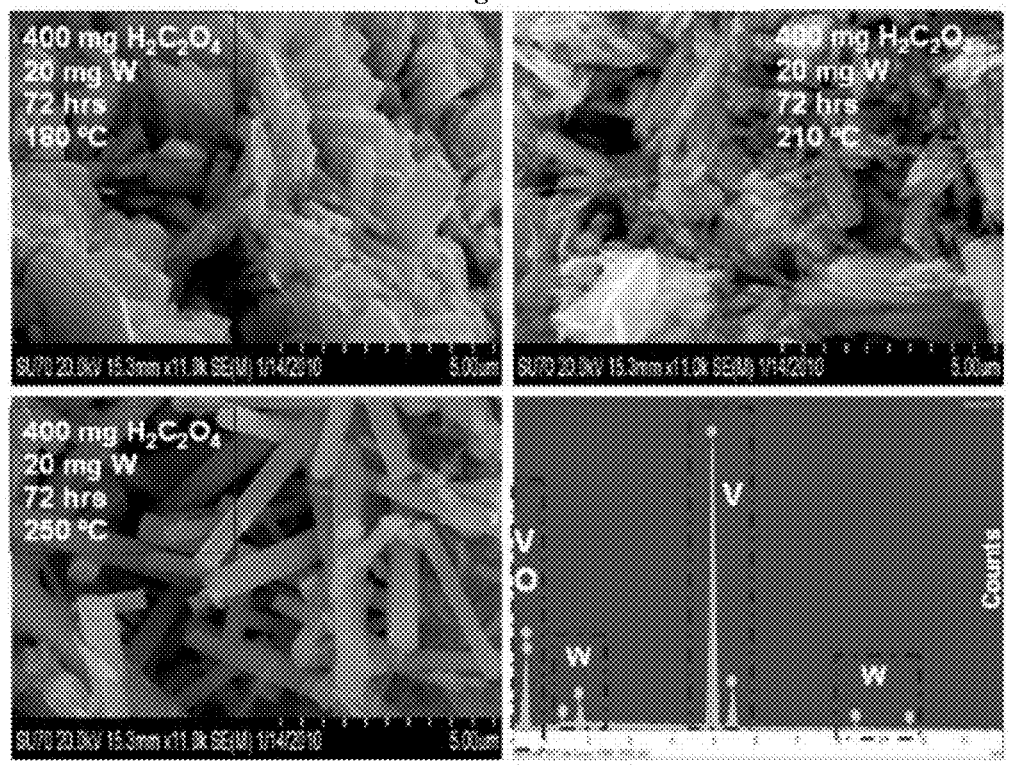
FIG. 23. SEM images for as-prepared $W_xV_{1-x}O_2$ nanostructures under different reaction temperatures. The EDX spectrum corroborates the presence of W, V, and O within the nanostructures.
Figure 24:
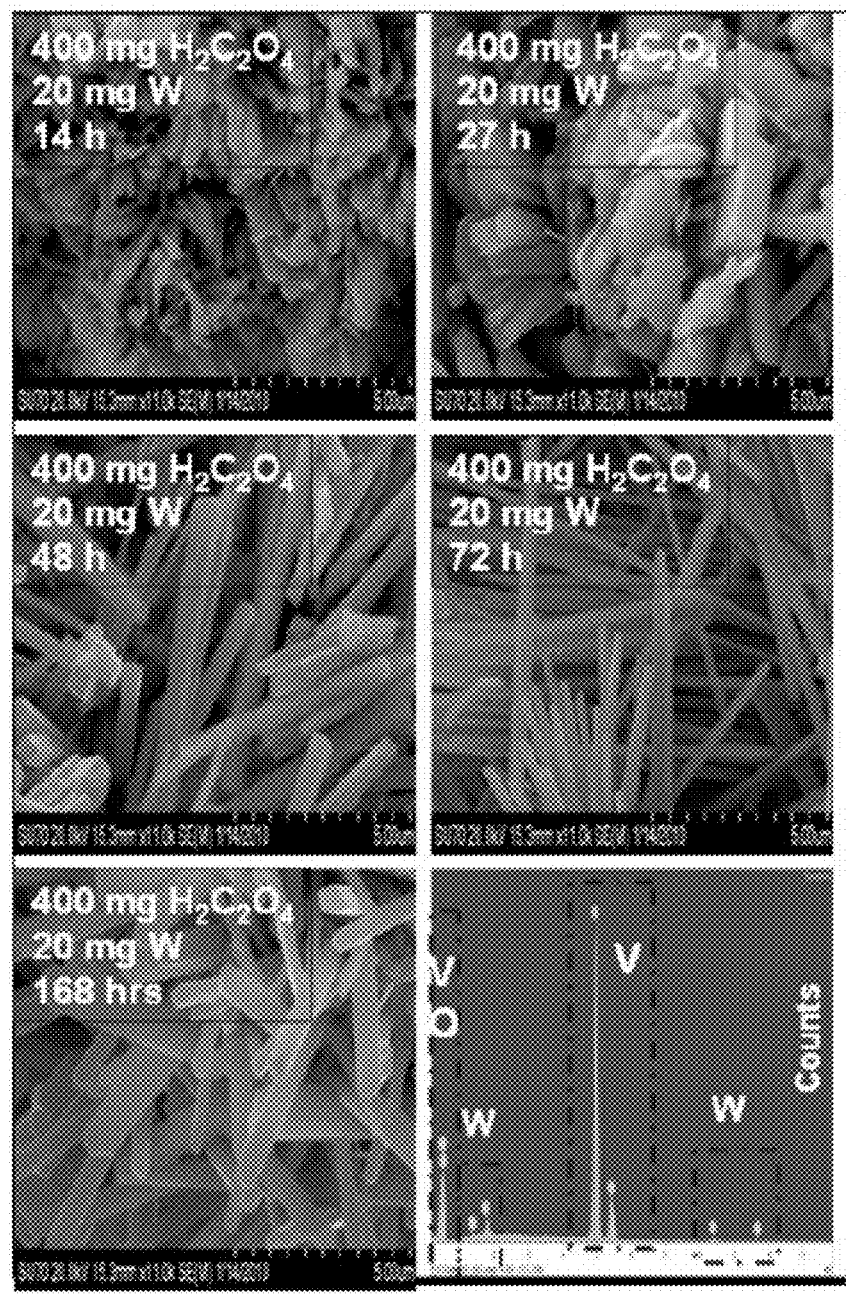
FIG. 24. SEM images for as-prepared $W_xV_{1-x}O_2$ nanostructures prepared at different reaction times. The EDX spectrum further corroborates W doping within the nanostructures.

As suggested by the XRD patterns in FIGS. 4 and 5, while mapping the multidimensional parameter space, different mild reducing agents, temperature, and reaction time exert distinctive influences on the morphology and crystal structure of the nanostructures. FIGS. 22-24 illustrate the influence of the structure-directing agent, reaction time, and reaction temperature on the morphologies of the obtained products.

Figure 7:
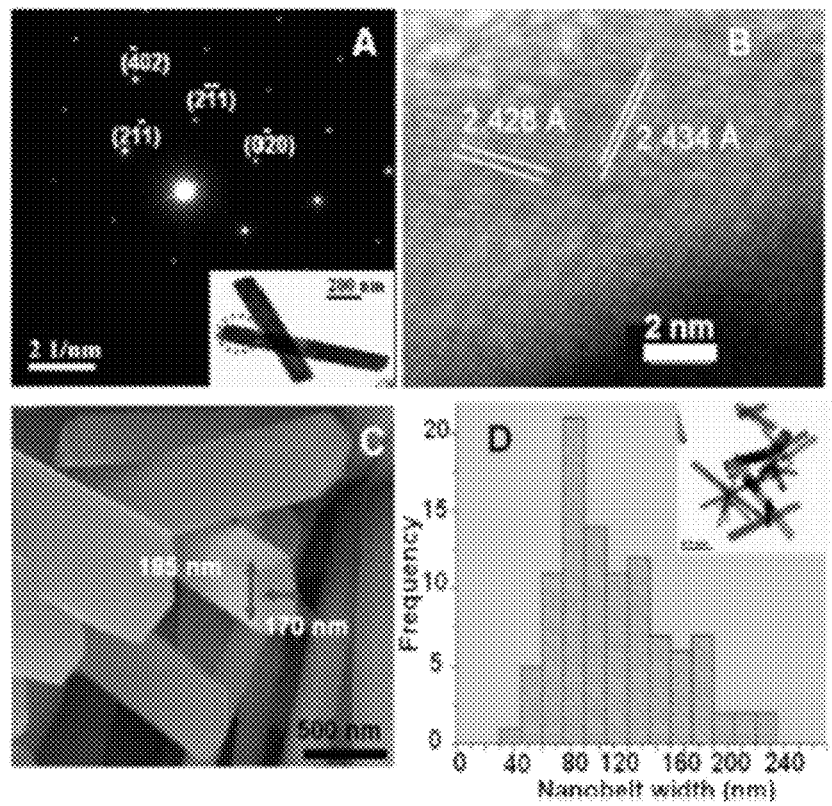
FIG. 7. (A) Indexed SAED pattern for W-doped $VO_2$ nanobelts along the [102] axis. (B) Lattice-resolved HRTEM image of an individual W-doped $VO_2$ nanobelt derived from the hydrothermal treatment of bulk $V_2O_5$ with oxalic acid in the presence of tungstic acid (W doping of 0.9 atom %). (C) High-resolution SEM image showing the faceted nature of the nanobelts. (D) Size distribution histogram for the as-prepared W-doped $VO_2$ nanobelts with 0.9 atom % W doping. Inset: Low-resolution TEM image of several nanobelts.

The single-crystalline nature of the faceted nanobelt structures are evidenced by the lattice-resolved HRTEM images and SAED patterns shown in FIG. 7. The fringe spacings observed in FIG. 7B (acquired along the [102] zone axis) are 2.428 and 2.434 Å, which can be indexed to the spacings between (2-1-1) and (0-20) planes, respectively. The SAED patterns do not change along the length of the nanobelts, evidencing their single-crystalline nature. TEM images of the nanobelts also enable the construction of size distribution histograms based on the dimensions of >100 individual nanobelts. These analyses suggest a diameter distribution centered about 80±20 nm in diameter for W dopant concentrations >0.40 atom %, although nanobelts with diameters <30 nm were also observed.

X-ray absorption spectroscopy at the V K- and W $L_{III}$-edges has been used for additional structural characterization of as-prepared $W_xV_{1-x}O_2$ nanostructures. Notably, the X-ray absorption probability for an individual photoabsorber atom in a material is modulated by its chemical environment and thus the spectral features (depending on the atom and specific absorption edge) can reflect the formal oxidation state, coordination number, species of surrounding atoms, the alignment of specific bonds within a structure, and the electronic structure of the material. Perhaps the most important advantage of XAFS over conventional diffraction techniques used to characterize bulk materials is that as an element-specific probe, XAFS presents no crystallinity requirements and can be readily applied to nanostructured materials with Debye-Scherrer broadening of diffraction peaks. Spectral features ranging to about 40-50 eV above the binding energy of the photoabsorber atom are denoted as X-ray absorption near edge structure (XANES) features, whereas features 50-1000 eV above the edge constitute the extended X-ray absorption fine structure (EXAFS) spectrum of the material. Data at the V K-edge and the WL$_{III}$ edge were acquired to separately study the local coordination environments of the host lattice and the dopant inclusions.

For binary vanadium oxides and metal vanadates, the intensities and peak positions of the pre-edge absorption feature strongly depends on the vanadium oxidation state, local coordination environment (distortion from octahedral symmetry), and the "cage size" defined by the bond lengths between vanadium and the nearest neighbour ligand atoms. With increased W doping, there appears to be a subtle monotonic shift in the peak position of the $W_xV_{1-x}O_2$ nanobelts to higher energies and there is also a distinctive diminution in the intensity of this feature. As evidenced from the diffraction data in FIGS. 5 and 6, the incorporation of larger W atoms results in lattice expansion, presumably weakening the V—O bonds. Furthermore, doping $W^{6+}$ into the lattice likely results in reduction of some vanadium sites to form $V^{3+}$—$V^{4+}$ and $V^{3+}$—$W^{6+}$ pairs to maintain charge neutrality (vide infra). The resultant $V^{3+}$—O bonds are undoubtedly weaker than the original $V^{4+}$—O interactions. The net result of the physical lattice expansion and the nucleation of $V^{3+}$ sites will be an increase in the V—O distances defining the cage of nearest neighbor interactions. This would justify the diminished intensity of the peak with increasing W doping. Furthermore, for the two highest doping concentrations presented here, it was noted the stabilization of the tungsten-doped rutile phase at room temperature. The raising of local site symmetry upon transition to the tetragonal phase may further be responsible for the diminished intensity of this feature. For example, the XANES spectra of square pyramidally coordinated vanadium compounds such as in $Na_3VO_4$, $V_2O_5$, and $NH_4VO_3$ are typified by an intense pre-edge absorption feature.

With increasing vanadium formal oxidation state, the energy required to excite a core electron is increased. A set of bulk binary vanadium oxides and related metal vanadates were measured and plotted the peak positions of the different spectral features as a function of energy to derive an approximate calibration curve (FIG. 21). Based on this analysis, a formal oxidation state slightly smaller than 4+ is deduced for vanadium atoms in the $W_xV_{1-x}O_2$ nanobelts. As a caveat, simplistic interpolation method provides a valuable and realistic means of evaluating the oxidation state of V in the solid-solution nanostructures within ±0.25 units, but there are several complicating factors for example, differences in screening and Coulombic repulsion in metallic versus insulating domains will complicate the analysis above. Further, the evident strain and surface reconstruction effects observed for nanostructures and demonstrated by their appreciably different lattice constants are further expected to contribute to observed variations in the peak positions of the threshold, absorption-edge, and 1s→4p absorption features for the $W_xV_{1-x}O_2$ nanobelts. Consequently, both V and W XANES data must be taken together to arrive at a realistic description of the formal oxidation states of the two transition metals.

Figure 13:
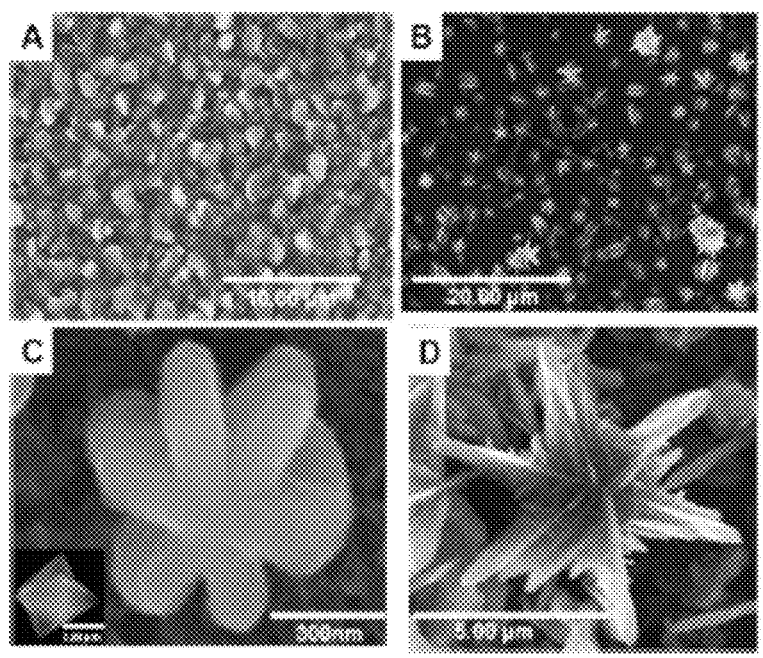
FIG. 13. SEM images of the deposited $V_2O_5$ layers and nanostars. A) Polycrystalline $V_2O_5$ film prepared by the catalytic vapor transport of bulk VO. B) $V_2O_5$ nanostars formed by the combined vapor transport/hydrothermal dissolution of vapor-deposited $V_2O_5$ layers. C) High-magnification image of an as-synthesized $V_2O_5$ nanostar. D) Incomplete separation of the six arms indicating and unfinished reshaping of the surface-tethered $V_2O_5$ grains; inset shows a cross-sectional image.

To study the local structure of the W dopants, XAFS spectra have been acquired at the W L$_I$ edge, corresponding primarily to dipole-allowed transitions from 2p levels to states that are predominantly 5d in origin. Pronounced splitting of the fundamental absorption is apparent in the W L$_I$ XANES spectra due to discrete transitions to $t_{2g}$ and $e_g$ states for octahedrally coordinated W centers. FIG. 13 depicts spectra acquired for various standards including $WO_2$ and $WO_6$ along with some related tungstates. Clearly, the W L$_I$ absorptions for the $W_xV_{1-x}O_2$ nanobelts lie closer in energy to the $W^{6+}$ standards than the $W^{4+}$ standards. The characteristic octahedral splitting and evidence for the tungsten valence observed in the XANES spectra suggests that W is doped as a substitutional $W^{6+}$ dopant (analogous W L$_{III}$ data is shown in FIG. 23). This is further corroborated by fitting the EXAFS features acquired at the W L$_I$ edge for a limited set of samples. The data is best fit by a structural model that places a substitutional W dopant within a symmetric (non-dimerized) lattice, suggesting that even at low W concentrations locally tungsten-doped rutile domains may be stabilized in the monoclinic matrix. The W—O distances determined from fitting the first two shells to the data are 1.89 and 1.94 Å for the nearest neighbor equatorial and axial oxygens, respectively. Bond lengths in this regime are characteristic of $W^{6+}$—O bonds and further bolster arguments for tungsten being doped into the nanobelts in its highest oxidation state (in contrast, $W^{4+}$—O distances are on the order of 2.02 Å). The fits also yield a W—V distance of 2.97 Å, which again is best matched to a $W^{6+}$—$V^{3+}$ interaction (Table 3).

The electronic and geometric structure data taken together point to substitutional tungsten doping within monoclinic $VO_2$ nanobelts with the doped tungsten centers reducing adjacent vanadium sites to form $W^{6+}$—$V^{3+}$ and $V^{4+}$—$V^{3+}$ pairs along the zigzag chains. Consequently, the homopolar dimeric $V^{4+}$—$V^{4+}$ bonding motif characteristic of the monoclinic phase is disrupted. Another manner of looking at this phenomenon is that additional electron density is added to the conduction band states, facilitating transformation to the metallic phase.

FIG. 5 shows differential scanning calorimetry data demonstrating the influence of W-doping on the temperature and hysteresis of the metal→insulator phase transition. As noted above, polycrystalline $VO_2$ undergoes a reversible thermally induced first-order metal→insulator transition (MIT) at $T_c \approx 67°$ C. between a high temperature metallic phase and a low-temperature insulating phase. The phase transition is first-order in nature and thus associated with a latent heat and a pronounced change in the specific heat capacity. The two primary contributions to the latent heat at the phase transition arise from the lattice distortion and the entropy change for conduction electrons because of the discontinuity in the carrier density. FIG. 5 shows sharp endothermic and exothermic profiles for the $W_xV_{1-x}O_2$ nanobelts upon heating and cooling, respectively. Upon doping W within the $VO_2$ nanobelts, the $T_c$ for the insulator-metal transition is depressed to 43.3, 34.2, and 33.8° C. for samples with 0.45, 0.57, and 0.90 atom % substitutional doping, respectively. Upon cooling the same samples across the phase transition, the changes in specific heat across the rutile to monoclinic structure occur at 8.7, −9.9, and −19.0° C., respectively, as compared to 60.1° C. for undoped $VO_2$. FIG. 5C plots the phase transition temperatures associated with the insulator→metal and metal→insulator phase transitions as a function of extent of tungsten doping. There is an almost linear depression of the phase transition temperature for both the heating and the cooling cycles up to ~0.90 atom % W doping.

TABLE 3

Bond lengths extracted from the fittings of the W
$L_{III}$ EXAFS spectra for two different W-doped $VO_2$ samples:

| Sample/Bonding | Bond length (Å) (±0.012) |
|---|---|
| 0.57% W doped $VO_2$ | — |
| W—O Axial $1^{st}$ shell | 1.94 (8) |
| W—O Equatorial $1^{st}$ shell | 1.89 (8) |
| W—V1 | 2.97 (±0.012) |
| W—V2 | 3.62 (±0.012) |
| 1.45% W doped $VO_2$ | — |
| W—O Axial $1^{st}$ shell | 1.94 (7) |
| W—O Equatorial $1^{st}$ shell | 1.88 (7) |
| W—V1 | 2.97 (±0.014) |
| W—V2 | 3.61 (±0.014) |

Further doping with tungsten has a much smaller influence on both structural phase transition temperatures and despite additional incorporation of W in the nanobelts, the metal→insulator and insulator→metal transitions remain steady around −20 and +30° C. For sputter-deposited $W_xV_{1-x}O_2$ thin films, a $T_c$ reduction of 24° C./atom % W was obtained with relatively little hysteresis between the transitions.

The phase transition behaviour of the $W_xV_{1-x}O_2$ nanostructures differs in some important respects from previous observations of W-doped $VO_2$ powders, thin films, and single crystals. First, a very pronounced hysteresis is observed between the insulator→metal and metal→insulator transitions that can range up to 50° C. Second, the insulator→metal and metal→insulator transitions show dramatically different dependences on the extent of substitutional tungsten doping. Third, the magnitude of the induced depression in the phase transition temperatures far exceeds previous observations for thin films and polycrystalline powders. As noted above, W doping has been reported to depress the phase transition temperature by ~20-26° C./atom % W. In the linear regime, the insulator-metal phase transition for the $W_xV_{1-x}O_2$ nanobelts is noted to be depressed by as much as ~80° C./atom % W. On a related note, a fourth distinction is that the $T_c$'s for both transitions initially follow a quasi-linear dependence but subsequently flatten out with tungsten doping exceeding 0.90 atom %.

Figure 9:
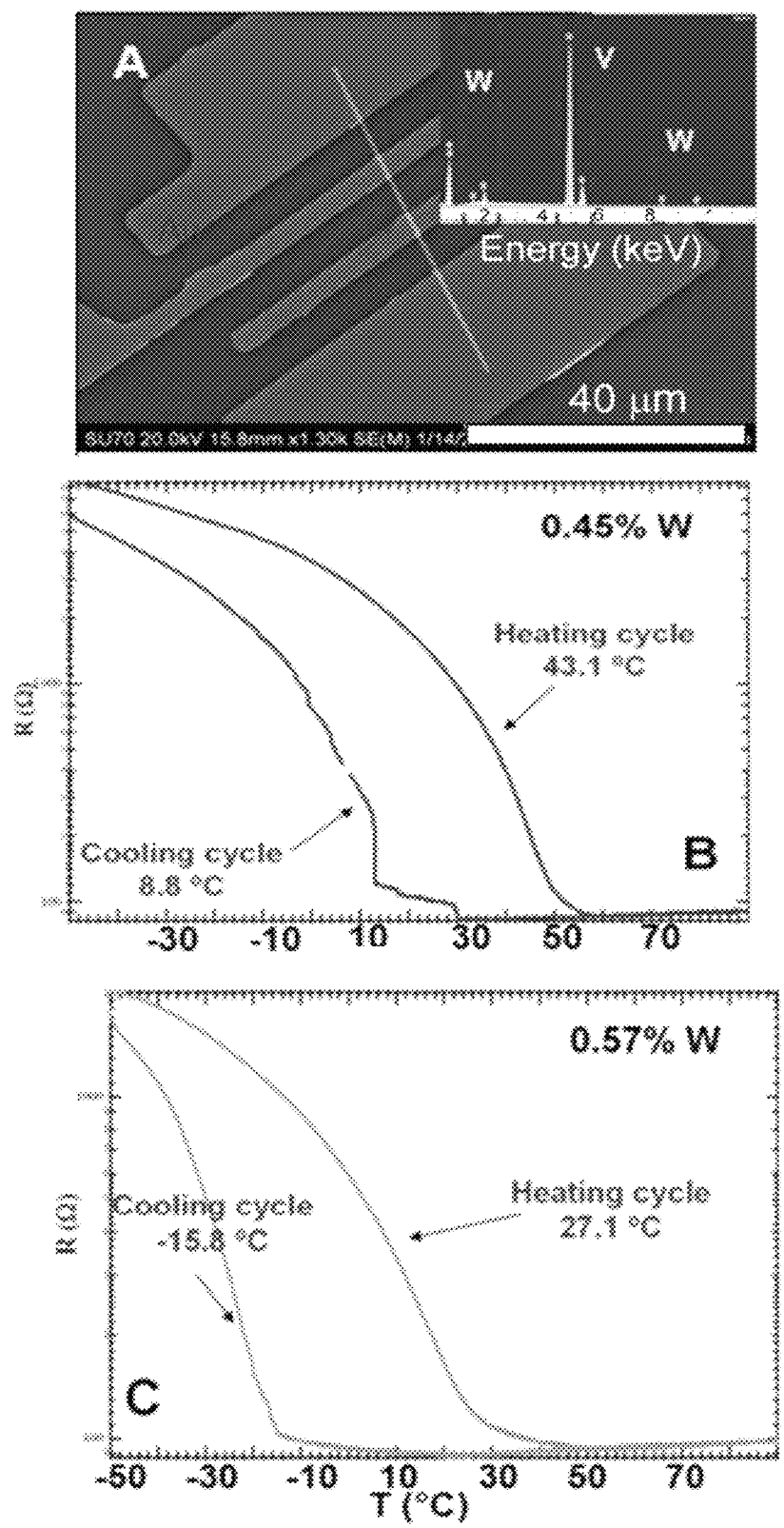
FIG. 9. Electrical transport data from single $W_xV_{1-x}O_2$ nanowires. (A) Scanning electron micrograph of a patterned $W_xV_{1-x}O_2$ nanobelt device. Inset corresponds to an EDX spectrum for a single nanobelt acquired for the device, corroborating the presence of W, V, and O atoms. (B-D) Resistance measurements of three different $W_xV_{1-x}O_2$ devices (i.e., 0.45 atom % W, 0.57 atom % W, and 0.90 atom % W) as a function of temperature, at a ramping rate of 3° C./min.
Figure 9:
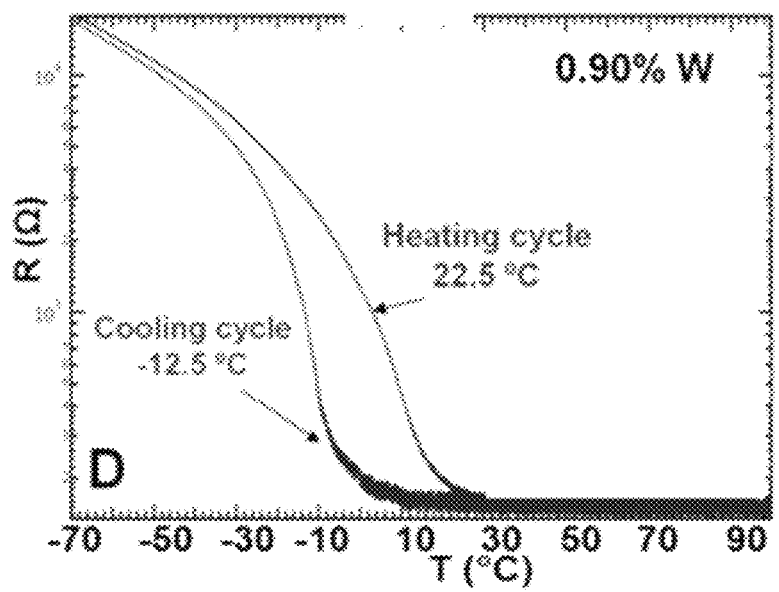

Since DSC is an ensemble measurement and notable features of the metal→insulator transition have been uncovered in single nanobelt measurements, the dependence of the electrical resistivity of individual nanobelts were measured as a function of temperature within four-electrode device geometries. FIG. 9A depicts the device architectures employed for these measurements. FIG. 9B plots the resistance as a function of temperature of a single $VO_2$ nanobelt doped with ~0.45 atom % W. The resistance steadily decreases as a function of temperature exhibiting classical activated transport across a band gap and finally switches over to being metallic at a $T_c$ of ~43.1° C. that is consistent with the DSC value for the phase transition temperature. A pronounced hysteresis is noted for this nanobelt and the metallic phase is supercooled down to a temperature of 8.8° C., at which point the semiconducting phase with activated transport across a band gap is finally restored. Notably, the change in resistivity is relatively more discontinuous for the metal→insulator phase transition, which is characterized by two abrupt increases in resistance. Such jumps may point to the distortion of the rutile metallic phase to first form the intermediate M2 phase wherein alternating V—V chains exist that are dimerized but not tilted from the rutile c axis or tilted but not dimerized. Since the single-nanowire electrical transport measurements have been acquired for nanowires resting on substrates, substantial surface-induced stresses are likely, which can also contribute to the large pronounced hysteresis. Within experimental error, individual nanobelts from the 0.57 and 0.90 atom % doped samples also exhibit phase transitions at $T_c$ values comparable to that observed by DSC. It is worth noting that since the ICP-MS measurements to quantitate the extent of W doping are performed on bulk samples, the actual tungsten content in individual nanobelts may be somewhat different. Nevertheless, the electrical transport measurements bear out the distinctive features of the metal→insulator phase transition noted above: the pronounced hystereses, the dramatically uncorrelated doping dependences of the metal→insulator and insulator→insulator phase transition temperatures, and the significantly greater impact of doping on the nanobelts as compared to previous reports for thin films and single crystals.

To understand the distinctive phase diagram and the unique behaviour that appears to result from scaling to finite size, it is worthwhile to review some current ideas of the role of substitutional doping in depressing the phase transition temperature. Tang et al. have attributed the depression of the phase transition temperature to destabilization of the monoclinic phase with concomitant disruption of the characteristic $V^{4+}$—$V^{4+}$ dimers. As verified by the W $L_{III}$ XAFS experiments, W is doped substitutionally and forms $W^{6+}$—$V^{3+}$ and $V^{4+}$—$V^{3+}$ pairs. Two such pairs are formed for each doped W atom to maintain charge neutrality. Destabilization of the monoclinic phase lowers the energy barrier for transition to the tetragonal tungsten-doped rutile structure, which does not have dimeric $V^{4+}$—$V^{4+}$ pairs. Apart from disrupting the homopolar $V^{4+}$—$V^{4+}$ bond, doping with $W^{6+}$ and the concomitant donation of two electrons to $VO_2$ host changes the carrier density. It has been established in various systems that the Mott transition depends on the ratio of the bandwidth to the intra-atomic Coulomb interaction. Doping with $W^{6+}$ adds two electrons to the conduction band and shifts the system away from localization.

From a thermodynamic perspective, an expression correlating the depression in the phase transition temperature ($\delta T_c$) to the difference in the solution enthalpies of the monoclinic and rutile phases ($\Delta H_{solution}$) and the internal enthalpies of the pure phases ($\Delta H_0$) is shown:

$$\partial T_C = T_{c,0} \frac{n \Delta H_{solution}}{\Delta H_0}$$

where n is the number of substituted sites. The caveat here is the neglect of electron-electron correlations that could well provide a significant driving force for the metal→insulator transition.

Figure 8:
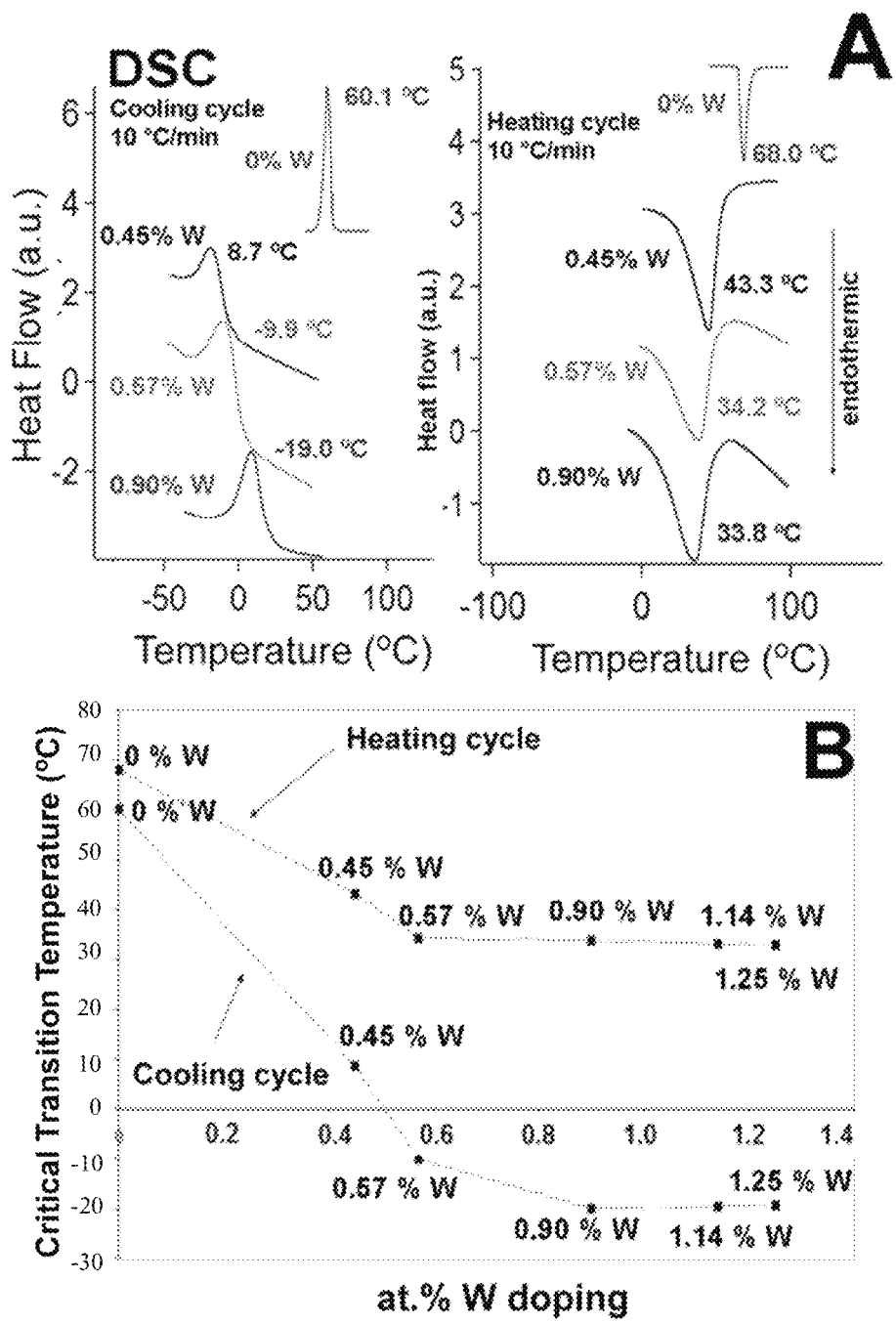
FIG. 8. DSC traces for $W_xV_{1-x}O_2$ nanobelts upon A) heating and B) cooling, respectively. C) Relationship between phase transition temperature of the as-prepared samples and W substitutional dopant concentration in $W_xV_{1-x}O_2$ nanobelts.

The distinctive composition dependence of the $W_xV_{1-x}O_2$ phase diagram upon scaling to finite size can be rationalized on the basis of the specific sites occupied by the substitutional tungsten dopant. FIG. 8C shows a linear regime wherein $T_c$ dramatically decreases with increasing W doping followed by a relatively flat region wherein additional W is incorporated within the nanobelts but has scarce little influence on the phase transition behavior. A plausible reason for this is that the additional W dopants are accommodated at subsurface and surface sites wherein they have less of an influence on inducing the structural phase transformation.

The supercooling of the metallic phase and indeed the very distinctive effects of the combination of finite size and tungsten doping on the metal→insulator and insulator→metal phase transitions are a particularly noteworthy feature of this system. Doping with tungsten seems to dramatically amplify this effect and the differences between the metal→insulator and insulator→metal transitions by providing additional stabilization to the metallic phase. The origin of the pronounced hysteresis and the distinctive difference between the two transitions is likely explained by the percolative nature of the first-order phase transition. For the insulating phase, when sufficient carrier density has been reached (by thermal activation of carriers across the insulating bandgap or via optical pumping), a metallic charge puddle is nucleated, which subsequently coalesces with other metallic puddles until a percolative path is established and the system switches to the metallic phase. The reverse of this process happens upon cooling and insulating puddles gradually grow till the percolative pathway is lost. Recent pair distribution function analyses support the idea of the coexistence of metallic and insulating phases and have not found any evidence for an intermediate M2 phase for bulk $VO_2$ crystallites but nevertheless given the doping-induced tensile strain noted here, domains of the insulating M2 phase may indeed be stabilized within the nanostructures. It is likely that for bulk $VO_2$ and $VO_2$ thin films that the metallic domains are nucleated at defect sites such as oxygen vacancies or grain boundaries. Individual single-crystalline nanowires and nanobelts such as formed after reaction for 72 hours exhibit a high degree of perfection as also evidenced the limited number of domains supported within an individual nanobelt. From the DSC and electrical transport studies, nucleating metallic (rutile) domains within the insulating (monoclinic) matrix appears to be easier than the nucleation of the expanded monoclinic phase within the compact rutile lattice. It is likely that upon nucleation of an initial metallic domain, diffusion of carriers from this domain allows the metallic puddle to expand; avalanche type processes may perhaps be invoked wherein insulating regions are influenced by adjacent metallic nuclei and consequently undergo a more facile phase transition. Indeed, several first-order phase transitions such as Martensitic phase transformations in alloys or field-induced transitions in ferromagnetic systems often proceed through processes that have such a cooperative avalanche-type component. This allows the insulator→metal transition to take place more readily than the nucleation, growth and coalescence of insulating domains within a metallic matrix. In other words, the avalanche or inductive effects of adjacent metallic domains can substantially hinder the growth of the insulating phase even within individual nanobelts, enabling supercooling of the metallic phase and the disruption of percolation only at much lower temperatures when the carrier density has been significantly reduced. For the $W_xV_{1-x}O_2$ nanobelts, the locally tetragonal nuclei and the enhanced local carrier density available upon tungsten doping (as evidenced in the W $L_{III}$) measurements facilitate transformation to the metallic phase at lower temperatures; these quasi-metallic delocalized domains then strongly inhibit the formation of the insulating phase and thus severely depress the metal→insulator phase transition below room temperature.

The greater impact of doping on nanostructures as compared to thin films and single crystals can also be rationalized by the inductive effect of the induced metallic domains. A smaller metallic domain embedded within a 1D nanobelt will exert a much stronger influence on the phase transition as compared to an analogous domain within a single-crystal that needs to propagate in three dimensions. In other words, the energetic barriers for domain growth and reaching the percolation threshold are strongly modified by reducing the dimensionality of the system. Given the subtle structural modifications, such as the lattice expansion evidenced in the XRD patterns and the inevitable role of curvature and sidewall facets, the solution enthalpies for W may also be different for rutile and monoclinic nanostructures as compared to the bulk. Alternatively, nanowires are distinctive from thin films and bulk samples in that there are only able to support a single domain along the confined direction. Consequently, rutile (metallic) and monoclinic M1 and intermediate M2 (both insulating) domains can co-exist to minimize elastic energy in various regions of the single nanowire. This can enable the metallic phase to be stabilized at temperatures far lower than $T_c$, accounting for the supercooling of the metallic phase. Such a situation is especially probable for the single nanowires on substrates measured electrically (FIG. 9), wherein surface-induced stresses can further enable stabilization of the intermediate M2 phase formed by dilatation of the V—V dimers of the M1 phase. A more detailed understanding of the correlation between the geometric and electronic structure is required, but will likely have to await the refinement of dynamical mean free theory calculations.

A facile solution-based hydrothermal approach for the synthesis of single-crystalline faceted $W_xV_{1-x}O_2$ nanobelts based on the reduction of $V_2O_5$ by small-molecule aliphatic alcohols and carboxylic acids in the presence of $H_2WO_4$ is reported. Tungsten is observed to be substitutionally doped onto the vanadium sublattice of the $VO_2$ nanostructures as $W^{6+}$, thereby disrupting the homopolar $V^{4+}$—$V^{4+}$ dimers characteristic of the M1 monoclinic polymorph. Doping tungsten into nanobelts dramatically alters the phase diagram of the $VO_2$ nanostructures. A pronounced depression is observed for both metal→insulator and insulator→metal transitions but remarkably the two transitions are affected to different extents with phase transition temperature values for the former being depressed to as low as −20° C., whereas for the latter the corresponding depression is only down to 30° C. The dramatic modifications to phase diagram are manifested both in differential scanning calorimetry curves and single-nanobelt electrical transport measurements. The pronounced hysteresis and supercooling of the metallic phase is likely a result of the decreased stabilization of the monoclinic phase and increased carrier density in the conduction band upon tungsten doping. The substitutional tungsten dopant can serve to locally nucleate metallic domains that have an inductive effect on adjacent insulating regions facilitating the percolative insulator-metal transition. The same inductive effect of metallic domains is also responsible for strongly inhibiting the growth and coalescence of insulating domains, thereby severely depressing the metal→insulator transition. The practical implication of the work in this example for applications such as thermochromic coatings is that the phase transition can be dramatically tuned at very low dopant concentrations upon scaling to finite size. The altered phase stabilities noted upon reducing the dimensionality of $W_xV_{1-x}O_2$ further points to the new physics awaiting discovery when domain growth and propagation within strongly correlated materials are impacted by finite size.

Example 3

This example provides colossal above-room-temperature metal-insulator switching of a Wadsley-type tunnel bronze.

In this example it was demonstrated that the manifestation of enormous metal-insulator switching ranging up to almost six orders of magnitude in individual nanowires of $\beta'$-$Cu_xV_2O_5$. The magnitude and temperature of the phase transition is in strong contrast to data reported over several decades for other Wadsley-type mixed valence tunnel bronze structures.

Figure 10:
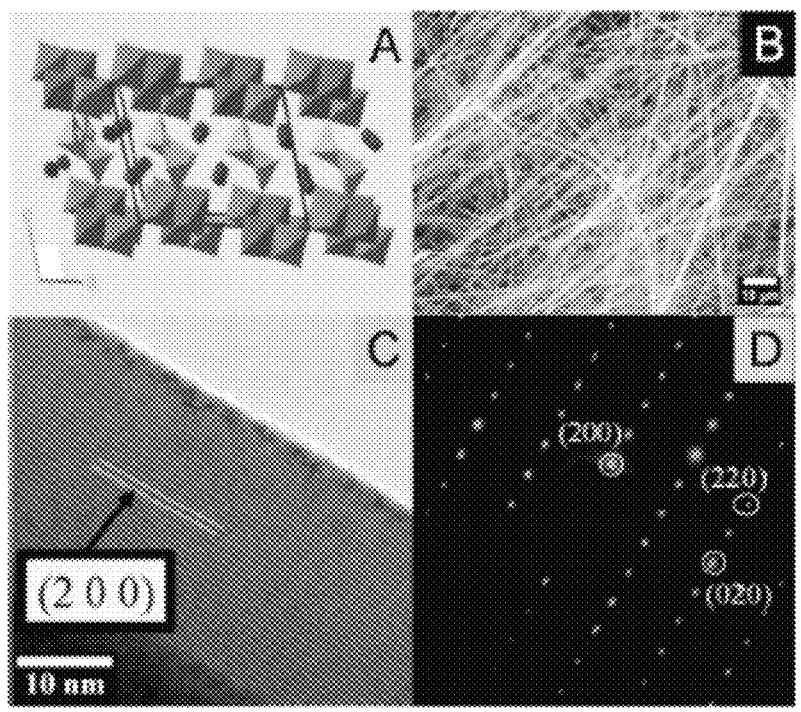
FIG. 10. A) Crystal structure of $β'$-$Cu_xV_2O_5$; B) low-magnification SEM image of high-aspect ratio $β'$-$Cu_xV_2O_5$ nanowires; C) lattice-resolved image showing the single-crystalline nature of the nanowires, and D) selected area electron diffraction pattern of the (C) region showing the growth direction along the b-axis.

FIG. 10A depicts structure of the monoclinic phase of $\beta'$-$Cu_xV_2O_5$, which crystallizes in the monoclinic C2/m space group with three crystallographically inequivalent vanadium sites (a=15.201 Å; b=3.672 Å; c=10.093 Å; $\beta$=106.31°). The vanadium-centered polyhedra enclose tunnel-like interstitial sites that can accommodate varying concentrations of cations. Carrier transport is precluded across the open spaces of the tunnels and is exclusively confined to conduction pathways along the length of the tunnels (along the crystallographic b axis), imposing a highly anisotropic quasi-1D behavior. It is now widely accepted that cations occupying tunnel sites are ionized with concomitant reduction of framework vanadium ions enabling retention of charge neutrality. Such a situation gives rise to interesting motifs of charge ordering/delocalization in various $\beta$ and $\beta'$ bronzes.

In this invention the synthesis of nanowires of $\beta'$-$Cu_xV_2O_5$ with x~0.65 based on the hydrothermal reduction of a $CuV_2O_6$ precursor prepared by fused quartz tube synthesis was reported. Briefly, small molecule alcohols are used to intercalate, exfoliate, and reduce the solid-state $CuV_2O_6$ precursor, yielding well-defined faceted nanowires of $Cu_xV_2O_5$ in high yield, as shown in FIG. 10b. The use of 2-propanol as the reducing/exfoliating structure-directing agent provides nanowires with average width centered at ~180 nm.

Single-nanowire electrical measurements of the nanowires were performed by dispersing 2-propanol dispersions of the nanowires onto a $Si/SiO_2$ substrate, followed by standard photolithography and metallization.

Figure 11:
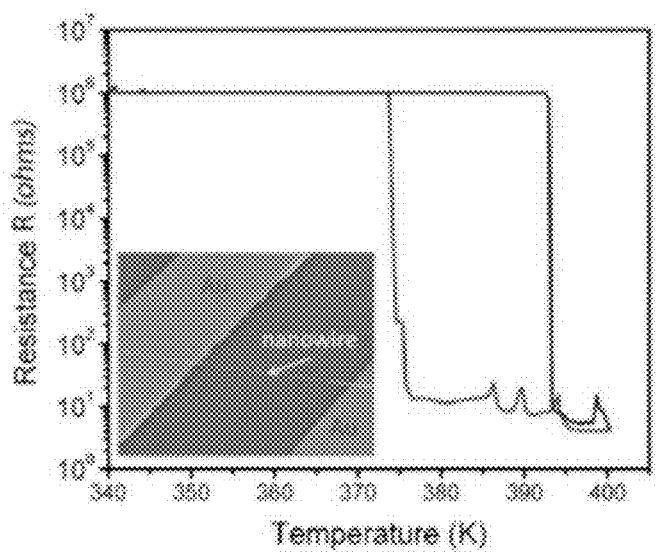
FIG. 11. Single-wire electrical transport measurement of resistance versus temperature showing a large discontinuous jump in R and transition to a metallic state near 380 K. Magnified SEM image in the inset shows a typical single-nanowire device.

FIG. 11 shows crisp and pronounced metal→insulator transitions spanning up to almost six orders of magnitude for individual nanowires of $\beta'$-$Cu_xV_2O_5$. The magnitude of the phase transitions far surpass the one-two orders of magnitude phase transitions observed thus far for any known Wadsley- or tunnel-type bronze. The metal→insulator transition temperatures for most vanadium bronzes observed thus far are substantially below 220 K.

The metal→insulator transitions depicted in FIG. 11 is clearly hysteretic with appreciable supercooling of the metallic phase suggesting a first-order transition, likely proceeding through a percolative mechanism. The activation energies of the transition for the $\beta$-$Cu_xV_2O_5$ nanowires range from 32-45 meV, analogous to the 46 meV value observed for bulk $Na_{0.33}V_2O_5$. The pronounced transition observed in FIG. 11 brings us to some key issues. The observed transitions seen for $\beta$-$Cu_xV_2O_5$ are reflective of intrinsic electronic instabilities in the material manifested in single-crystalline nanowires as measurements approach single domain limits.

The obliteration of the metal→insulator phase transition in macroscopic crystals of $\beta$-$Cu_xV_2O_5$ observed thus far is likely a result of local departures from perfect stoichiometry in this incredibly sensitive material along the lines of the discrepancies observed for $\beta$-$Na_{0.33}V_2O_5$ samples where decreasing Na content to 0.30 sodium cations per $V_2O_5$ unit engenders a complete disappearance of the metal→insulator transition. Even for the specific $\beta$-$Cu_xV_2O_5$ system, decrease of the Cu cation occupancy triggers a collapse of the superconducting phase even for minor variations of stoichiometry. Variations in stoichiometry of tunnel cations not only alter the charge distribution on the vanadium oxide framework but also introduce random potentials that can severely degrade the metallic behavior of these quasi-1D systems. To understand the variations in the magnitude of the metal→insulator transitions, the peculiarities in their electronic structure using scanning transmission X-ray microscopy experiments were evaluated.

Interestingly, the relative ratios of $t_{2g}^*$ and $e_g^*$ features at the O K-edge, corresponding to $\pi^*$ and $\sigma^*$ interactions between vanadium and coordinating oxide ligands, show some degree of variability between the different nanowires. The $\pi^*/\sigma^*$ ratio evolves from 1.17 to 1.32. The precise ratio of intensities observed in the transmission experiment is likely related to Cu cation stoichiometry. Removal of $Cu^+$ ions will likely result in stronger O 2p-V 3d hybridization reflected in a greater intensity of the $\sigma^*$ feature. Ramanathan and co-workers have systematically correlated $\pi^*/\sigma^*$ ratios to the strength of the metal→insulator transition in $VO_2$. These authors suggest that a high $\pi^*$ intensity implies stronger V—V interactions, which will be imperative for charge transport along the quasi-1D tunnel structures of $\beta$-$Cu_xV_2O_5$.

To address the high critical transition temperature observed for the nanowires, again it is possible that this is a manifestation of the intrinsic properties of the material upon elimination of significant defect densities. Alternatively, it is interesting to consider the electronic phase diagrams reported for analogous Wadsley phases. For $\beta$-$Na_{0.33}V_2O_5$ and $\beta$-$Ag_{0.33}V_2O_5$, the phase boundary of the charge-ordered insulating phase and the normal metallic phase exhibits an unusual concave shape as a function of pressure. One feasible explanation then is that tensile stresses, commonly seen in nanowires as a result of intrinsic geometric confinement or substrate interactions, lead to a pronounced increase in the critical transition temperature based on a simple extrapolation of the phase boundaries.

The observation of massive metal→insulator transitions ranging up to six orders of magnitude in individual nanowires of $\beta'$-$Cu_{0.65}V_2O_5$ marks a dramatic advance in studies of tunnel bronzes and provides a glimpse of the possible electronic and magnetic peculiarities awaiting discovery if truly single domains of these remarkable mixed valence systems can be interrogated. The above-room-temperature metal-insulator switching evidenced in the nanowires surpasses that of better established binary vanadium oxides and paves the way for applications ranging from Mott field-effect transistors to thermal switches.

Example 4

This example provides a VO-seeded approach for the growth of star-shaped $VO_2$ and $V_2O_5$ nanocrystals. It provides synthesis, structural characterization, and electron structure data.

Obtaining shape and size control of strongly correlated materials is imperative to obtain a fundamental understanding of the influence of finite size and surface restructuring on electronic instabilities in the proximity of the Fermi level. In this invention a novel synthetic approach that takes advantage of the intrinsic octahedral symmetry of rock-salt-structured VO to facilitate the growth of six-armed nanocrystallites of related, technologically important binary vanadium oxides $VO_2$ and $V_2O_5$ is presented. The prepared nanostructures exhibit clear six-fold symmetry and most notably show remarkable retention of electronic structure.

The latter has been evidenced through extensive X-ray absorption spectroscopy measurements.

VO$_2$ Nanostars. Hydrothermal Synthesis:

Nanostructured VO$_2$ nanostars were synthesized by a solution-based approach using bulk VO$_2$ and bulk VO as the precursors. Small molecule alcohols and ketones were used as structure-directing agents and were purchased from Fisher Scientific. Deionized water from a Barnstead International NANOpure Diamond ultrapure water system ($\rho$=18.2 M$\Omega$/cm) was used to prepare all aqueous solutions. Bulk VO$_2$ (260 mg) was placed within a teflon-lined stainless steel autoclave with a capacity of 23 mL and dispersed with 15 mL of deionized water and 1 mL of methanol. Subsequently, an appropriate amount of bulk VO (ranging from 80-260 mg) was added to the mixture to seed the growth of star-shaped nanostructures. The autoclave was then sealed and maintained at 210° C. under hydrothermal conditions for 72 hours. The resulting dark blue precipitates were collected and washed with distilled water and acetone, and then dried at 80° C. for 10 hours. To investigate the effect of reaction conditions upon the morphology and properties of the final products, the reaction temperature, duration of reaction, and concentration of the VO seed used were varied.

V$_2$O$_5$ Nanostars.

Vanadium oxide films were fabricated on a Si/SiO$_2$ (300 nm) substrate coated with a 100 nm Fe layer. The Fe metal catalyst film was evaporated onto the Si/SiO$_2$ wafer using an electron-beam evaporator at a pressure of ~5×10$^{-6}$ Torr. The Fe-coated substrate was then placed inside a chemical vapor deposition (CVD) reactor at temperatures ranging from 600-700° C. and pressures <1×10$^{-3}$ torr. A ceramic boat containing bulk VO powder (Cerac, >99%) was placed at the center of a 1" quartz tube and was transported under a mixture of Ar/air at flow rates ranging from 47-200 sccm. A flow control system (Matheson TriGas) was used to precisely control the mixing of the two gases. The temperature inside the furnace was subsequently increased to 900° C. to evaporate the VO powder that was placed in the ceramic boat. The Fe-coated chips recovered after 3-5 hour reactions showed the formation of a granular faceted V$_2$O$_5$ structure that was then treated hydrothermally in the presence of small-molecule aliphatic alcohols. Specifically, the Fe-coated chip was placed in a teflon-lined stainless steel autoclave with a capacity of 23 mL along with 5 mL of deionized water and 300 μL of methanol as the structure-directing agent. The autoclave was then sealed and maintained at 210° C. under hydrothermal conditions for 72 hours.

Characterization. Phase identification and evaluation of the crystallinity of the as-prepared samples were performed by X-ray diffraction using a Siemens D-500 X-ray diffractometer at a scanning rate of 0.04 degree per second in the 2θ range between 10 and 90° using graphite-monochromated CuK$_\alpha$ radiation ($\lambda$=1.5418 Å).

The morphologies of the nanostructures were analyzed by scanning electron microscopy (SEM, JEOL JSM-5610LV and Hitachi SU-70 operated at 20 kV and equipped with an energy dispersive X-ray analysis detector), high-resolution transmission electron microscopy (HRTEM, JEOL 2010 operated at an accelerating voltage of 200 kV), and selected-area electron diffraction (SAED). Copper grids (300 mesh) coated with an amorphous carbon film were used for the TEM measurements. Samples were prepared by placing 2-propanol dispersions of the nanostars on the grids and allowing them to dry under ambient conditions.

The metal→insulator phase transitions for the as-prepared VO$_2$ nanostars was analyzed using differential scanning calorimetry (DSC Q200, TA Instruments) under a flowing high-purity N$_2$ atmosphere in the temperature range between 10-150° C.

The electrical properties of the VO$_2$ nanostars were examined using a homebuilt transport measurement setup based on a Keithley 6517A electrometer/high-resistance meter and a Keithley 220 current supply unit. Four-point probe resistivity measurements were acquired for pressed pellets of the samples using patterned silver contacts.

The electronic structure of the VO$_2$ and V$_2$O$_5$ nanostars was analyzed by X-ray absorption spectroscopy performed at the V L-edge, V K-edge, and the O K-edge at National Institute of Standards and Technology (NIST) beamlines U7A and X23A2 of the National Synchrotron Light Source of Brookhaven National Laboratory. For near-edge X-ray absorption fine structure (NEXAFS) spectroscopy experiments at the V L-edge and O K-edge, a toroidal mirror spherical grating monochromator was used with a 1200 lines/mm grating with a nominal energy resolution of 0.1 eV. The spectra were acquired in partial electron yield mode using a channeltron electron multiplier located near the sample with the detector at an entrance grid bias of −200 V to enhance surface sensitivity. A charge compensation gun was used to avoid sample charging. A vanadium mesh was used as a reference standard for calibration of the energy scale for all spectra. To eliminate the effects of incident beam intensity fluctuations and monochromator absorption features, the partial electron yield signals were normalized using the drain current of a freshly evaporated gold mesh with 90% transmittance located along the path of the incident X-rays. The soft X-ray data presented here have been acquired at magic angle (θ=54.7° C.) incidence of the X-ray beam to preclude observation of effects due to preferential alignment within the samples. Pre- and post edge normalization of the data were performed using the Athena suite of programs.

For transmission XANES experiments at the V K-edge, a Si (311) channel-cut monochromator was used to select the X-ray energy. Higher harmonic oscillations were eliminated by a pair of grazing-incidence mirrors. All XANES spectra at the V K-edge were collected at room temperature in transmission mode for powder samples mixed with non-absorbing BN powder and mounted between two layers of kapton tape. To achieve approximately 15% absorption, the transmission chamber was filled with 100% N$_2$, whereas the ionization chamber was filled with a 60:40 mixture of N$_2$ and He. Data were recorded at an energy resolution of 0.03 k in the near-edge region. The obtained spectra were processed using the Athena and Arthemis suite of software tools. The XANES and NEXAFS data for the nanostructures were compared to data acquired for bulk binary vanadium oxide standards (VO 99.5% pure CERAC, VO$_2$ 99.5% pure CERAC, V$_2$O$_3$ 99.99% Sigma Aldrich, and V$_2$O$_5$ 99.6% Sigma Aldrich).

Despite the abundant bounty of crystal structures available for binary vanadium oxides, relatively few of the structures belong to high-symmetry space groups. A notable exception is vanadium (II) oxide VO that crystallizes in the cubic rock salt structure and exhibits octahedral symmetry (lithiated ω-Li$_x$V$_2$O$_5$ also adopts a defective rock-salt structure). The intrinsic symmetry of VO is further more closely related to that of tetragonal VO$_2$ (the high-temperature metallic polymorph) than to the dimerized monoclinic insulating phase of VO$_2$. Consequently, the goal has been not only to use the intrinsic octahedral symmetry of VO to template the growth of star-shaped nanostructures but to also nudge the system to stabilize the tetragonal rutile phase of $VO_2$ over other metastable $VO_2$ phases ($VO_2$(A) and $VO_2$(B)) that are frequently the kinetically trapped products obtained under solvothermal conditions. The low-temperature insulating phase of $VO_2$ is characterized by dimerized V—V clusters that are almost molecular in nature, with short and long V—V distances of 2.65 and 3.12 Å, respectively; there is considerable twisting of the V—V pairs away from the crystallographic c axis to define a zigzag chain of $VO_6$ octahedra. Heating this polymorph across the characteristic insulator-metal phase transition results in stabilization of the high-temperature rutile polymorph with collinear chains of $VO_6$ polyhedra along the a axis. The structural phase transition is also accompanied by halving of the unit cell size with a unique V—V distance of ~2.85 Å replacing the alternating short and long V—V dimers.

In contrast, $V_2O_5$ crystallizes in a simple orthorhombic structure comprising layers of [$VO_5$] square pyramids sharing edges and corners. The layers themselves are weakly electrostatically bound along the c-axis and the spacing between the layers provides sites for the facile intercalation of Li-ions amongst other species.

As noted above VO is used with the expectation that the intrinsic octahedral symmetry of this structure will allow the stabilization of star-shaped nanostructures. Two novel synthetic approaches have been developed to prepare $VO_2$ and $V_2O_5$ nanostars. The first approach is based on the hydrothermal reaction and recrystallization of bulk VO and $V_2O_4$ likely through exfoliation, dissolution, and recrystallization of hydrated layered intermediates and yields monoclinic $VO_2$ nanostars. The second approach comprises the catalytic vapor transport of bulk VO, followed by the hydrothermal treatment of the resulting polycrystalline $V_2O_5$ film to form $V_2O_5$ nanostars.

The SEM images presented in FIGS. 12A-F illustrate the morphological features of nanostructures synthesized by the hydrothermal treatment of bulk $V_2O_4$ and methanol with different amounts of the VO seed template after reaction for 72 hours. It is observed that the as-synthesized six-armed nanostars are geometrically uniform and range in size from 50 to 500 nm in terms of their end-to-end dimensions. The cross-section thickness and lateral width of the individual arms are <100 nm justifying the nanostar moniker. Clearly, the molar ratio of the added VO seed strongly influences the monodispersity and morphology of the obtained products. Nanostars with six arms endowed with six-fold rotation axes are observed for VO ratios as low as 23% (expressed as a function of total added vanadium content), and represent a vast preponderance of the synthesized nanostructures up to VO loadings of 37%. Further, increasing the ratio of VO precursors results in the formation of poorly defined amorphous nanostructured powders.

Figure 25:
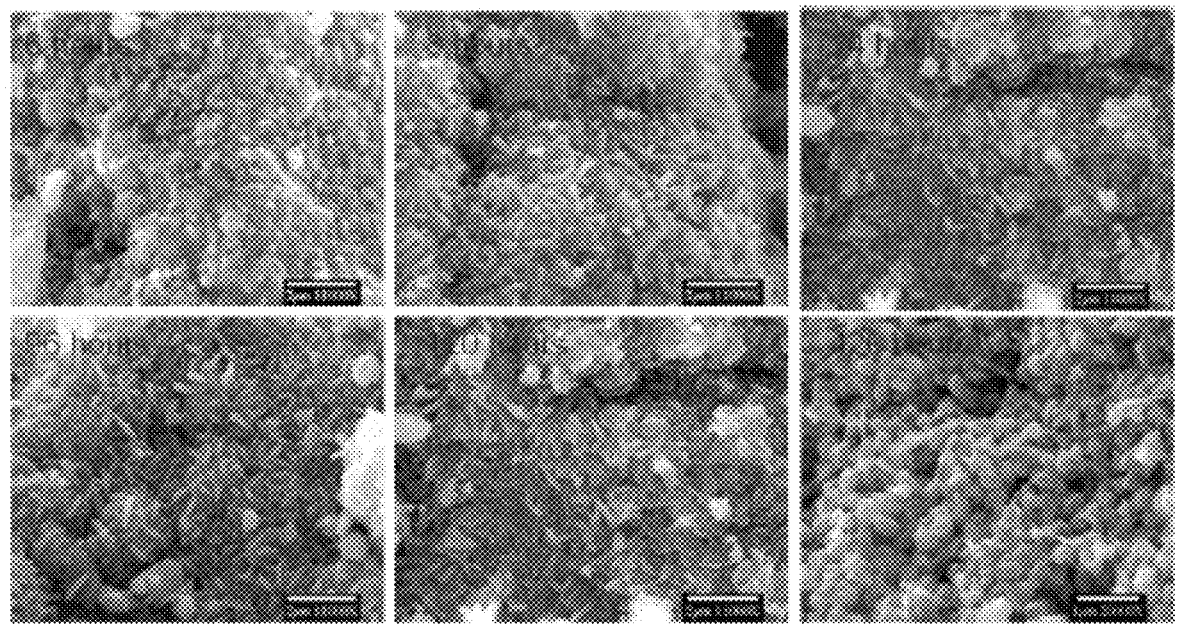
FIG. 25. Scanning electron micrographs of $VO_2$ nanostars prepared by hydrothermal treatment of bulk $VO_2$ and VO using methanol as a structure-directing agent at different reaction times. A distinct alteration of the morphology is observed with increasing reaction time with degradation of the intricate six-fold symmetry of the nanostructures; remnant "arms" of the nanostars are detected within a matrix of poorly defined $VO_x$ nano structures.

The reaction temperature and duration have also been screened. Notably, star-shaped structures are far sparser after solvothermal reaction of the same precursor ratios at 180 and 250° C. At lower temperatures, a metastable $VO_2$(B) phase is stabilized. Further extending the reaction time as presented in FIG. 25 results in degradation of the intricate six-fold symmetry of the nanostructures and remnant "arms" of the nanostars are detected within a matrix of poorly defined $VO_x$, nanostructures.

Figure 12:
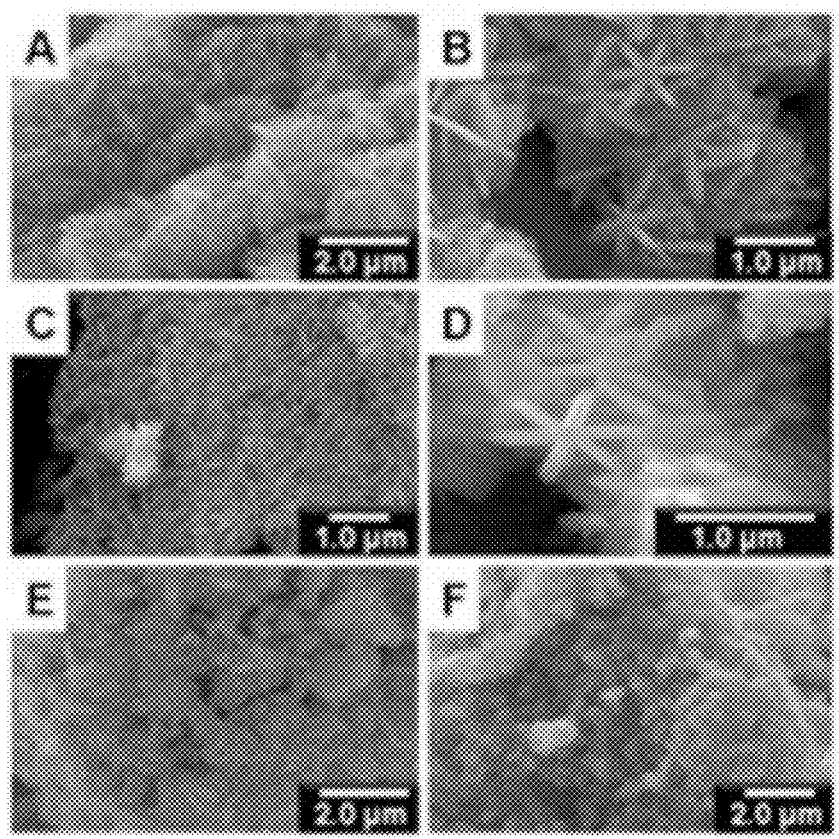
FIG. 12. Scanning electron micrographs of $VO_2$ nanostars prepared by the hydrothermal treatment of bulk VO and $V_2O_4$ A,B) low and high magnification images of samples prepared using a 23% VO:77% $V_2O_4$ precursor ratio; C,D) low and high magnification images of samples prepared using a 37% VO:65% $V_2O_4$ precursor ratio; E) SEM image of samples prepared using a 43% VO:57% $V_2O_4$ precursor ratio; F) SEM image of samples prepared using a 50% VO:50% $V_2O_4$ precursor ratio.

FIG. 12 shows $V_2O_5$ nanostars formed by the combined vapor transport/hydrothermal dissolution route from an initial granular and faceted $V_2O_5$ thin film. Individual granules in the deposited polycrystalline $V_2O_5$ layer have pseudocubic morphologies perhaps due to the intrinsic crystal symmetry of the VO precursor. Dissolution of high-energy surface planes likely promotes the stabilization of the octahedral geometries. Indeed, consistent with this broad idea of selective hydrothermal dissolution along specific crystal growth directions, FIG. 13D shows the incomplete separation of the six arms indicating unfinished reshaping of the surface-tethered $V_2O_5$ grains. The lateral width of the individual arms is defined by the extent of dissolution. An alternative scenario may involve coordination of the added structure-directing agents (typically 2-propanol or methanol) to specific facets, which are passivated and protected from hydrothermal dissolution.

Figure 14:
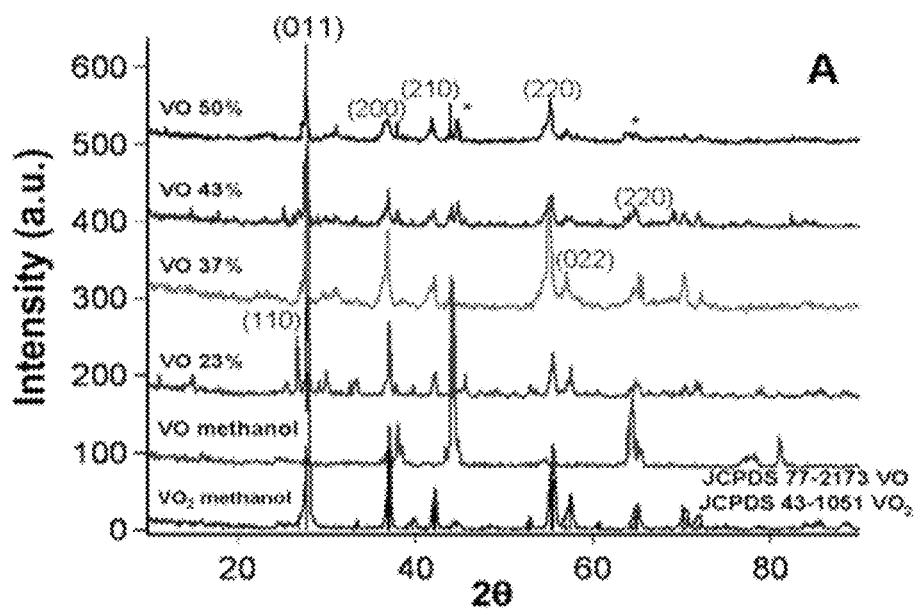
FIG. 14. XRD patterns for $VO_2$ and $V_2O_5$ stars. A) Diffraction patterns obtained for samples prepared using varying VO precursor ratios. B) XRD patterns of the precursor $V_2O_5$ film and the $V_2O_5$ nanostars obtained by hydrothermal treatment of the $V_2O_5$ films.
Figure 14:
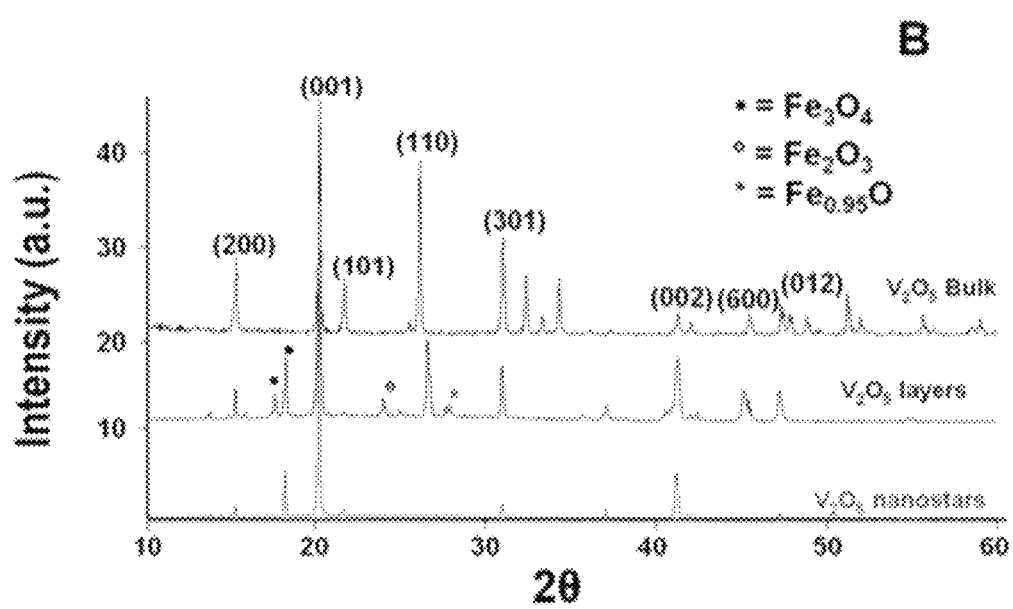

Definitive phase identification of the structures is obtained from XRD measurements. FIG. 14A depicts the corresponding XRD patterns of the $VO_2$ samples synthesized with different VO precursor ratios presented in FIG. 12. As corroborated by the SEM images, the sample prepared with 37% VO appears to be the most phase pure and all the observed reflections can be indexed to monoclinic $VO_2$ (Joint Committee of Powder Diffraction Standards (JCPDS) 43-1051)). The strong intensity of the (011) reflection denotes the preferential growth direction of the stars. The diffraction peaks are shifted to higher d-spacings likely as a result of tensile strain originating from scaling to finite size. Similar size-dependent lattice expansion has also been observed (in fact to a greater extent) for $VO_2$ nanobelts synthesized by an analogous synthetic procedure.

In contrast, below a concentration of 37% VO, a mixture of a vanadium oxide hydrate $V_3O_7 \cdot H_2O$ (JCPDS 85-2401) and pure monoclinic $VO_2$ is obtained, whereas at higher VO precursor loadings, unreacted VO is found to be remnant in the reaction products after 72 hours. These results suggest that, as is generally true of solvothermal reactions, reaction temperature, precursor ratio, reaction time, and the structure-directing agent must be carefully optimized to enable VO to serve as an efficacious template for the formation of phase-pure monoclinic $VO_2$ nanostars.

Figure 26:
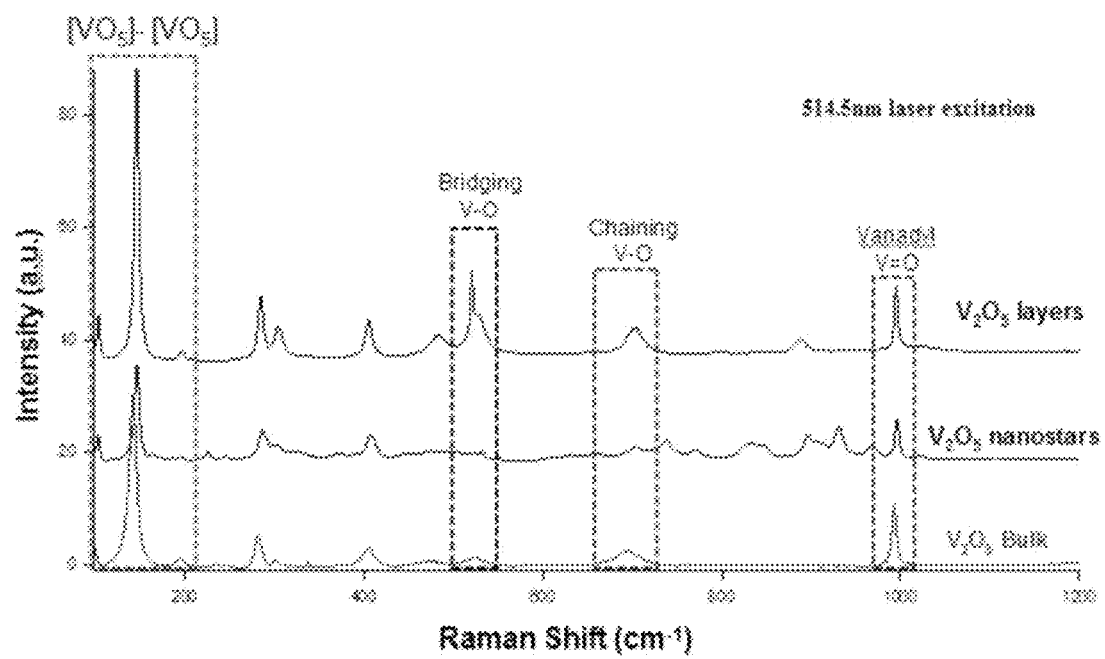
FIG. 26. Raman spectra of the vapor-transported $V_2O_5$ thin films and nanostars obtained by subsequent hydrothermal treatment of the thin films. All major V—O—V and V=O vibrational modes are marked; the peaks not explicitly assigned correspond to $Fe_2O_3$ and other iron oxide species, as also observed by X-ray diffraction.

FIG. 14B shows the XRD patterns obtained for the $V_2O_5$ layers prepared by vapor transport and subsequent hydrothermal treatment to form $V_2O_5$ nanostars. Upon the vapor transport of a VO layer onto a 100 nm Fe thin film, VO is oxidized to a granular densely packed $V_2O_5$ film with pseudocubic grains that perhaps result from the intrinsic symmetry of the precursor, as well as the influence of the metallic substrate. During the oxidation/deposition process, the underlying metal layer is oxidized and reflections that can be attributed to iron oxides of varying stoichiometry (FeO JCPDS 86-2316; $Fe_2O_3$ JCPDS 87-1166; and $Fe_3O_4$ JCPDS 19-0629) are clearly observed. Furthermore, the diffraction pattern for the faceted granular film can be readily indexed to orthorhombic $V_2O_5$ (JCPDS #41-1426). Remarkably, after hydrothermal dissolution, the characteristic (001) reflections of orthorhombic $V_2O_5$ strongly dominate the diffraction pattern suggesting dramatic restructuring and reshaping of the grains and a strong preferred growth direction for the nanostars. The almost exclusive observation of (001) reflections further lends credence to the idea of dissolution of higher energy surface planes with greater reticular density. The orthorhombic structure of the nanostars has further been confirmed by Raman microprobe measurements (FIG. 26) under 514.5 nm laser excitation. The Raman band at 145 cm$^{-1}$ corresponds to external [$VO_5$]-[$VO_5$] modes and indicates the retention of long-range crystalline order in the nanostars. The phonon modes of the antiphase bridging V—O are observed at 528 cm$^1$. The higher frequency modes originating from chaining V—O stretching modes are observed at 703 cm$^{-1}$, whereas strong V=O vanadyl stretching modes are observed at 999 cm$^{-1}$.

Figure 15:
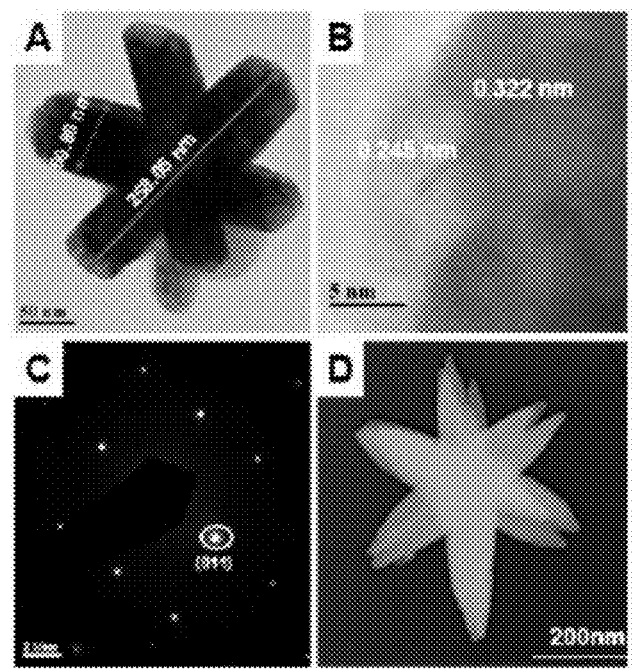
FIG. 15. A) HRTEM image of $VO_2$ nanostars. B) Lattice-resolved HRTEM image of one arm of the star showing the separation between (011) planes. C) SAED pattern acquired for the same star. D) low resolution TEM image of two superimposed $VO_2$ stars.

Further structural studies of the VO$_2$ nanostars have been undertaken using HRTEM and SAED. FIG. 15 shows overview TEM and lattice-resolved HRTEM images and the SAED pattern for an individual VO$_2$ star, which reveals the perfect six-fold symmetry of the stars and indicates that these remarkable nanostructures are grown along the [011] direction. The SAED pattern is uniform along the entire core and spicular regions of the nanostars, indicating that the obtained structures are single-crystalline objects.

The origin of the strong observed preference for octahedral symmetry is not yet clear, although several scenarios can be envisioned including templated growth on VO seeds that have octahedral symmetry arising from their rocksalt structure or the oriented attachment of crystalline arms grown along the [011] direction with the elimination of water at the interfaces. Regardless of whether a VO seed grows along six specific crystalline facets or whether distinctive nanostructures are fused together through aggregative growth mechanisms, preferential crystal growth must be invoked. It is likely that upon hydration, exfoliation, dissolution and recrystallization of tetragonal VO$_2$ (the high temperature phase that yields monoclinic VO$_2$ upon cooling), the ζ-potential of the reaction solution, the intrinsic surface energies of different exposed crystalline facets, and interactions with the structure-directing agent (methanol) all have an influence on the relative growth rates of different crystalline facets. Consequently, despite seeding with VO, phase-pure VO$_2$ nanostars are obtained only within a relatively narrow window of reaction conditions.

Further characterization of the geometric and electronic structure of VO$_2$ and V$_2$O$_5$ nanostars comes from X-ray absorption near-edge structure measurements acquired at the V K-edge, V L-edge, and O K-edge. XANES lineshapes, peak positions, and intensities at metal K and L$_{III,II}$ edges yield valuable information about local electronic structure, the transition metal oxidation state, ligand type, and site symmetry (in conjunction with measurements of standards).

The first absorption feature, within ~5.0 eV of the absorption edge of vanadium metal at 5465.0 eV, is assigned to dipole-disallowed transitions from 1s core states to V 3d levels. This pre-edge absorption feature is prominently absent from the XANES spectrum of rock-salt structured VO with perfectly symmetric VO$_6$ octahedra, further corroborating the high intrinsic symmetry of this phase. However, with the progressive reduction of symmetry in going from VO to VO$_2$ and V$_2$O$_5$, a finite transition probability exists for the 1s→3d transition and a prominent pre-edge absorption feature is discernible in the transmission spectrum due to greater mixing (hybridization) of the 3d and 4p states as well as contributions from quadrupolar transitions.

For binary vanadium oxides and metal vanadates, the peak positions, lineshapes, and intensities of the pre-edge absorption feature strongly depend on the formal vanadium oxidation state, local coordination geometry (extent to which the structure is distorted from the perfectly octahedral symmetry of VO), and the "cage size" defined by the bond lengths between vanadium and the nearest-neighbor ligand atoms.

Figure 16:
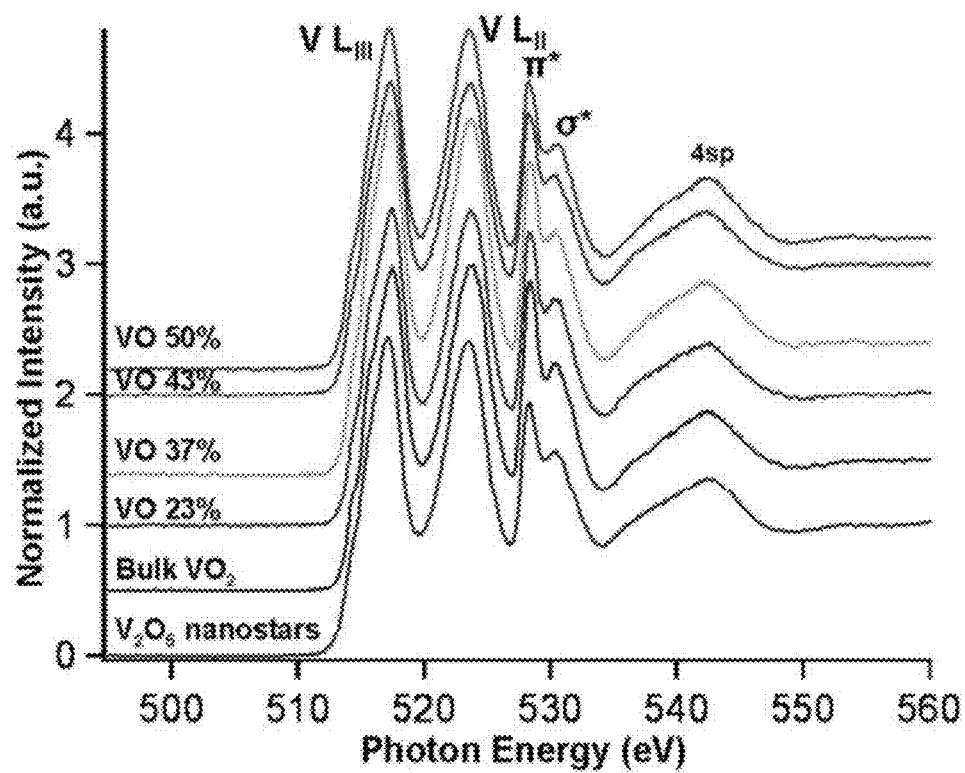
FIG. 16. NEXAFS data acquired at the V L edge ($2p_{3/2}$, $2p_{1/2}$) and O K edge ($π^*$, $σ^*$) for the as-synthesized $VO_2$ and $V_2O_5$ nanostars.

In contrast to V K-edge measurements that provide insight into energy band dispersion arising from solid-state effects by probing the more delocalized levels that are derived from metal p orbitals, V L-edge (and indirectly O K-edge) measurements primarily probe V 3d states that are more atomic (localized) in character. NEXAFS data acquired at the V L- and O K-edges serve as a sensitive probe of the unoccupied density of states above the Fermi level. FIG. 16 shows NEXAFS data acquired at the V L- and O K-edges for the as-synthesized VO$_2$ and V$_2$O$_5$ nanostars. The two broad resonances centered at ~517 and 524 eV correspond to V2p$_{3/2}$→V3d and V2p$_{1/2}$→V3d, respectively. The O K-edge resonance, corresponding to transitions from O 1s core levels to 2p states are split into π* and σ* components due to strong hybridization of the O 2p states with V 3d states. The strength of these features further underscores the importance of covalent bonding in binary vanadium oxides. The electronic structure of VO$_2$, the V 3d orbitals with t$_{2g}$ symmetry, d$_z^2$ and d$_{x^2-y^2}$, are pointed towards the ligand giving rise to σ and σ* "molecular" states. Transitions from O 1s to the latter states of σ* symmetry are evidenced in the O K-edge NEXAFS spectrum as the higher-energy component. In contrast, the d$_{xz}$ and d$_{yz}$ are oriented to undergo (weaker) sideways π interactions with the oxide ligands. Transitions to π* bands lying just above the Fermi level constitute the low-energy component of the NEXAFS spectrum at the O K-edge. Finally, the nonbonding orbital d$_{xy}$ orbital gives rise to a d∥ band for tetragonal VO$_2$, which splits into bonding and non-bonding levels upon the molecular dimerization of adjacent pairs of vanadium atoms upon undergoing the phase transition to the low-symmetry monoclinic insulating phase. The transition to the d∥ component is evidenced as a high-energy shoulder to the π* band. At higher energies, a broader feature is observed that can be ascribed to transitions from O 1s core levels to O 2p states hybridized with V 4sp levels. Based on the peak positions and retention of crystal field splitting between the π* and σ* states as well as the constancy of the V L$_{III}$ and V L$_{II}$ splitting, it is clear that the essential electronic structure of monoclinic VO$_2$ and V$_2$O$_5$ has been retained for the nanostars. Notably, as with most strongly correlated electronic systems, the orbital, lattice, and spin degrees of freedom in VO$_2$ are closely related, which gives rise to the incredible sensitivity of the metal→insulator phase transition to external stimuli. On the flip side, the electronic structure thus exhibits strong sensitivity to the precise stoichiometry, strain, and incorporation of point defects.

Figure 17:
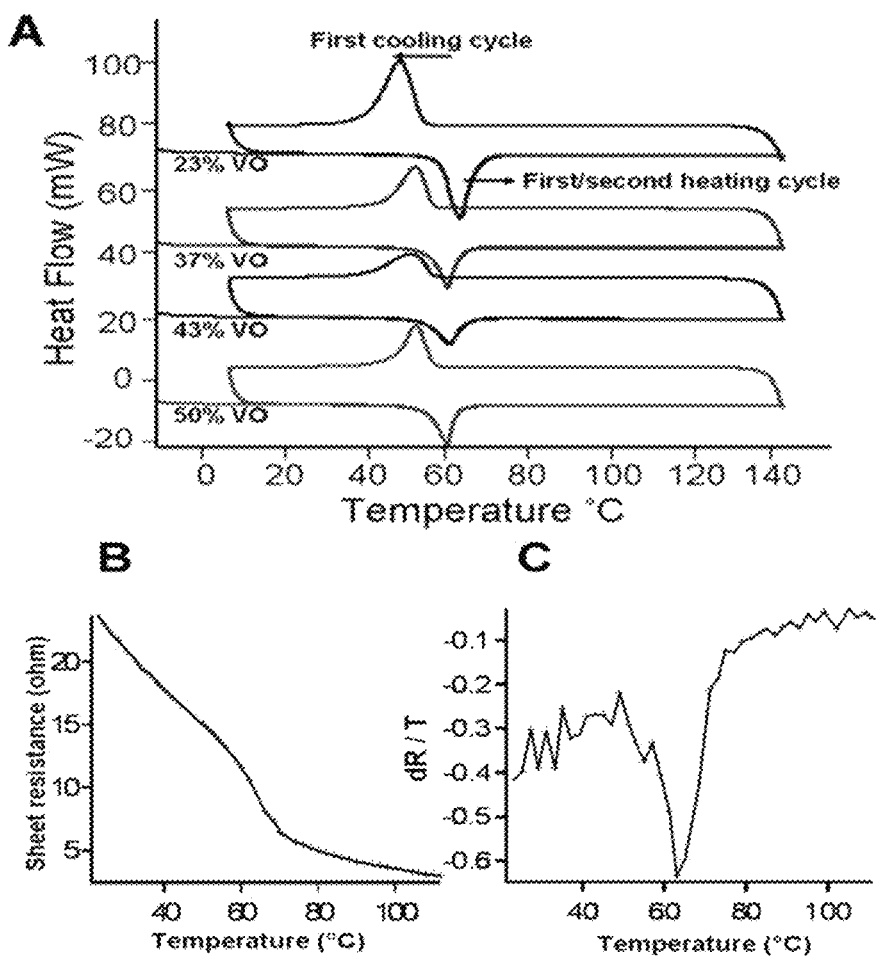
FIG. 17. A) DSC curves obtained for $VO_2$ nanostars prepared by the hydrothermal treatment of bulk $V_2O_4$ along with varying (23-50%) ratios of VO as the precursor. B) Electrical resistivity for a pressed pellet of $VO_2$ nanostars synthesized at 37% VO precursor loading plotted as a function of temperature. C) First derivative (dR/dT) plot showing a pronounced dip across the metal-to-insulator phase transition of the as-prepared $VO_2$ nanostars.

The retention of the electronic structure of VO$_2$ has been further examined by measuring the metal→insulator phase transitions of these nanostructures using differential scanning calorimetry and electrical transport measurements. The monoclinic→rutile structural phase transformation accompanying the insulator→metal electronic transition is first order in nature and thus has a pronounced measurable latent heatom The DSC plots shown in FIG. 17 indicate pronounced endothermic and exothermic features that are retained over scores of cycles attributed to monoclinic→rutile phase transformations upon heating and the reverse rutile→monoclinic restoration of structure upon cooling, respectively. The insulator→metal phase transformations are observed between 66-70° C., fairly consistent with the temperatures reported for polycrystalline or single-crystalline VO$_2$. The restoration of the phase transition is observed at temperatures between 54-58° C. The observed hysteresis is characteristic of a first-order phase transition and is known to be especially pronounced upon scaling to finite size dimensions. Solvothermally grown VO$_2$ nanobelts, the metal→insulator transition is more affected by scaling to finite size than the insulator→metal transitions, perhaps as a result of the ease with which a percolative threshold can be reached when metallic puddles coalesce within an insulating matrix. Notably, since the nanostars are significantly larger than nanobelts and nanobeams that have been studied, finite size exerts a significantly smaller impact on the critical temperature and hysteresis.

FIG. 17B plots the electrical resistivity of a pressed pellet of $VO_2$ nanostars plotted as a function of temperature. Although such a bulk measurement primarily reflects the grain boundary connectivity between discrete $VO_2$ particles, there is clear evidence for an insulator→metal transition and the dR/dT plot in FIG. 17C shows a pronounced dip that establishes a phase transition temperature of ~63° C.

Example 5

This example provides single nanowire Raman microprobe studies of doping-, temperature-, and voltage-induced metal-insulator transitions of $W_xV_{1-x}O_2$ nanowires.

In this example, individual nanowire Raman microprobe mapping was used to examine the structural phase progressions underlying the metal→insulator transitions of solution-grown $W_xV_{1-x}O_2$ nanowires. The structural phase progressions have been monitored for three distinctive modes of inducing the electronic metal→insulator phase transition: as a function of (a) W doping at constant temperature, (b) varying temperature for specific W dopant concentrations, and (c) varying applied voltage for specific W dopant concentrations. These results suggest the establishment of a coexistence regime within individual nanowires wherein M1 and R phases simultaneously exist before the percolation threshold is reached and the nanowire becomes entirely metallic. Such a coexistence regime has been found to exist both during temperature- and voltage-induced transitions. No evidence of an M2 phase is observed upon inducing the electronic phase transition by any of the three distinctive methods (temperature, doping, and applied voltage), suggesting that substitutional tungsten doping stabilizes the M1 phase over its M2 counterpart and further corroborating that the latter phase is not required to mediate M1→R transformations.

Furthermore, the depression in the critical phase transition temperatures upon tungsten doping far surpasses corresponding values for bulk $W_xV_{1-x}O_2$ of the same composition, suggesting substantial alteration of the phase diagram as a consequence of finite size. The marked deviations from bulk behavior are rationalized in terms of a percolative model of the phase transition wherein cooperative avalanche processes facilitate the insulator→metal transition, establishing a percolating metallic path for transport, but tend to impede the reverse metal→insulator transition resulting in supercooling of the metallic phase.

Figure 18:
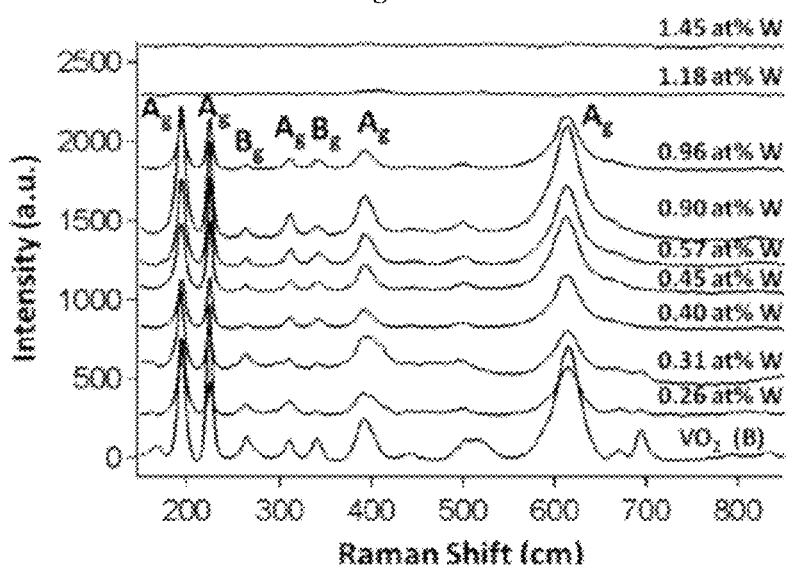
FIG. 18. Room-temperature Raman spectra acquired for $W_xV_{1-x}O_2$ nanowires with increasing tungsten doping. The M1 phase is discernible up to 0.96 atom % W doping, whereas the rutile phase is surmised from the absence of Raman bands beyond 1.18 atom % W doping. Characteristic modes of the M2 phase are not observed in any of the samples.

Metal→Insulator Transition at Constant Temperature as a Function of Varying W Doping:

FIG. 18 depicts ensemble room-temperature (298 K) Raman spectra acquired for $W_xV_{1-x}O_2$ nanowires with increasing tungsten doping. The space groups for the R and M1 phases are P4$_2$/mnm ($D_{4h}^{14}$) and P2$_1$/C ($C_{2h}^3$), respectively, and the pronounced differences in local symmetry give rise to distinctive Raman signatures (the M2 phase crystallizes in the $C_{2h}^5$ space group and also has distinctive Raman modes). By group theory analysis, the M1 phase is characterized by 18 Raman-allowed modes, 9 with $A_g$ symmetry and 9 with $B_g$ symmetry. Small shifts of the prominent 189 and 607 cm$^{-1}$ $A_g$ modes to 194 and 611 cm$^{-1}$, respectively, were evidenced originating from the incorporation of substitutional tungsten dopants. Conversely, the R phase is characterized by a broad featureless luminescence. FIG. 18 illustrates that at 1.18 atom % W doping and beyond, the prominent Raman signals of the M1 phase disappear, corroborating the stabilization of the metallic R phase at room temperature. No evidence for formation of the M2 phase (characterized by splitting of the 221 cm$^{-1}$ $A_g$ mode and shift of the 607 cm$^{-1}$ mode to 649 cm$^{-1}$) is observed at any of the tungsten doping concentrations.

Figure 19:
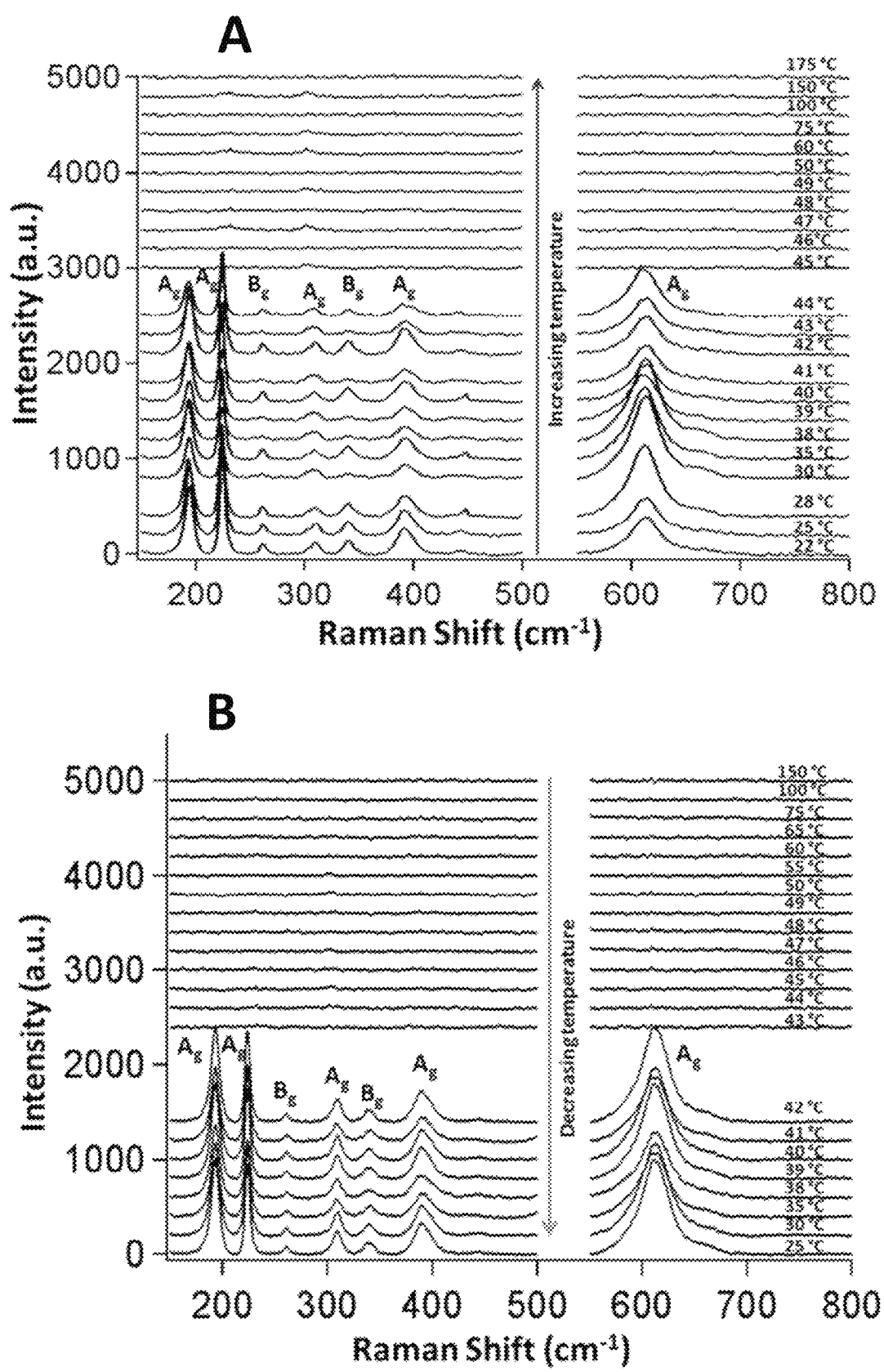
FIG. 19. Raman spectra acquired for an individual $W_xV_{1-x}O_2$ nanowire with x~0.4 atom % as a function of A) increasing and B) decreasing temperature.

Metal→Insulator Transition for Specific W Doping Concentrations as a Function of Temperature:

Raman spectra have been acquired across the metal→insulator transition for a single $W_xV_{1-x}O_2$ nanowire with a nominal W doping of x~0.40 atom %. FIG. 19 depicts that at low temperatures, the nanowire clearly exhibits Raman signatures of the M1 phase. Upon heating, between 44 and 45° C., the nanowire abruptly and discontinuously switches to the R phase and the characteristic Raman bands of the M1 phase are completely lost. No major diminution in intensity or shifts of the M1 Raman modes are observed leading up to the phase transition, suggesting nucleation of the R phase and a discontinuous jump of the domain wall without intermediacy of triclinic (T) or M2 phases. The abruptness of the change in spectral signatures suggests that the phase transition is manifested across a large volume without a substantial coexistence regime for these nanowires although a short-lived coexistence regime cannot be ruled out. The direct M1→R transition without intermediacy of M2 or T phases likely captures the intrinsic phase diagram of $W_xV_{1-x}O_2$ as a result of substitutional doping (as also seen by doping-induced transition evidenced in FIG. 18). Identical abrupt M1→R transition behavior has also been observed for $W_{0.004}V_{0.996}O_2$ nanowires on Ta substrates, corroborating the idea of that these nanowires are not substantially strained. Since the nanowires are cast onto the substrates by solution casting from 2-propanol, considerable slip between the nanowire and the substrate during the heating process is expected, which relaxes tensile stresses generated due to the differential thermal expansion coefficients of $VO_2$ and the $SiO_2$ substrate. As noted above, a direct M1→R transition has also been noted for stoichiometric $VO_2$ nanobeams that are unconstrained or reside on compliant substrates. An analogous abrupt R→M1 transition is evidenced during cooling with a slight hysteresis (FIG. 19b).

The phase transformation of a nanowire with a nominal composition of $W_{0.009}V_{0.991}O_2$ wherein the metal→insulator transition has been depressed in proximity to room temperature was followed. Upon heating from 15° C., the spectral signatures of the M1 phase are distinctly retained without significant change in intensity up to 26° C. Subsequently, a pronounced diminution of M1 Raman bands is evidenced with further heating at 27 and 28° C. and the bands are no longer discernible above the baseline at 29° C. The diminished intensity of the M1 Raman modes suggests the nucleation of the metallic R phase and a coexistence regime spanning 26-29° C., suggesting a phase progression of M1→M1+R→R, as has also been noted in bulk studies of unconstrained $VO_2$ or granular $VO_2$ thin films. No discernible peak shifts or peak splitting are noted for the 611 and 225 cm$^{-1}$ $A_g$ modes again ruling out the intermediacy of the M2 phase.

Figure 20:
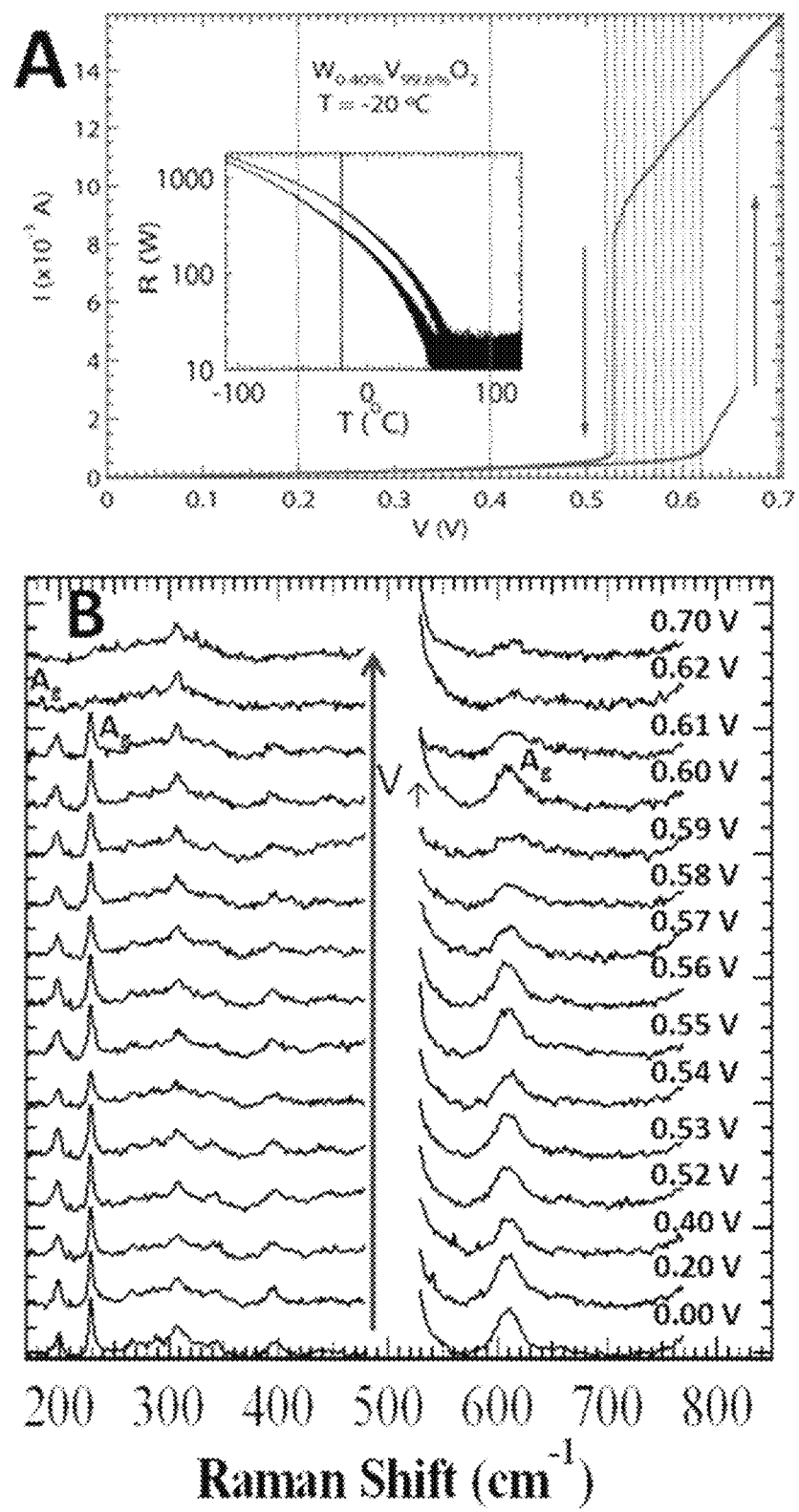
FIG. 20. A) Current versus voltage curve measured for a $W_xV_{1-x}O_2$ nanowire with x~0.4 atm. %. The red dotted lines indicate points at which the voltage was held constant and Raman spectra were acquired. The inset shows a plot of the resistance versus the temperature measured for the same exact device. B) Raman spectra acquired for the nanowire measured in (A) at different constant voltage values. C) Plots of the peak positions of the M1 Raman modes as a function of applied voltage.
Figure 20:
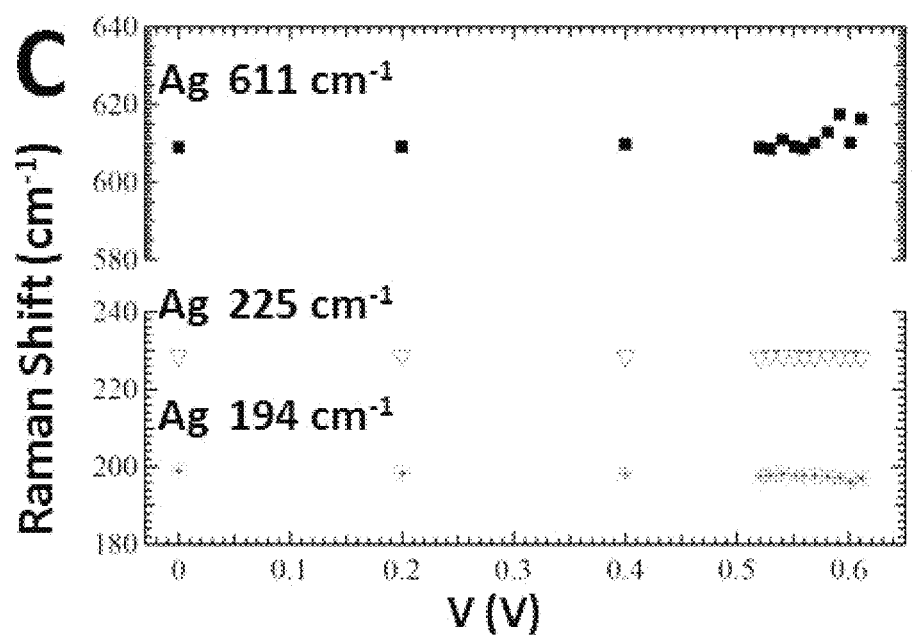

Metal→Insulator Transition for Specific W Doping Concentrations as a Function of Applied Voltage: Next, the structural phase transformations accompanying the voltage-induced metal→insulator transition in $W_xV_{1-x}O_2$ nanowires were examined. These measurements have been acquired for nanowires aligned within device geometries. The nanowires can thus be thought to be clamped onto the substrate by the deposited electrodes. The inset to FIG. 20A shows a resistance versus temperature plot of a nanowire with the same nominal tungsten doping, x~0.4, as examined in FIG. 19.

The nanowire is seen to be completely metallic by 50° C., which is similar to the phase transformation behavior noted in FIG. 19 accounting for experimental error and the clamped versus unconstrained nature of the two experiments. FIG. 20A further indicates a current versus voltage plot measured at −20° C., suggesting a sharp threshold voltage beyond which the current discontinuously rises as the nanowire transforms to a metallic state. The dotted vertical lines correspond to voltages at which Raman spectra have been acquired, as depicted in FIG. 20B. In the absence of a voltage or at low applied voltages, prominent Raman modes ascribed to the M1 phase are discernible up to 0.60 V. At 0.61 V, the 625 cm$^{-1}$ mode is slightly upshifted and broadened as well as diminished in intensity, suggesting a distorted M1 phase and the nucleation of R domains as the current starts to increase (FIG. 20A). At 0.62 V and beyond the R phase appears to be the preponderant phase; no evidence of the M2 phase is observed even for these clamped 1D nanowires. Interestingly, at 0.62 V, the Raman spectrum in FIG. 20B shows the R phase to be dominant but from the transport data in FIG. 20A, the nanowire has yet to reach a completely metallic state, likely because complete percolation of metallic domains has not yet been achieved. Notably, almost 80% of the volume of the nanowire is required to be in the metallic R phase before metallic transport can be achieved in this 1D system (in comparison to only 16% required for percolation in a 3D object). At voltages slightly higher than 0.62 V, which is very near the threshold voltage, the nanowires abruptly switch to the metallic state even from the slight laser heating that results from acquiring the Raman spectrum over 300s. At 0.70 V, the M1 phase is no longer discernible and the nanowire is also completely metallic. The data here again suggests a phase progression of M1→M1+R→R with a distinctive coexistence regime wherein the percolation threshold has yet to be reached. Remarkably, the small upshift in the 611 cm$^{-1}$ mode suggests some distortions to the M1 phase (likely at the M1/R domain wall) but no M2 phase is evidenced even though the nanowires here are clamped and thus subject to greater strain.

The absence of the M2 phase in the measurements provides intriguing insight into the intrinsic phase diagram of W-doped VO$_2$. The M1 and M2 phases are simply two ways to resolve the instability of the R lattice below the phase transition temperature. Minor perturbations to the free energy functional, such as through manipulation of the strain tensors or via the application of chemical pressure through doping, can make one phase more thermodynamically favorable than the other. Doping with Cr$^{3+}$ and Al$^{3+}$ is known to stabilize the M2 phase, primarily due to the role of these dopants in generating V$^{5+}$ species and the concomitant hole doping. In contrast, doping with W$^{6+}$ adds two electrons to the VO$_2$ band structure, creating V$^{3+}$ sites and disrupting V$^{4+}$—V$^{4+}$ dimerization, and thus likely stabilizes the M1 phase with respect to its M2 counterpart. Such preferential stabilization of the M1 phase has also been alluded to for undoped VO$_2$ nanostructures with high oxygen vacancy concentrations. Clearly, even the presence of strain in clamped W$_x$V$_{1-x}$O$_2$ nanowires is not able to offset the preferential stabilization of the M1 phase and the phase progression remains M1→M1+R→R for these materials.

Solution-grown W$_x$V$_{1-x}$O$_2$ nanowires exhibit phase diagrams that are altered from undoped VO$_2$, and are characterized especially by stabilization of the M1 phase over M2 and T alternative ground states. In situ Raman spectroscopy studies of W$_x$V$_{1-x}$O$_2$ nanowires across doping, temperature- and voltage-induced phase transitions corroborate the idea that an M2 phase is not required to mediate the M1→R structural phase transformation. With increasing W incorporation, the nanowires are stabilized in the metallic rutile phase at room temperature but again no characteristic signatures of the M2 phase are noted for any of the W-dopant concentrations. The absence of the M2 phase even for clamped nanowires indicates preferential stabilization of the M1 phase upon tungsten doping. Measurements of both thermal and voltage-induced transformations suggest the establishment of a coexistence regime wherein M1+R phases exist in different proportions before percolation is achieved and the entire nanowire is transformed to a metallic R state (upon heating).

A Hitachi SU-70 scanning electron microscope operating at an accelerating voltage of 20 kV was used to acquire SEM images. A JEOL 2010 instrument operated at 200 kV was used to acquire selected area electron diffraction (SAED) patterns. To prepare the samples for HRTEM/SAED analysis, the nanostructures were dispersed in 2-propanol and then deposited onto 300 mesh carbon-coated Cu grids. The W dopant concentrations (atomic percentage of W, x in W$_x$V$_{1-x}$O$_2$) were determined using inductively coupled plasma-optical emission spectroscopy (ICP-OES). For Raman spectroscopy, nanowire samples were dispersed in 2-propanol and cast onto SiO$_2$, Ta, or Au substrates. The nature of the substrate had no discernible influence on the observed phase transition behavior. Raman spectra were acquired using a Jobin-Yvon Horiba Labram HR instrument coupled to an Olympus BX41 microscope using 514.5 nm laser excitation from an Ar-ion laser. An 1800 lines/mm grating was used to acquire spectra yielding a spectral resolution greater than 2 cm$^{-1}$. Raman spectra were acquired for 300 seconds intervals. The laser power was kept below 300 µW to minimize local heating. A Linkam Scientific Instruments THMS 600 thermal stage was used for the in situ thermal cycling experiments and the samples were allowed to equilibrate for at least 300 seconds upon increasing/decreasing the temperature. For monitoring voltage-induced transitions, standard lithography followed by metallization using a substrate-cooled electron-beam evaporator was used to deposit Cr/Au electrodes onto individual nanowires dispersed on a 300 nm SiO$_2$/Si surface.

Example 6

This example describes a synthetic route to 1D nanowires of β-Pb$_{0.33}$V$_2$O$_5$, a vanadium bronze with polarizable divalent Pb$^{2+}$ cations (bearing lone pairs of s electrons), and evidence sharply discontinuous metal→insulator transitions under the influence of an electric field. The marked difference between bulk and nanoscale behavior further underlines the benefits of interrogating these materials approaching the single-domain limit and makes for a rare addition to the roster of materials exhibiting a pronounced electrically tunable metal→insulator transition at room temperature.

Figure 27:
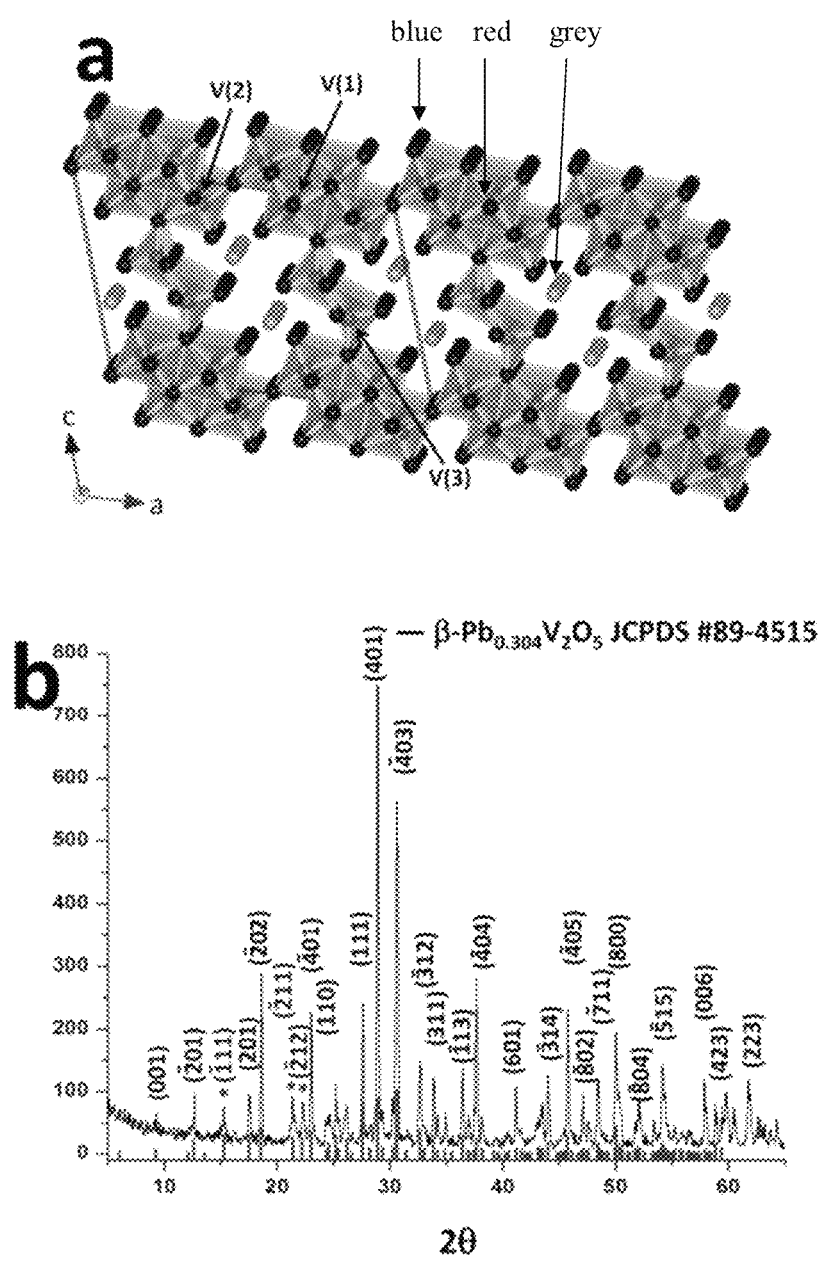
FIG. 27. a) Crystal structure of monoclinic $\beta$-$Pb_{0.33}V_2O_5$. The three distinct vanadium polyhedra are depicted with vanadium atoms (red) coordinated to oxygen (blue). Lead atoms occupying interstitial tunnel sites are shown in grey. b) XRD pattern of the as-prepared nanowires indexed to $\beta$-$Pb_{0.304}V_2O_5$ (JCPDS #41-1426), the asterisk and reflections correspond to superstructure reflections indicating bidimensional periodicity of the intercalated $Pb^{2+}$ cations. c) Panoramic SEM image of the nanowires illustrating the high purity of the synthesis and the >100 μm lengths of the nanowires. d) HRTEM image depicting the crystalline nature of the nanowires, the inset shows a low-magnification TEM image of numerous nanowires and a SAED pattern acquired for several nanowires indexed to $\beta$-$Pb_{0.304}V_2O_5$.
Figure 27:
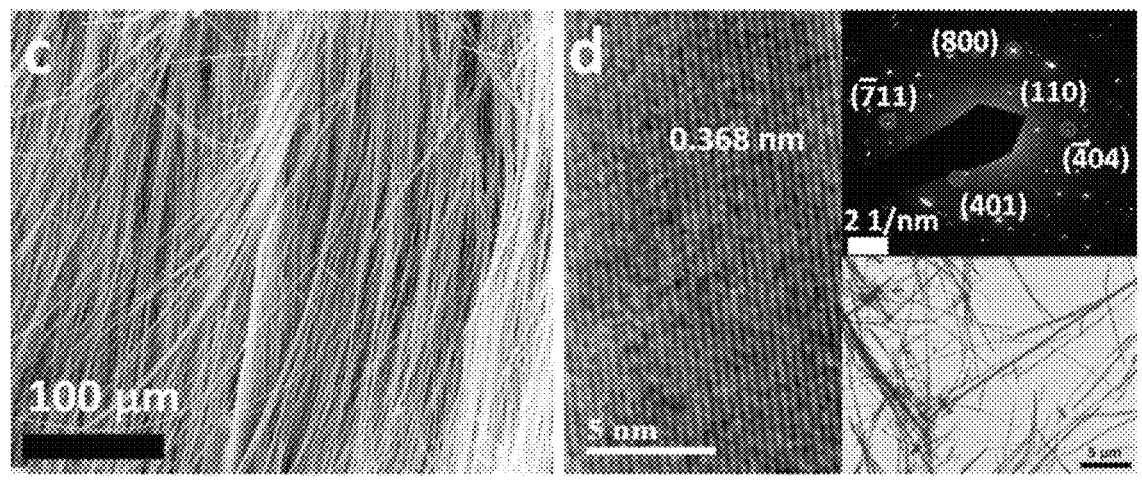

Structural Aspects of β-Pb$_{0.33}$V$_2$O$_5$. The β-phase of Pb$_{0.33}$V$_2$O$_5$ crystallizes in the monoclinic space group C2/m and comprises three crystallographically distinctive vanadium atoms: V(1)O$_6$ octahedra that share edges are arrayed in a zig-zag chain, V(2)O$_6$ octahedra share corners constituting an infinite ladder-like chain, and V(3)O$_5$ square pyramids share edges to constitute another zig-zag-type chain; all three infinite chains are aligned parallel to the b-axis and enclose infinite open tunnels along the same direction (FIG. 27a). The Pb$^{2+}$ cations reside at interstitial sites within the tunnel framework and upon incorporation reduce a fraction of V$^{5+}$ sites to V$^{4+}$. In the ground state, electron localization and charge disproportionation are extant along the length of the quasi-1D tunnels and the material can be viewed as being on the insulating side of a Mott transition. Unlike the β-phase vanadium bronzes containing monovalent cations or even its divalent $Ca^{2+}$ and $Sr^{2+}$ counterparts, the thermally induced transport observed for single crystals of β-$Pb_xV_2O_5$ shows only a modest discontinuity from insulating to metallic behavior, which has been attributed thus far to poor crystal quality and weak localization of the electrons on the vanadium chains. The fabrication of single-crystalline β-$Pb_{0.33}V_2O_5$ nanowires permits transport measurements of this material without obscuration from defect migration and dynamics.

Synthesis and Characterization of β-$Pb_{0.33}V_2O_5$ Nanowires. Nanowires of β-$Pb_xV_2O_5$ were synthesized via the hydrothermal reaction of lead acetate $Pb(CH_3COO)_2·3H_2O$ (Fluka) and $V_2O_5$ powder (Sigma Aldrich). Stoichiometric amounts were placed in a Teflon-lined acid digestion vessel (Pan) along with 16 mL of $H_2O$ (ρ=18.2 MΩ/cm) and heated in a sealed autoclave at 250° C. for 72 hours. The resulting product was then vacuum filtered and washed with copious amounts of water and allowed to dry in air. Near-edge X-ray absorption fine structure (NEXAFS) and X-ray absorption near-edge structure (XANES) spectroscopy data were collected on National Institute of Standards and Technology beamlines U7A and X23A2, respectively, at the National Synchrotron Light Source of Brookhaven National Laboratory.

FIG. 27b shows the powder X-ray diffraction pattern measured for the as-prepared nanowires. The pattern can be indexed to phase-pure β-$Pb_{0.304}V_2O_5$ (Joint Committee on Powder Diffraction Standards (JCPDS) #89-4515) with additional reflections (denoted by an asterisk and reflections indicated in blue) corresponding to a periodic superstructure constituted from ordering of $Pb^{2+}$ ions along two dimensions: a) along the length of the tunnel wherein the cations constitute a zig-zag chain parallel to the crystallographic b-axis, along with b) alternating arrays of ordered and disordered chains along the crystallographic a axis. A SEM image illustrating the morphology, high aspect ratios, and high purity of the nanowires is shown in FIG. 27c. The nanowires clearly range in length up to hundreds of microns. The diameter distribution has been deduced from low-magnification TEM images (inset to FIG. 27d) and is centered around ~170 nm, indicating aspect ratios well over 500. The prepared nanowires are single crystalline as indicated in FIG. 27d, which depicts a lattice-resolved HRTEM image of an individual nanowire with a spacing of 0.368 nm that corresponds well to the separation between the (400) planes of β-$Pb_{0.33}V_2O_5$; this image also illustrates the b-axis is parallel to the length of the nanowire. The selected-area electron diffraction pattern of several nanowires is depicted in the inset to FIG. 27d and can be again indexed to the β-phase of $Pb_{0.304}V_2O_5$. Chemical analysis via energy dispersive X-ray spectroscopy has confirmed a Pb concentration close to the stoichiometric limit of x~0.33 for the β phase.

Figure 28:
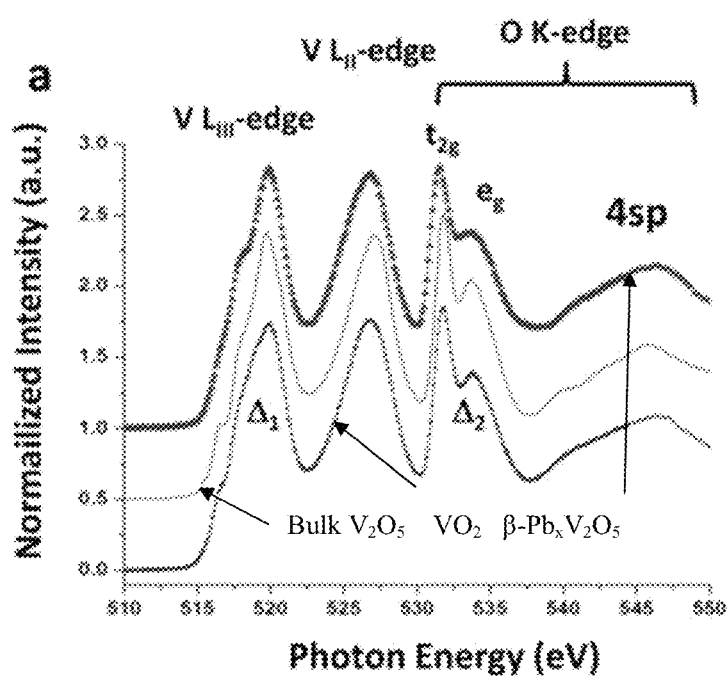
FIG. 28. a) V L-edge and O K-edge NEXAFS spectra of bulk $V_2O_5$, $VO_2$, and $\beta$-$Pb_xV_2O_5$ nanowires. The difference in splitting between the V $L_{III}$ ($\Delta_1$) and O K ($\Delta_2$) edges suggests charge disproportionation. b) Vanadium K-edge XANES spectra of bulk $V_2O_5$, $VO_2$, and $\beta$-$Pb_xV_2O_5$ nanowires. c) High-resolution XPS spectrum acquired at the V 2p edge for $\beta$-$Pb_xV_2O_5$ nanowires.
Figure 28:
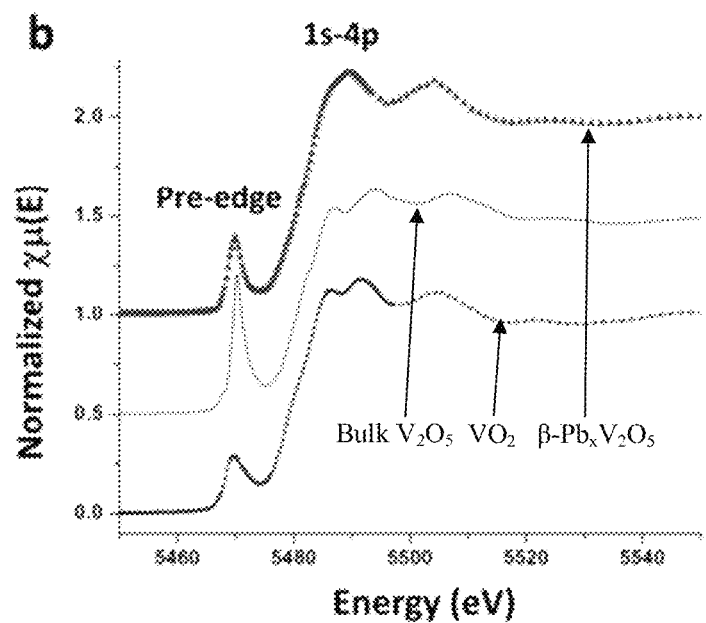
Figure 28:
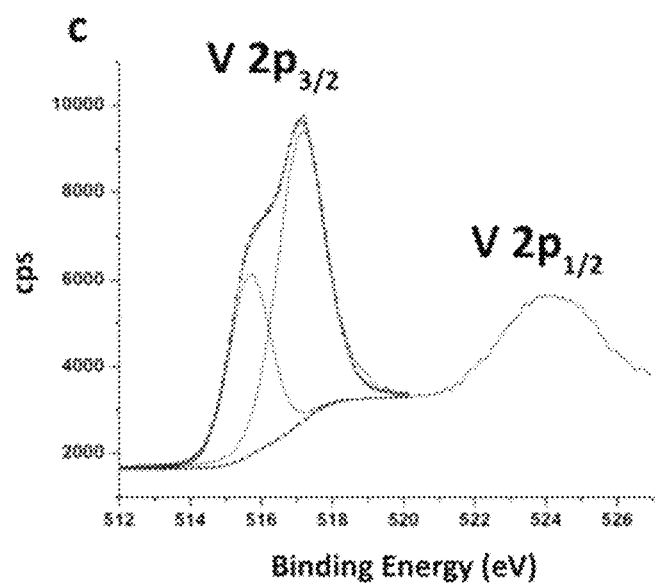

Electronic Structure of β-$Pb_{0.33}V_2O_5$. The electronic structure of the as-prepared β-$Pb_{0.33}V_2O_5$ nanowires has been examined by NEXAFS spectroscopy. NEXAFS spectroscopy involves the excitation of core electrons to partially filled or unoccupied states and the lineshapes and peak positions of elemental-edge-specific NEXAFS spectra reflect the unoccupied density of states (UDOS) of a solid-state compound (as modified by interaction with the created core-hole). To first approximation, V L-edge spectra represent the d-projected UDOS and the O K-edge spectra represent the p-projected UDOS; hybridization of O 2p states with V3d levels allows for the observation of these transitions in the NEXAFS spectra. FIG. 28a juxtaposes V L-edge and O K-edge NEXAFS data of bulk monoclinic $VO_2$, bulk $V_2O_5$, and β-$Pb_xV_2O_5$ nanowires. The two broad peaks at ~520 and ~526 eV correspond to the V $L_{III}$ and V $L_{II}$ edge resonances, respectively, and can be ascribed to transitions from $V2p_{3/2}$→V3d and $V2p_{1/2}$→V3d, respectively. The O K-edge arises from transitions from O 1s core states to the O 2p levels hybridized with V3d orbitals; the pronounced splitting at the O K-edge reflects the crystal field splitting of V $3d_{x2-y2}$ and V $3d_{z2}$ ($e_g^*$) states that are involved in direct V—O σ overlaps and the V $3d_{xy}$, $3d_{yz}$, and $3d_{xz}$ ($t_{2g}^*$) states that participate in sideways V—O π bonding. The splitting of the $e_g^*$ and $t_{2g}^*$ hybridized states ($\Delta_2$) for β-$Pb_xV_2O_5$ has been determined to be 2.2 eV, which is identical to that of δ-$K_{0.5}V_2O_5$ and slightly smaller than the 2.4 eV value measured for β'-$Cu_{0.65}V_2O_5$. The O- and V-projected density of states calculated and plotted in FIG. 29 confirms the two distinctive regimes ($t_{2g}^*$ and $e_g^*$) at the O K-edge. The close similarities in crystal field splitting attest to the analogous local V—O bonding within the quasi-1D $V_2O_5$ frameworks. In contrast, the splitting ($\Delta_1$) at the V $L_{III}$ edge is 1.9 eV. The sharp difference between the $\Delta_1$ and $\Delta_2$ values observed for β-$Pb_xV_2O_5$ suggests that the splitting of the V $L_{III}$ feature cannot be explained based on crystal field considerations alone. Moreover, a DFT calculation shows that the three symmetry inequivalent vanadium atoms (V1, V2, and V3 in FIG. 27a) have similar coordination environments, and consequently do not give rise to distinctive NEXAFS resonances that are as much as 1.9 eV apart in energy. Instead, the distinctive splitting at the V $L_{III}$ and O K-edges is averred to be a result of charge disproportionation and electron localization wherein discrete $V^{4+}$ sites (reduced by accepting electrons from $Pb^{2+}$ cations) are arrayed along the quasi-1D tunnels amidst the mostly $V^{5+}$ $V_2O_5$ structural framework. Note that the results suggest charge disproportionation with distinctive electron densities on vanadium atoms that could be more complex than simple $V^{4+}/V^{5+}$ ordering. The precise charge ordering pattern remains to be determined and is likely very distinct for each quasi-1D β/β' vanadium oxide bronze depending upon the size and polarizability of the intercalated cations, the ordering motif of the cations, and the degree of covalency of M—O interactions within the tunnel.

XANES spectra at the V K-edge are also rich with information about oxidation state and the local symmetry of the vanadium atom. FIG. 28b shows V K-edge spectra for bulk orthorhombic $V_2O_5$, monoclinic $VO_2$, and β-$Pb_xV_2O_5$ nanowires; a distinctive pre-edge feature, absorption edge, and the primary 1s→4p transition are observed. The pre-edge feature arises from transitions from is core levels to unoccupied V3d states that are rendered dipole-allowed due to mixing with p states upon departure from perfectly octahedral symmetry; accordingly, symmetric VO (rock salt structure and octahedral vanadium coordination) has no pre-edge absorption, whereas the strongly distorted vanadium-centered square pyramids of $V_2O_5$ yield a pronounced absorption feature (FIG. 28b). The relative intensity and peak position of the pre-edge feature for β-$Pb_xV_2O_5$ nanowires is intermediate between the square pyramid of $V_2O_5$ and the distorted octahedra of $V_2O_4$, which is expected from the distinctive symmetries of $VO_6$ octahedra and $VO_5$ square pyramids of the β-phase. The absorption edge feature, following Kunzl's law, also shows a monotonic dependence of peak position with oxidation state. The absorption edge features for β-$Pb_xV_2O_5$, $V_2O_5$, and $V_2O_4$ are 5481.8, 5482.3, and 5481.0 eV, respectively, indicating partial reduction of $V^{5+}$ upon Pb incorporation and an intermediate oxidation state between $V^{4+}$ and $V^{5+}$.

X-ray photoelectron spectroscopy (XPS) has further been performed to characterize the $\beta$-Pb$_x$V$_2$O$_5$ nanowires. FIG. 28c shows high resolution V 2p spectra of the nanowires, the V $2p_{1/2}$ and V $2p_{3/2}$ peaks are observed at energies of 524 eV and 517.5 eV, yielding a spin-orbit splitting of 6.5 eV. Furthermore, the broadening and peak multiplicity of the V 2p region can be attributed to partial reduction of the V$_2$O$_5$ framework to $V^{4+}$ at specific V sites upon incorporation of Pb. Peak fitting analysis of the V $2p_{3/2}$ absorption feature clearly shows two distinct vanadium contributions at 515.6 and 517.0 eV arising from distinct $V^{4+}$ and $V^{5+}$ oxidation states, respectively, which provides an approximate $V^{4+}$/($V^{4+}$+$V^{5+}$) ratio of 0.30, close to the expected 0.33 ratio for divalent cations with x=0.33 (some surface $V^{4+}$ sites may be susceptible to oxidation in the nanowires). A redox titration was performed to determine the oxidation state of vanadium. From the titrations, a $V^{4+}$/($V^{4+}$+$V^{5+}$) ratio of 0.294±0.17 is deduced illustrating partial reduction of the V$_2$O$_5$ upon incorporation of Pb analogous to the conclusions derived from the XPS measurements.

Figure 29:
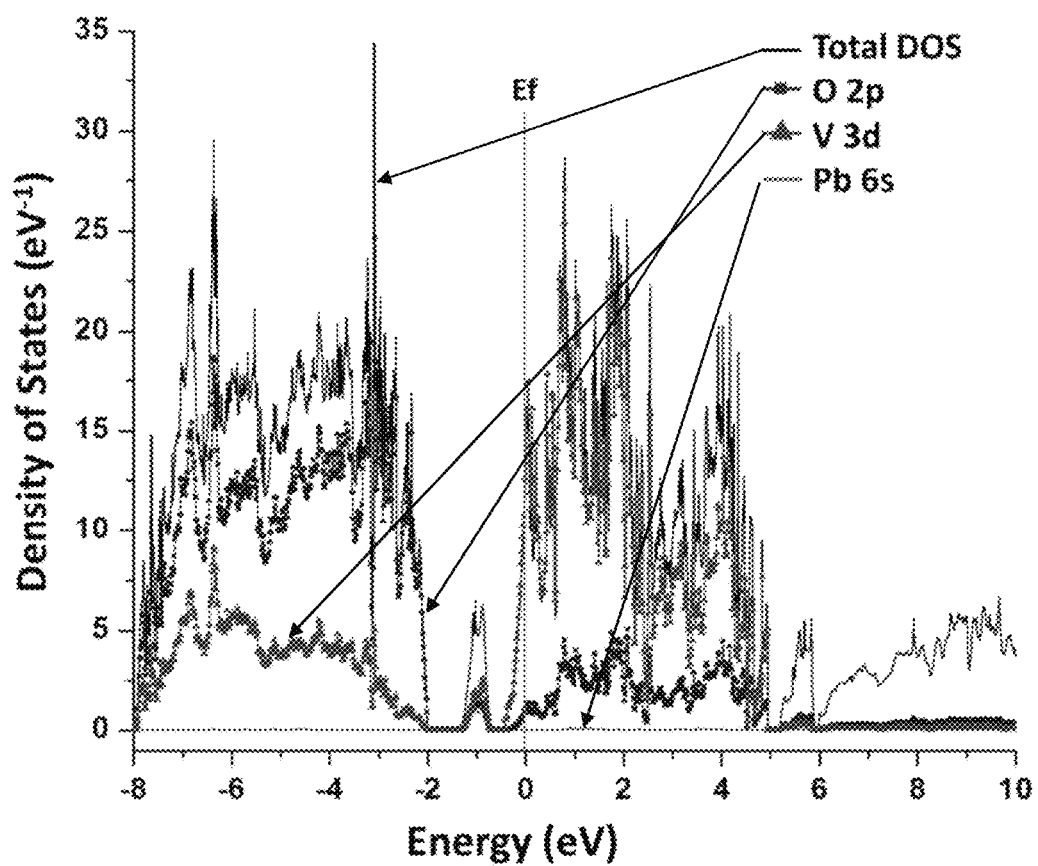
FIG. 29. Calculated density of states for $\beta$-$Pb_{0.33}V_2O_5$ showing the total DOS (line), contributions from O 2p (squares), V 3d (triangles), and Pb 6s (line). The Fermi level is defined as 0.0 eV and a line labeled $E_f$ is shown for clarity.

FIG. 29 shows the calculated total and atom-projected density of states (DOS) for $\beta$-Pb$_{0.33}$V$_2$O$_5$. Interestingly, the DOS was characterized by the manifestation of in-gap state that is well-separated from the conduction and valence bands. V$_2$O$_5$ has an analogous split-off conduction band but notably the in-gap state in $\beta$-Pb$_{0.33}$V$_2$O$_5$ lies below the Fermi level and further has contributions from V 3d mixed with O 2p and Pb 6s (lone pair) states unlike in V$_2$O$_5$, wherein the split-off state was almost entirely V 3d in character. From the joint DOS plotted in FIG. 29, stoichiometric $\beta$-Pb$_{0.33}$V$_2$O$_5$ is a metal with a DOS maxima located at the Fermi level, which is indeed characteristic of electronic instabilities. Not surprisingly, the conduction band primarily has V 3d character, whereas the valence band has O 2p character. Electron localization at specific V 3d states on the V$_2$O$_5$ framework can create a small gap near the first peak of the conduction band in proximity to the Fermi level, thereby providing one possible pathway for a metal→insulator transition. The localization may be facilitated by local structural distortions and/or Coulomb correlations of d electrons. Another possible alternative that can be envisaged is that deviation from perfect stoichiometry (x<0.33) (or p-doping) may lead to occupation of the in-gap state but not the conduction band, thereby rendering $\beta$-Pb$_x$V$_2$O$_5$ a small gap insulator or poor metal. Increasing the carrier density, would result in occupation of the conduction band rendering the nanowires metallic in character.

Figure 30:
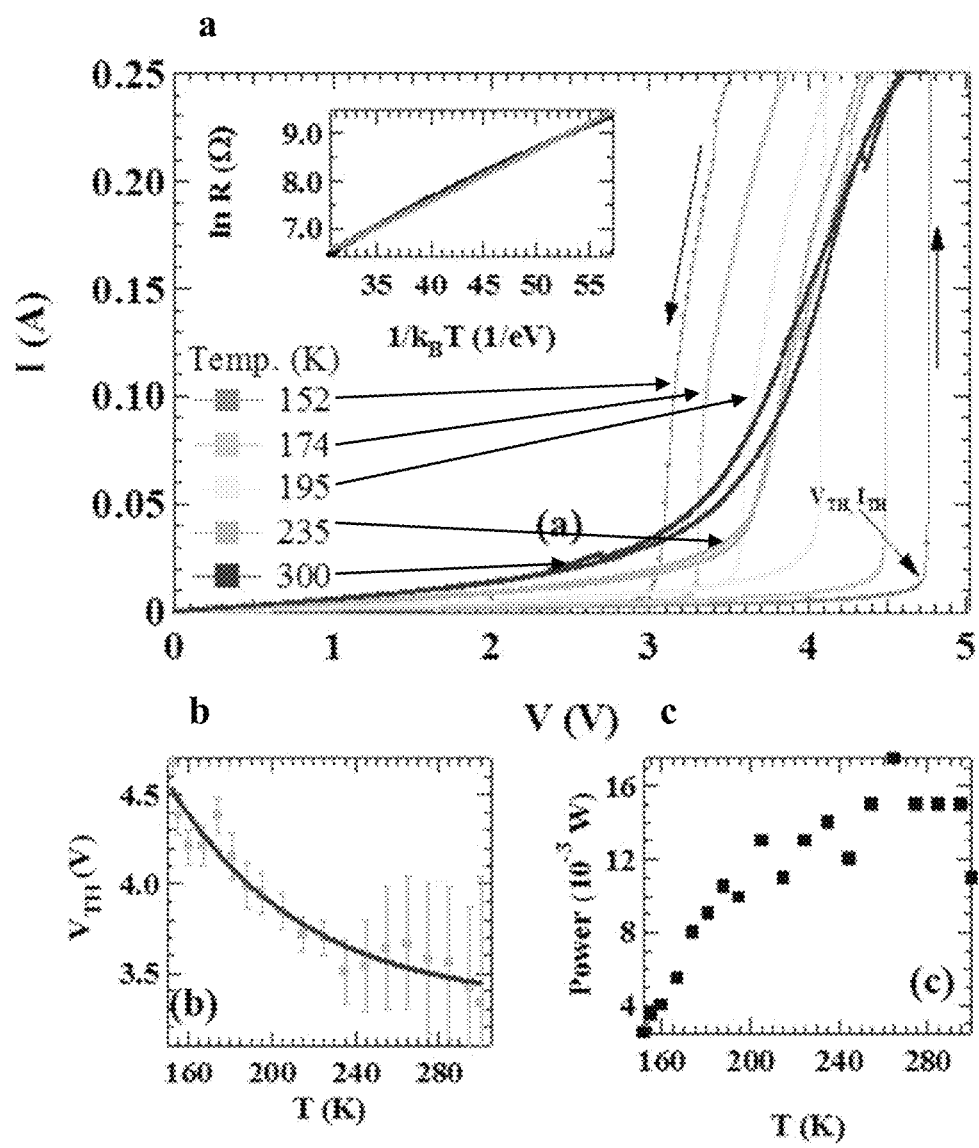
FIG. 30. a) Current (I) vs. Voltage (V) for $\beta$-$Pb_{0.33}V_2O_5$ nanowire pellets at different temperatures. Arrows indicate direction of voltage sweeping. Inset: Resistance in log scale vs. $1/k_BT$ where $k_B$ is Boltzmann's constant. Curve shows Arrhenious dependence ~$\exp[E_a/k_BT]\cdot E_a=109$ meV. b) Threshold voltage, $V_{TH}$, (indicated in main panel of (a)) vs. T. Exponential fit takes the form $\exp(-T/T_0)$. c) Power dissipated at the threshold ($V_{TH}I_{TH}$) vs. temperature.

Metal→Insulator Transitions of $\beta$-Pb$_{0.33}$V$_2$O$_5$. No pronounced thermally-driven metal→insulator transition has been observed for $\beta$-Pb$_x$V$_2$O$_5$ nanowires in the range between 200-400 K. In a classical strongly correlated Mott insulator, if a certain threshold carrier density can be achieved either through thermal excitation, optical pumping, or application of a voltage/current, bound localized states can no longer be stabilized and an abruptly discontinuous transition to a correlated metallic regime is evidenced with a step change in the free carrier density. Thermal excitation potentially gives rise to peculiar lattice distortions or generation of random potentials that can preclude observation of a thermally-induced metal→insulator transition for $\beta$-Pb$_x$V$_2$O$_5$ nanowires. Upon application of a voltage to pressed pellets of the nanowires, a pronounced and entirely reversible hysteretic transition to a metallic regime is observed, as indicated in FIG. 30. Typical values of R at room temperature are 100-800Ω. In the 200-400 K temperature range, R follows an Arrhenius form R=R$_o$exp[E$_a$/k$_B$T] (FIG. 30a inset), where k$_B$ is Boltzmann's constant and T is temperature. This dependence has been seen previously in other nanoscale vanadium oxide systems. For $\beta$-Pb$_x$V$_2$O$_5$ nanowire pellets, E$_a$ ranges from 85 to 110 meV.

In FIG. 30, starting at the lowest temperature (150 K) the voltage (V) has been driven from zero at a fixed rate and the current (I) through the sample has been measured. At a certain threshold, V$_{TH}$, a large jump in I signifying induction of an insulator→metal transition is observed. In an effort to protect the sample from Joule heating, I through the sample is limited to 250 mA in all the measurements. In the reverse sweeping direction, another sharp I jump albeit at a voltage value less than V$_{TH}$ is noted, manifesting a hysteresis. As T is increased, the I versus V curves are increasingly broadened and above ~235 K hardly any hysteresis is discernible. However, a broad MIT is noted even as high as room temperature. The T dependence of V$_{TH}$ can be fitted to $$\exp\left(-\frac{T}{T_0}\right),$$

(FIG. 30b), which is characteristic to other strongly correlated materials, and is often suggestive of a charge ordering-induced metal→insulator transition.

An alternative scenario can also be considered based on observations of sharp switching in electrical resistance noted at metal-oxide/metal interfaces, such as for SrTiO$_{3-x}$ or TiO$_2$, which has been attributed to electroforming processes that facilitate charge transport via the field-directed motion of oxygen vacancies. While the precise details of this phenomena remain to be elucidated, it has been hypothesized that conductive filaments are formed between the metal electrodes through Joule heating processes and that mobile vacancies migrate within this region. As with mechanistic understanding of any chemical process, verification of the correct mechanism is difficult. However, the balance of evidence suggests melting of charge ordering and not electroforming or Joule heating-induced vacancy migration as the underlying origin of the transport behavior observed for $\beta$-Pb$_x$V$_2$O$_5$ pellets. Notably, such a mechanism and the role of electron correlation have been established for other vanadium oxide bronzes such as $\beta$-Ca$_{0.33}$V$_2$O$_5$ and $\beta$-Na$_{0.33}$V$_2$O$_5$ (the latter even showing superconductivity). Furthermore, although not as pronounced as in the nanowires, single crystals of Pb$_x$V$_2$O$_5$ do show a thermally induced discontinuity in their electrical transport behavior. It is reasonable to expect that a mechanism similar to the bulk will be manifested at nanoscale dimensions. Optical microscopy and SEM imaging further do not show characteristic electroforming lines in the pellets even after switching over scores of cycles. Perhaps the most compelling evidence is presented in FIG. 30c to resolve the role of carrier density versus Joule heating in systems such as the Verway transition of Fe$_3$O$_4$. Current flow through narrow hot filaments will produce a significant amount of Joule heating, raising the temperature of the sample to a certain value above that of the set temperature. Thus it is expected that as the set temperature increases, the dissipated power due to Joule heating at the threshold voltage should decrease. However, the opposite trend was observed in the measurements as shown in the power dissipation curve depicted in FIG. 30c, suggesting the likelihood of an electric-field induced transition.

For a voltage-driven pulse measurement to be meaningful, the timescales for trigging an electric field-driven transition must be known relative to that of trigging a Joule heating transition; for example, a heat balance equation for $VO_2$ systems has been used to estimate the time required for the temperature of the sample to rise due to Joule heating across the transition temperature ($T_c$ as denoted in $VO_2$) for given values of dissipated power. This calculation requires knowledge of the resistivity, specific heat, thermal conductivity and $T_c$, none of which are currently known for the instant system. Furthermore, very long relaxation behavior in resistance have been observed as V approaches $V_{TH}$. These effects may be intrinsic to all vanadium systems near the transition and hence applicability of pulsed electrical measurements to vanadium oxide systems near the transition has proven to be rather complex.

While the precise mechanism remains unclear, $Pb^{2+}$ cationic ordering both along the length and across tunnels (verified by the observation of superstructure reflections in the diffraction pattern), the calculated electronic structure depicted in FIG. 29, and the charge disproportionation evidenced at room temperature in the NEXAFS measurements suggest that electron delocalization and transformation to the metallic state is induced when the applied electric field generates sufficient free carrier density to melt the specific charge ordering motif of $\beta\text{-}Pb_xV_2O_5$. The unusual V—O—Pb-hybridized in-gap state and the DOS maxima at the Fermi level further corroborate the intrinsic electronic instabilities of this material. These results represent the first voltage-induced metal→insulator transitions observed for classical tunnel-type β/β' Wadsley bronzes and indicate that optically pumping or electrically inducing a threshold carrier density can uncloak a wide variety of eclectic transport phenomena in these materials.

The synthesis of single-crystalline $\beta\text{-}Pb_xV_2O_5$ nanowires thus enables interrogation of the intrinsic electronic phase diagram of this material, demonstrating an unprecedented voltage-induced metal→insulator transition along the length of the strongly correlated quasi-1D framework. X-ray diffraction, NEXAFS spectroscopy, and electrical transport data suggest superstructure ordering of cations, and charge disproportionation for the insulating phase; melting of charge ordering likely induces collective electron motion and transformation to the metallic state upon the application of a voltage. An unusual in-gap state is observed in the calculated electronic structure, which along with the DOS maxima at the Fermi level suggests a possible pathway for a carrier-density-dependent phase transformation from a narrow gap semiconductor to a metal. An entirely new class of materials, vanadium bronzes formed with divalent cations, exhibiting sharply discontinuous voltage-induced metal→insulator transitions will be of great relevance for device applications such as memristors, Mott field-effect transistors, and electrochromic coatings. Based on the memory capacitance effect, a memory metamaterial device can be designed that harnesses the memory effects in the insulator-metal transition of the canonical metal→insulator transition material $VO_2$ to yield robust stimuli-responsive frequency-switchability of the electromagnetic response. The ability to adjust the electromagnetic output of an object in real time has tremendous bearing for the field of transformation optics, especially the vaunted goal of electromagnetic cloaking. Vanadium bronzes derived from divalent cations with voltage tunable metal→insulator transitions represent a useful new addition to the sparse roster of materials suitable for this purpose apart from being fundamentally interesting 1D model systems for examination of charge fluctuations and strong correlation.

Powder X-ray diffraction (XRD) data was collected in Bragg-Brentano geometry using a Rigaku Ultima IV instrument (Cu Kα radiation, voltage 40 kV, current 44 mA). The nanowire samples were ground to a fine powder and packed in a sample holder with 0.5 mm depth for the powder XRD measurements. Pattern fitting and phase identification were achieved with the help of JADE 8.5. The morphology of the as-prepared nanowires was evaluated by scanning electron microscopy (SEM, Hitachi SU-70 operated at 25 kV equipped with an X-ray detector), and by combining high-resolution transmission electron microscopy (HRTEM) with selected area electron diffraction (SAED, JEOL-2010, 200 kV, 100 mA). For transmission electron microscopy, the samples were dispersed in 2-propanol using a bath sonicator and then deposited onto 300 mesh carbon-coated Cu grids. Near-edge X-ray absorption fine structure (NEXAFS) data were collected on National Institute of Standards and Technology beamline U7A and X23A2 at the National Synchrotron Light Source (NSLS) of Brookhaven National Laboratory with a toroidal mirror spherical grating monochromator using a 1200 lines/mm grating and an energy resolution of 0.1 eV. NEXAFS data were collected in partial electron yield (PEY) mode with a channeltron multiplier near the sample surface using the detector at −200 kV bias to enhance surface sensitivity. The PEY signal was normalized by the drain current of a clean gold mesh located along the path of the incident X-rays. In addition, all the data was collected along with a standard V reference mesh for energy calibration. V K-edge XANES data were acquired in transmission mode on beamline X23A2 of the NSLS for powder samples of nanowires milled with BN. All spectra were calibrated using a V metal foil, for which spectra were simultaneously collected during all transmission mode experiments. A Si(311) monochromator was used for an overall spectral resolution ($\Delta E/E$) of $2\times10^{-4}$. High resolution X-ray photoelectron spectroscopy was performed using a Phi 5000 Versa Probe instrument using Mg Kα as the X-ray source.

Redox titrations to determine the valence of vanadium in $\beta\text{-}Pb_xV_2O_5$ nanowires were performed by dissolving a weighed amount of the solid in 20 mL of concentrated $H_2SO_4$ solution (J. T. Baker) at 50° C. The resulting solution was first titrated with 0.01043 M $KMnO_4$ (Alfa Aesar) to determine moles of $V^{4+}$ via oxidation to $V^{5+}$. Subsequently, following titration with $KMnO_4$, a second titration with a 0.01865 M solution of iron (II) ammonium sulfate (Sigma Aldrich) was used to determine the total moles of vanadium. Both sets of titrations were performed in triplicate. Ab initio density functional theory (DFT) as implemented in the Quantum ESPRESSO package was used to determine the atom-projected DOS for $\beta\text{-}Pb_{0.33}V_2O_5$ from first-principles consideration. The generalized gradient approximation was used for exchange and correlation terms along with ultrasoft pseudopotentials to describe the electron-ion interactions.

Example 7

This example provides a reversible transformation between double-layered (δ) and tunnel (β) quasi-1D geometries for nanowires of a divalent vanadium bronze $Ca_xV_2O_5$ (x ~0.23) upon annealing-induced dehydration and hydrothermally-induced hydration. Such a facile hydration/dehydration-induced interconversion between two prominent quasi-1D structures (accompanied by a change in charge ordering motifs) has not been observed in the bulk and is posited to result from the ease of propagation of crystallographic slip processes across the confined nanowire widths for the δ→β conversion and the facile diffusion of water molecules within the tunnel geometries for the β→δ reversion.

Synthesis. δ-$Ca_xV_2O_5 \cdot H_2O$ nanowires were prepared by ball milling stoichiometric amounts of $Ca(NO_3)_2 \cdot 4H_2O$ (J. T. Baker) or $Ca(COOCH_3)_2 \cdot H_2O$ (Sigma-Aldrich) with $V_2O_5$ powder (Sigma-Aldrich 99.5%) in a Spex mill. The mixture was then placed in a Teflon cup and heated in a sealed autoclave (Pan) along with 16 mL of deionized water. The hydrothermal reaction was performed for 72 hours at 250° C. Upon cooling to room temperature, the product was vacuum filtered, washed with deionized water, and allowed to dry in air. The transformation to β-$Ca_xV_2O_5$ was performed under a $10^{-3}$ vacuum using a Schlenk line apparatus under various conditions as described below. The subsequent reversion of β-$Ca_xV_2O_5$ to δ-$Ca_xV_2O_5 \cdot H_2O$ was achieved by hydrothermal treatment wherein ~300 mg of β-phase nanowires and 16 mL of deionized water were placed in a Teflon cup and heated in a sealed autoclave at 210° C. for 72 hours.

Characterization. Powder X-ray diffraction (XRD) data was collected in Bragg-Brentano geometry using a Rigaku Ultima IV instrument (Cu Kα radiation, voltage 40 kV, current 44 mA). The nanowire samples were ground to a fine powder and packed in a sample holder with 0.5 mm depth for the powder XRD measurements. Pattern fitting and phase identification were achieved with the help of JADE 8.5. The morphology of the as-prepared nanowires was evaluated by scanning electron microscopy (SEM, Hitachi SU-70 operated at 25 kV equipped with an X-ray detector), and by combining high-resolution transmission electron microscopy (HRTEM) with selected area electron diffraction (SAED, JEOL-2010, 200 kV, 100 mA). For transmission electron microscopy, the samples were dispersed in 2-propanol using a bath sonicator and then deposited onto 300 mesh carbon-coated Cu grids. Differential scanning calorimetry (DSC, Q200 TA Instruments) measurements under a flowing nitrogen atmosphere were performed on the temperature range from 0-300° C. to study the phase transition. As-prepared nanowires were examined in the DSC experiments after being allowed to dry overnight in air at room temperature.

Figure 31:
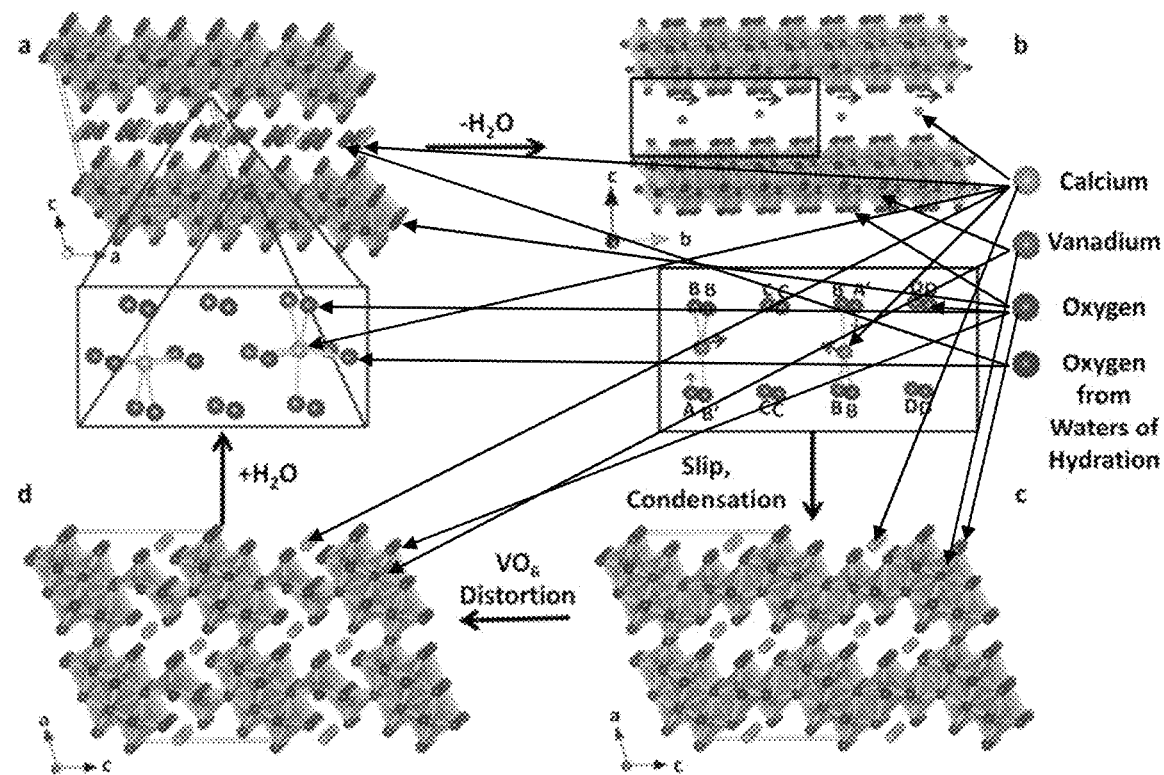
FIG. 31. Schematic of a transformation from the hydrated δ-phase to the tunnel-like β-phase. a) The crystal structure of δ-$Ca_xV_2O_5\cdot H_2O$ and a magnified portion of the calcium coordination environment illustrating the alternating calcium occupation corresponding to a maximum x=0.25. Removal of interlayer water collapses the double layers (b) causing a slip as shown by the red arrows, movement of the atoms is seen where O(A/A') coordinate to the layers above and below through oxygen vacancies at O(D), and calcium ions coordinate to O(C) to yield the structure shown in (c). In (c) coordination of the layers through oxygen vacancies subsequent to the slip is shown. Distortion of the $VO_6$ octahedra coordinated to O(B') and O(C) breaks a V—O bond yielding $VO_5$ square pyramids giving rise to the 1D tunnel framework of the β-phase (d).

FIG. 31a depicts the crystal structure of the hydrothermally grown δ-$Ca_xV_2O_5 \cdot H_2O$ phase. The δ-phase crystallizes in the monoclinic $C_2/m$ space group with $Ca^{2+}$ ions and water molecules occupying interlayer sites. As noted above, the δ-$Ca_xV_2O_5 \cdot H_2O$ phase can be conceptualized by starting with the open framework of $V_2O_5$, followed by insertion of metal cations between every other $VO_5$ layer. Subsequent compression and condensation of the double layers, followed finally by rotation of a square pyramid, and then combination of the layers yields the δ-phase as pictured in FIG. 31a.

In δ-$Ca_xV_2O_5 \cdot H_2O$, $Ca^{2+}$ ions along with water molecules reside between the vanadium-centered polyhedral layers; the water molecules hydrate the $Ca^{2+}$ ions in solution and as depicted in the magnified inset to FIG. 31a remain coordinated to the calcium ions between the $V_2O_5$ layers. The immediate coordination environment of the $Ca^{2+}$ ions is constituted from a total of seven oxygen atoms, four derived from the waters of hydration and three from the $V_2O_5$ layers above and below; the sevenfold coordination of $Ca^{2+}$ ions results in every alternate cation site of the 6-phase being occupied along the b-axis, thereby giving rise to a maximum stoichiometry of x=0.25.

FIG. 32a shows a powder XRD pattern of the as-prepared nanowires, which can be clearly indexed to phase-pure δ-phase $Ca_{0.24}V_2O_5 \cdot H_2O$ (Joint Committee of Powder Diffraction Standards (JCPDS) #88-0579); energy dispersive X-ray (EDX) spectroscopy data yields x=0.23, very close to the stoichiometric limit of 0.25 for δ-$Ca_xV_2O_5 \cdot H_2O$. Considerable preferential orientation is observed with pronounced intensities of the (001), (003), (004), and (005) reflections. FIGS. 32b-d depict powder XRD patterns acquired after thermally annealing the as-prepared nanowire samples and are discussed in further detail below.

Figure 33:
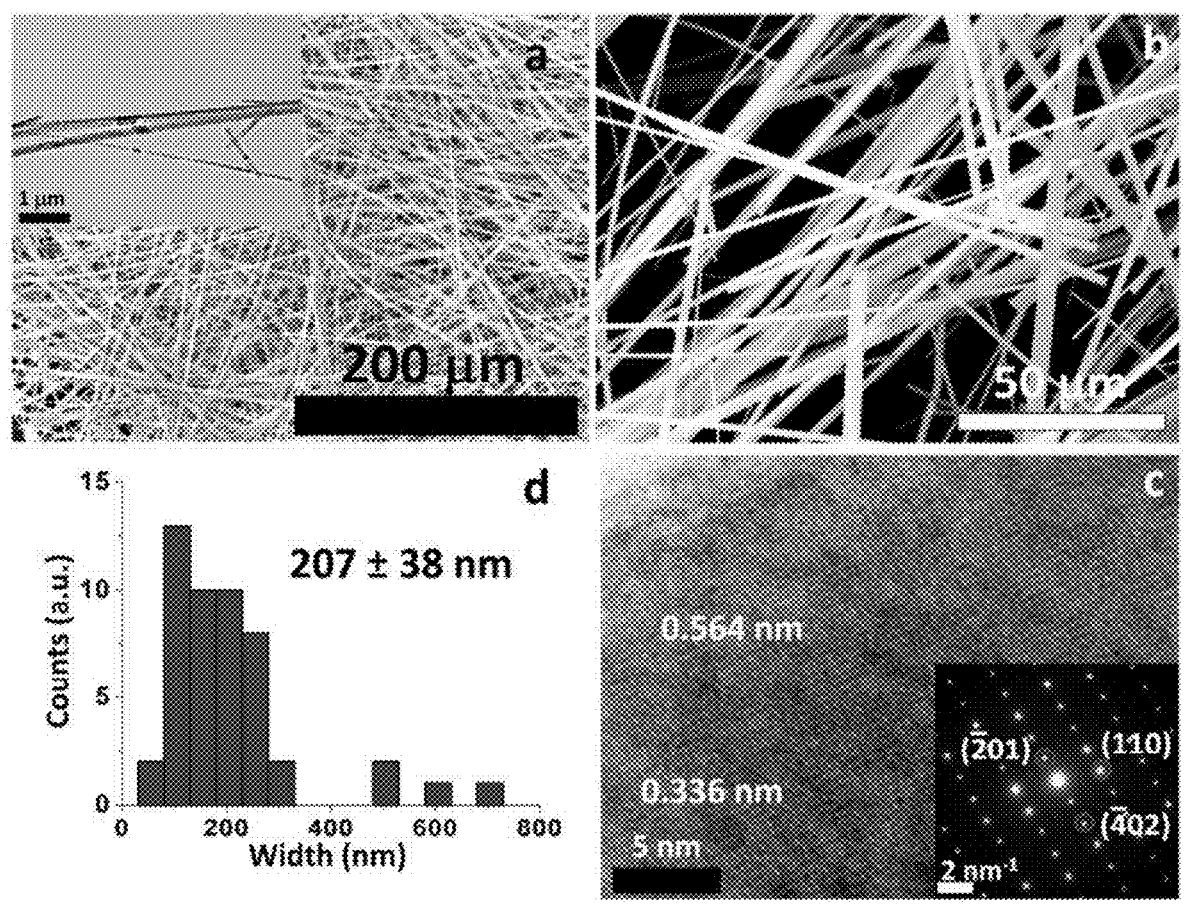
FIG. 33. a) Panoramic SEM image of the as prepared δ-$Ca_xV_2O_5\cdot H_2O$ nanowires indicating the high yield and hundreds of micrometer lengths of the nanowires. A low-magnification TEM image of several nanowires is shown in the inset. b) HRSEM image of multiple nanowires. c) Lattice-resolved HRTEM image and SAED (inset) illustrating the single-crystalline nature of the nanowires. d) A histogram deduced by measuring the lateral dimensions of 50 nanowires indicates a size distribution centered at ~207 nm.

The SEM image in FIG. 33a and the low-magnification TEM image shown in the inset depict the morphology and purity of hydrated δ-$Ca_xV_2O_5$ nanowires obtained by the instant hydrothermal process. The nanowires are single crystalline as indicated by the lattice-resolved HRTEM image in FIG. 33c and the clearly defined individual spots in the [1$\bar{1}$2] zone axis SAED pattern (inset to FIG. 33c). The SAED pattern can also be indexed to δ-$Ca_{0.24}V_2O_5 \cdot H_2O$ (JCPDS #88-0579) and remains consistent along the length of the nanowire, corroborating their single-crystalline nature. The lattice-resolved HRTEM image indicates the a-axis is parallel to the length of the nanowire with lattice spacings of 0.564 and 0.336 nm corresponding to the separations between ($\bar{2}$01) and ($\bar{1}$11) planes, respectively. Based on the analysis of 50 nanowires, the nanowires upon reaction for 72 hours at 210° C. have an average diameter of ~207 nm and do not show an appreciable change in dimensions upon increasing the reaction time (FIG. 33d).

Figure 32:
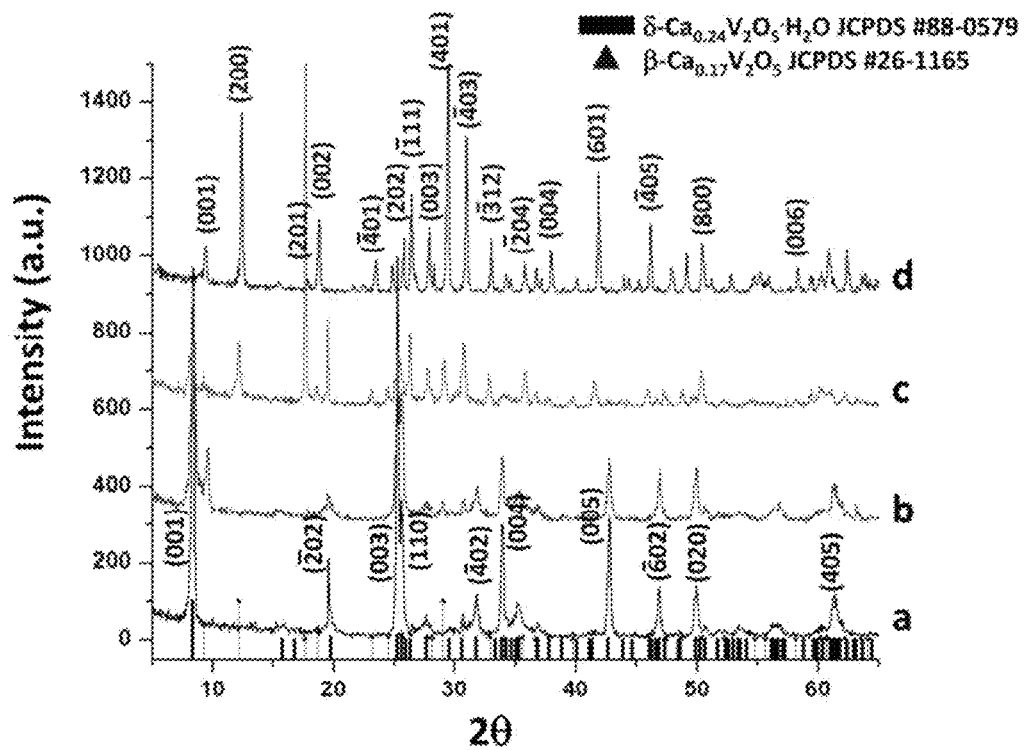
FIG. 32. a) XRD pattern of the as prepared δ-phase nanowires. b) Nanowires heated at 275° C. for 2 hours. c) As prepared nanowires heated at 350° C. for 3 days. d) Nanowires heated at 500° C. for 3 days indicating transformation to the β-phase.

The hydrated δ-phase nanowires have been carefully annealed as indicated in FIGS. 32b-d. Upon heating δ-phase samples under vacuum for the appropriate amount of time to 500° C., the transformation of δ-$Ca_xV_2O_5 \cdot H_2O$ to phase-pure β-$Ca_xV_2O_5$ is evidenced without appreciable sintering of the nanostructures (FIG. 32). At lower temperatures, the clear phase coexistence of β and δ phases is observed. For instance, upon heating the as-prepared nanowires to 275° C. for 2 hours (FIG. 32b) a broadening of the (001) reflection is evident along with the appearance of a new reflection at 2θ=9° corresponding to the (001) reflection of β-$Ca_xV_2O_5$. The broadening of the (001) reflection is likely due to the removal of interlayer water, which initiates collapse of the double-layered δ-phase structure (FIG. 31b). Consistent with this feature, the (003) reflection of the δ-phase is also seen to decrease upon heating, which is again explicable upon considering the removal of interlayer water. Phase coexistence of δ and β structures is still observed upon thermal annealing of the structures at 350° C. for 3 days; at this point, the intensity of the (001) reflection of the δ-phase is greatly diminished and the (200) reflection of the β-phase grows in intensity. The appearance of the (200) reflection suggests recrystallization of the collapsed $VO_6$ layers to form the incipient tunnel framework of the β-phase. The reflection at 2θ~18° in FIG. 32c coincides with the (201) reflection of the β-phase, which is suggestive of condensation of the double layers. Unequivocal indexing of this reflection is precluded by the mixture of different phases present in this sample. Following the distortion and breaking of the V—O bond to complete the transformation to the β-phase, the intensity of this reflection is greatly diminished. After annealing at 500° C. for 3 days, the as-prepared nanowires are complete transformed to β-$Ca_xV_2O_5$ (JCPDS #26-1165, FIG. 32d).

Figure 34:
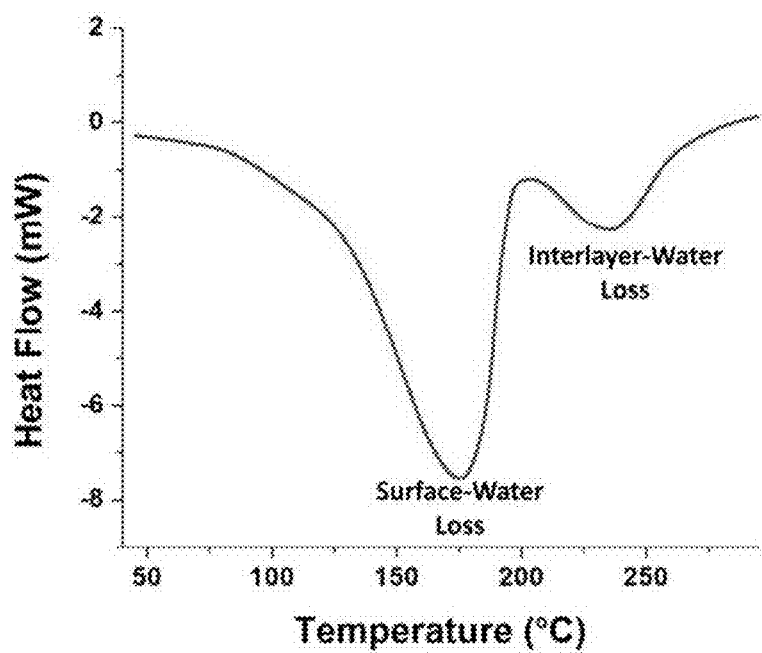
FIG. 34. DSC trace measured for the as-prepared δ-$Ca_xV_2O_5\cdot H_2O$ nanowires. The first pronounced feature (~175° C.) corresponds to surface-water loss. The second peak (~230° C.) arises from water loss from interstitial sites and initiation of structural rearrangement.

FIG. 34 shows a DSC profile of the as-prepared hydrated δ-phase nanowires indicating two distinctive peaks; the first more pronounced feature at ~175° C. arises from loss of surficial water from the nanowires. Based on data for an analogous hydrated barium vanadate compound, the broader higher-temperature feature at ~230° C. can be attributed to removal of internal water occupying the interstitial space between the $V_2O_5$ double layers. The DSC trace thus indicates that irreversible deintercalation of water molecules and collapse of the double layers is initiated around 230° C., which is further consistent with the XRD pattern shown in FIG. 32b. However, complete rearrangement and recrystallization of the double layers to the β-phase requires a temperature of 500° C. (FIG. 32d).

Figure 35:
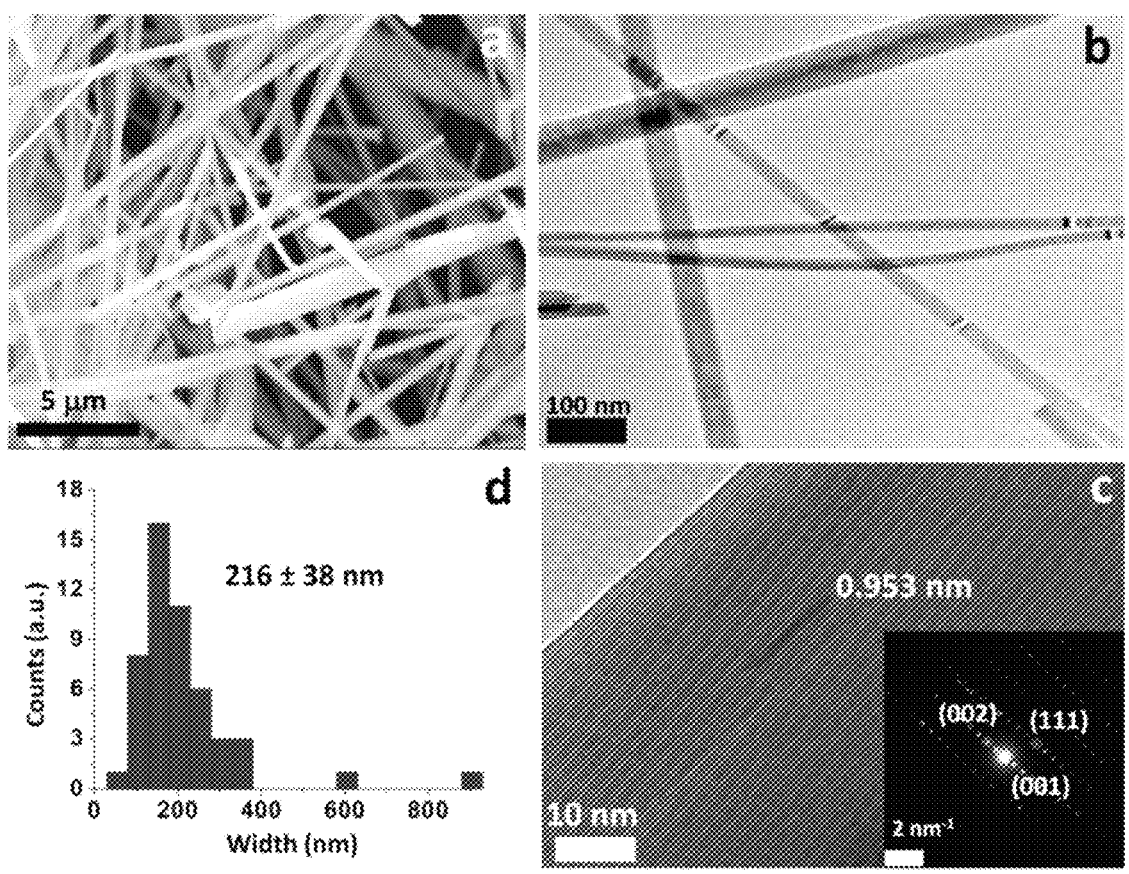
FIG. 35. a) SEM image of the nanowires heated to 500° C. for 3 days. b) Low-magnification TEM image of several nanowires. c) Lattice-resolved HRTEM image of the heated nanowires depicting the b-axis is parallel to the length of the nanowire. A SAED shown in the inset can be indexed to β-$Ca_xV_2O_5$ (JCPDS #26-1165). d) Width distribution of the nanowires deduced from the TEM images indicating little change occurs upon heating.

Electron microscopy examination of the dehydrated β-phase indicates the remarkable preservation of the anisotropic 1D nanowire morphology (FIG. 35). The nanowires appear to have been cleanly transformed without fragmentation into smaller particles. The size distribution histogram in FIG. 35d suggests an average diameter of ~216 nm that corresponds closely to that of the δ-phase, indicating that there is no substantial sintering of the nanowires even at an annealing temperature of 500° C. The lattice-resolved HRTEM image in FIG. 35c indicates a spacing of 0.953 nm, which corresponds to the separation between (001) planes of the β-phase and suggests that the b-axis is parallel to the length of the nanowire. EDX analysis indicates a retention of the approximately x~0.23 stoichiometry, which is undersaturated for the β-phase (a cation stoichiometry of x ~0.33 is required for observation of the correlated metallic phase).

The transformation of a single-layered ε-phase vanadium oxide bronze to the β-phase has been conceptually examined and is posited to involve shear slips of the single $VO_5$ layers into smaller sheets, which subsequently undergo reconstruction to form double layers of $VO_6$ octahedra followed by subsequent association by corner sharing to obtain the β-phase. The transformation of the double-layered δ phase to the β structure can follow a similar rearrangement pattern initiated by the removal of stabilizing interlayer water molecules, which causes collapse of the double layers (as illustrated in FIG. 31b). Crystallographic slip of alternating vanadium oxide layers as indicated by the red arrows in FIG. 1b allows for the double layers to be correctly oriented for subsequent condensation along the c axis (defined with respect to the δ phase). The change in the local coordination environment of the intercalated $Ca^{2+}$ ions is illustrated in the inset to FIG. 31b. With removal of $H_2O$, the $Ca^{2+}$ ions can be conceptualized as being pushed together as the $V_2O_5$ layers slip and condense. This allows for the $Ca^{2+}$ ions to coordinate to the oxide ions denoted as C in the $V_2O_5$ framework. Subsequent association of the layers through oxygen sites (A/A' and D) through vacancies coordinates the $VO_6$ layers to form a tunnel-like structure (FIG. 31c). Distortion of vanadium-centered [$VO_6$] polyhedra connected to oxide ions (C) and (B') results in a breaking of a V—O bond yielding $VO_5$ square pyramids arrayed along the walls of the β-phase (FIG. 31d). Consequently, upon dehydration and nucleation of the β-phase, the reconstruction can propagate facilely along the width of the nanowires without substantial alteration of the width distribution (FIG. 35d) of the β-$Ca_xV_2O_5$ nanowires.

Figure 36:
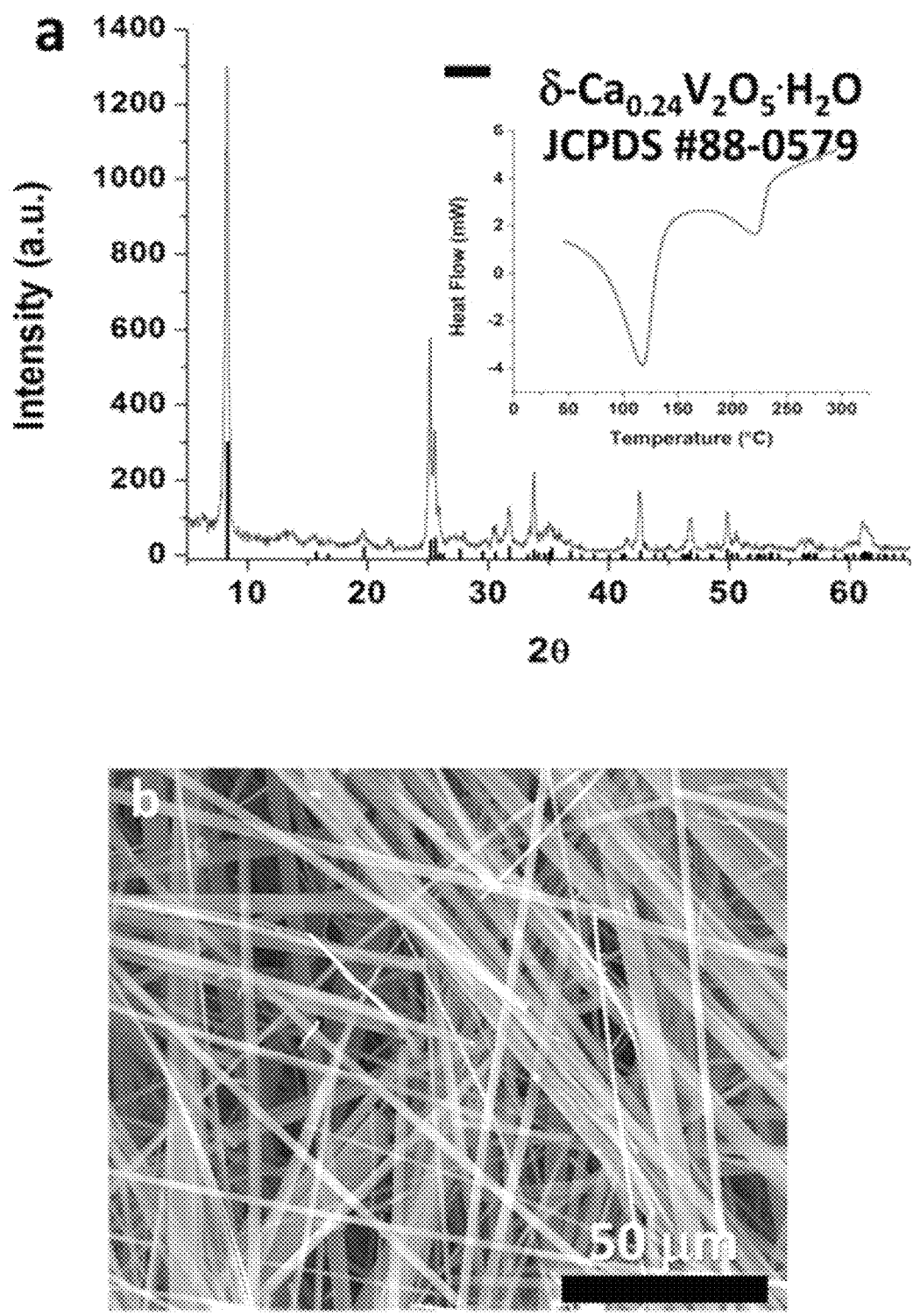
FIG. 36. a) XRD pattern of materials recovered by hydrothermal treatment of β-$Ca_xV_2O_5$ nanowires. The pattern can be indexed to the hydrated δ-phase, showing the reversible nature of the phase transformation. The inset is a DSC trace of the rehydrated nanowires. b) A SEM image of δ-$Ca_xV_2O_5$ nanowires after rehydration from the β-phase.

The reversible nature of the dehydration-induced δ→β transformation is seen upon hydrothermal treatment of the β-$Ca_xV_2O_5$ nanowires. Upon hydrothermal treatment at 210° C. for 72 hours, the β-$Ca_xV_2O_5$ nanowires revert back to hydrated δ-phase nanowires, as indicated by the powder diffraction pattern in FIG. 36a. Such a hydration-induced phase transformation has not been evidenced upon simple immersion of the β-$Ca_xV_2O_5$ nanowires in water or upon refluxing. The high autogenously generated pressure of hydrothermal reactions is thus clearly pivotal for enabling water molecules to enter the tunnel framework of the β-phase, which subsequently exfoliates to reform the layered δ-phase nanowires (FIG. 36b). The inset to FIG. 36a shows a DSC trace of the rehydrated nanowires again depicting surface-water loss and the loss of interlayer-water en route to the β-phase.

The facile diffusion of water molecules into the β-phase tunnels and the propagation of slip and recrystallization of δ-phase double-layers are both assisted by the finite size of the nanowires. Most notably, since the intercalation/deintercalation time t~$[d^2/D]$ where D is the diffusion coefficient, shorter diffusion path lengths (d) yield dramatically improved guest insertion/extraction kinetics enabling water molecules to readily hydrate the β-phase nanowires and initiating the phase transformation to the δ-phase. As noted above, the quasi-1D δ and β phases have distinctive charge ordering patterns; altering the nature of charge fluctuations in the nanowires while retaining the same stoichiometry will permit tuning of metal→insulator transitions. Each of the δ and β phases are characterized by rich phase diagrams including charge ordered, correlated metallic and antiferromagnetic insulating states, the methods reported here provide a means to link the phase diagrams at the nanoscale level, enabling sampling of an expansive region of the phase space. The methods described here may further be generalizable to other divalent vanadium bronzes with feasible δ and β polymorphs. The interconversion between two classes of materials exhibiting pronounced metal→insulator transitions will broaden the tunability of active materials for memristors, Mott field-effect transistors, infrared modulators such as for ballistic missile testing, infrared bolometers, and electrochromic coatings.

A facile hydrothermal synthetic route for the preparation of quasi-1D δ-phase $Ca_xV_2O_5$ nanowires was developed. Dehydration of the nanowires surprisingly results in reconstruction of the guest $V_2O_5$ framework to yield a distinctive β-phase tunnel bronze geometry without substantial sintering or degradation of the nanowires. Conversely, mild hydrothermal treatment of β-phase $Ca_xV_2O_5$ nanowires leads to reversion to the δ-phase. Such a facile hydration/dehydration-induced interconversion between two prominent quasi-1D structures (accompanied by a change in charge ordering motifs) has not been observed in the bulk and likely results from the ease of propagation of crystallographic slip processes across the confined nanowire widths for the δ→β conversion and the facile diffusion of water molecules within the tunnel geometries for the β→δ reversion.

While the invention has been particularly shown and described with reference to specific embodiments (some of which are preferred embodiments), it should be understood by those having skill in the art that various changes in form and detail may be made therein without departing from the spirit and scope of the present invention as disclosed herein.

What is claimed is:

1. A $VO_2$ nanoparticle doped with a plurality of metal cations selected from the group consisting of K cations, Na cations, Cs cations, Sr cations, Ba cations, Ca cations, W cations, Mo cations, Ag cations, Pb cations Nb cations, Cr cations, Al cations, Fe cations, Ti cations, Zr cations, Ta cations, Sc cations, Ga cations, Cu cations, Co cations, Ni cations, rare-earth element cations, and combinations thereof, wherein the dopant is present in the nanoparticle at 0.1 to 10% by weight, wherein the dopants do not segregate into distinct phases and the dopants are substitutionally incorporated within a $VO_2$ structure such that they replace vanadium atoms in the $VO_2$ structure; and wherein the nanoparticle exhibits a metal-insulator transition at a temperature of from −200° C. to 350° C.

2. The nanoparticle of claim 1, wherein the nanoparticle has a morphology selected from the group consisting of nanowires, nanostars, nanosheets, nanobelts, nanotetrapods, nanorods, nanospheres, nanoobelisks, nanodendrites, aligned nanowire arrays, and combinations thereof.

3. The nanoparticle of claim 1, wherein the nanoparticle has monoclinic, triclinic, or rutile crystal symmetry.

4. The nanoparticle of claim 1, wherein the nanoparticle has a size of 1 nm to 1 micron.

5. The nanoparticle of claim 1, wherein the nanoparticle is doped with a plurality of anion dopants, the dopants do not segregate into distinct phases and the anion dopants are substitutionally incorporated within a $VO_2$ structure such that they replace oxygen atoms in the $VO_2$ structure.

6. The nanoparticle of claim 1, wherein the nanoparticle is at least partially covered by a layer of metal oxide selected from the group consisting of $TiO_2$, $ZnO$, $CeO_2$, $HfO_2$, $ZrO_2$, and combinations thereof.

7. A coating comprising a plurality of $VO_2$ nanoparticles of claim 1.

8. The coating of claim 7, wherein the $VO_2$ nanoparticles are disposed in a polymer.

9. The coating of claim 8, wherein the polymer is selected from the group consisting of polymethylmethacrylate, polyethylenimine, polyetherimide, polycarbonate, polyethylene oxide, polypyrrole, polystyrene, and combinations thereof.

10. The coating of claim 7, wherein the coating exhibits thermochromic behavior, electrochromic behavior, or mechanochromic behavior based on a metal-insulator transition.

11. The coating of claim 10, wherein the metal-insulator transition is induced by heating the coating, application of voltage to the coating, flowing a current through the film, or by imposition of strain on the coating.

12. The coating of claim 7, wherein the coating is disposed on the inner surface of the outer pane of a dual pane window.

13. A method for making the doped $VO_2$ nanoparticles of claim 1 comprising the steps of:
a) contacting
   a vanadium oxide source,
   a dopant source,
   a reducing agent selected from the group consisting of oxalic acid, citric acid, ascorbic acid, methanol, ethanol, butanediol, acetone, 2-propanol, n-propanol, butanol, pentanol, glycerol, ethylene glycol, polyvinyl alcohol and combinations thereof,
   optionally, a structure-directing agent selected from the group consisting of sodium dodecyl sulfate, cetyltrimethylammonium bromide, ethylene oxide and propylene oxide block copolymer surfactants, polyethyleneoxide surfactants, and combinations thereof,
   in a solvent to form a reaction mixture;
b) heating the reaction mixture to a temperature of from 25° C. to 300° C. under autogeneous pressure for 0.5 hours to 336 hours;
c) allowing the reaction mixture to cool to ambient temperature; and
d) isolating the doped $VO_2$ nanoparticles.

14. The method of claim 13, wherein the vanadium oxide source is $V_2O_5$, $V_2O_4$, $CuV_2O_6$, $NaVO_3$, vanadium foil, VO, or $V_2O_3$.

15. The method of claim 13, wherein the dopant source comprises a metal and the dopant source is a nitrate salt of the metal, acetate salt of the metal, oxalate salt of the metal, oxide of metals, or a combination thereof.

16. The method of claim 13, wherein the dopant source is tungstic acid, chromic acid, molybdic acid, lead acetate, tungsten oxide, molybdenum oxide, niobium oxide, chromium oxide, aluminum oxide, iron oxide, titanium oxide, zirconium oxide, tantalum oxide, scandium oxide, or gallium oxide.

17. The method of claim 13, wherein the solvent is an organic solvent or an aqueous medium.

18. The method of claim 17, wherein the organic solvent is toluene, anisole, ethylene glycol, or a combination thereof and the aqueous medium is water or a solution comprising an alcohol and water.

19. The method of claim 13, wherein $V_6O_{13}$ or other substoichiometric oxides are not detectable in the isolated product.

* * * * *